United States Patent
Gaudiana et al.

(10) Patent No.: US 7,022,910 B2
(45) Date of Patent: Apr. 4, 2006

(54) PHOTOVOLTAIC CELLS UTILIZING MESH ELECTRODES

(75) Inventors: Russell A. Gaudiana, Merrimack, NH (US); Robert D. Eckert, Lexington, MA (US); Alan J. Montello, West Newbury, MA (US); Edmund R. Montello, Rockport, MA (US)

(73) Assignee: Konarka Technologies, Inc., Lowell, MA (US)

( * ) Notice: Subject to any disclaimer, the term of this patent is extended or adjusted under 35 U.S.C. 154(b) by 93 days.

(21) Appl. No.: 10/395,823

(22) Filed: Mar. 24, 2003

(65) Prior Publication Data

US 2003/0230337 A1 Dec. 18, 2003

(51) Int. Cl.
*H01L 31/04* (2006.01)
*H01L 31/042* (2006.01)
*H01L 31/05* (2006.01)

(52) U.S. Cl. .................. 136/256; 136/263; 136/251; 136/244; 136/265; 136/245; 136/252; 257/431; 257/465; 257/459; 257/40; 257/43

(58) Field of Classification Search .............. 136/256, 136/263, 251, 244, 265, 245, 252; 257/431, 257/465, 459, 40, 43
See application file for complete search history.

(56) References Cited

U.S. PATENT DOCUMENTS

| 3,597,072 A | 8/1971 | Brown et al. ............ 355/3 |
| 3,778,684 A | * 12/1973 | Fischer et al. ............ 136/256 |
| 3,786,307 A | 1/1974 | Robinson ............ 315/169 |
| 3,935,493 A | 1/1976 | Brouwer ............ 313/96 |

(Continued)

FOREIGN PATENT DOCUMENTS

| DE | 198 22 024 A1 | 11/1999 |
| EP | 0 911 841 B1 | 10/1998 |
| EP | 0 924 724 A2 | 12/1998 |
| EP | 0 969 517 A1 | 1/2000 |
| EP | 1 052 661 A2 | 11/2000 |
| EP | 1 091 373 A1 | 4/2001 |
| EP | 1 107 332 A2 | 6/2001 |
| EP | 1 174 891 A2 | 1/2002 |
| JP | 59-96639 A | 4/1984 |
| JP | 60-79779 A * | 5/1985 |
| JP | 61-140037 A | 6/1986 |
| JP | 6-204529 A * | 7/1994 |
| JP | 8-36977 A | 6/1996 |
| JP | 11-273753 A | 10/1999 |
| JP | 2000-243990 A * | 9/2000 |
| JP | 2000-294306 A * | 10/2000 |
| JP | 2001-110462 A | 4/2001 |

(Continued)

OTHER PUBLICATIONS

Shaheen et al. "2.5% Efficient Organic Plastic Solar Cells." *Applied Physics Letters*, 78:6, pp. 841–843, Feb. 5, 2001.
Search report, Oct. 19, 2004.
English abstract for JP 2004–296669, (Oct. 2004).

*Primary Examiner*—Alan Diamond
(74) *Attorney, Agent, or Firm*—Fish & Richardson P.C.

(57) ABSTRACT

In one aspect, the invention provides photovoltaic cells that utilize a mesh electrode on at least one exposure side of the photovoltaic cell. Preferably, the mesh electrode is a metallic mesh. In one embodiment, the invention provides dye-sensitized solar cells (DSSC) having a wire mesh exposure side electrode and a photovoltaic material comprising a photosensitized interconnected nanoparticle layer. In one embodiment, the wire mesh electrode functions as the cathode of the DSSC. In another embodiment, the wire mesh electrode functions as the anode of the DSSC. In addition, embodiments are provided where wire mesh electrodes are used for the anode and the cathode of a DSSC.

35 Claims, 23 Drawing Sheets

U.S. PATENT DOCUMENTS

| | | | |
|---|---|---|---|
| 4,025,814 A | | 5/1977 | Schampers et al. ......... 313/367 |
| 4,105,470 A | * | 8/1978 | Skotheim .................... 136/255 |
| 4,212,932 A | * | 7/1980 | Calgari et al. ............... 429/111 |
| 4,231,808 A | * | 11/1980 | Tabei et al. ................. 136/260 |
| 4,239,555 A | * | 12/1980 | Scharlack et al. ........... 136/251 |
| 4,380,112 A | * | 4/1983 | Little ............................ 438/64 |
| 4,419,424 A | * | 12/1983 | Julian ......................... 429/217 |
| 4,518,894 A | | 5/1985 | Andreadakis ............... 313/491 |
| 4,556,817 A | | 12/1985 | Kusano et al. .............. 313/371 |
| 4,563,617 A | | 1/1986 | Davidson .................... 315/312 |
| 4,564,784 A | | 1/1986 | Ishioka et al. ............... 313/384 |
| 4,900,975 A | | 2/1990 | Shimomoto et al. ........ 313/366 |
| 5,131,065 A | | 7/1992 | Briggs et al. ................ 385/120 |
| 5,158,618 A | * | 10/1992 | Rubin et al. ................. 136/244 |
| 5,240,510 A | * | 8/1993 | Goldade et al. ............. 136/259 |
| 5,287,169 A | | 2/1994 | Pollak et al. ................ 356/445 |
| 5,293,564 A | | 3/1994 | Sukegawa et al. .......... 365/200 |
| 5,331,183 A | | 7/1994 | Sariciftci et al. |
| 5,455,899 A | | 10/1995 | Forslund .................... 395/140 |
| 5,482,570 A | * | 1/1996 | Saurer et al. ................ 136/255 |
| 5,488,386 A | | 1/1996 | Yamagishi et al. ........... 345/74 |
| 5,617,203 A | | 4/1997 | Kobayashi et al. ......... 356/237 |
| 6,040,520 A | * | 3/2000 | Morooka et al. ............ 136/256 |
| 6,077,712 A | * | 6/2000 | Livingston ................... 436/91 |
| 6,078,643 A | | 6/2000 | Vogelsong et al. ......... 378/98.2 |
| 6,291,763 B1 | * | 9/2001 | Nakamura ................... 136/256 |
| 6,340,789 B1 | | 1/2002 | Petritsch et al. ............. 136/263 |
| 6,342,875 B1 | | 1/2002 | Todokoro ................... 345/74.1 |
| 6,358,765 B1 | | 3/2002 | Tanaka ......................... 438/29 |
| 6,359,211 B1 | | 3/2002 | Spitler et al. ................ 136/263 |
| 6,376,765 B1 | * | 4/2002 | Wariishi et al. .............. 136/263 |
| 6,407,330 B1 | | 6/2002 | Lindsey et al. .............. 136/263 |
| 6,420,648 B1 | | 7/2002 | Lindsey ....................... 136/263 |
| 6,538,194 B1 | * | 3/2003 | Koyanagi et al. ............ 136/263 |
| 6,580,026 B1 | * | 6/2003 | Koyanagi et al. ............ 136/263 |
| 6,683,244 B1 | * | 1/2004 | Fujimori et al. ............. 136/263 |
| 6,852,920 B1 | * | 2/2005 | Sager et al. ................. 136/263 |
| 6,913,713 B1 | * | 7/2005 | Chittibabu et al. ....... 252/501.1 |
| 6,936,761 B1 | * | 8/2005 | Pichler ........................ 136/256 |
| 6,946,597 B1 | * | 9/2005 | Sager et al. ................. 136/263 |
| 2001/0035924 A1 | | 11/2001 | Fujieda ......................... 349/65 |
| 2001/0043170 A1 | | 11/2001 | Todokoro ................... 345/74.1 |
| 2001/0049153 A1 | | 12/2001 | Tanaka ......................... 438/29 |
| 2001/0054872 A1 | | 12/2001 | Okigawa et al. ............. 313/586 |
| 2002/0012565 A1 | | 1/2002 | Sirna et al. .................. 401/209 |
| 2002/0167619 A1 | | 11/2002 | Bietsch et al. .................. 349/1 |
| 2002/0182310 A1 | | 12/2002 | Wang ....................... 427/126.1 |
| 2004/0099305 A1 | * | 5/2004 | Heller ......................... 136/263 |
| 2004/0112421 A1 | * | 6/2004 | Spivack et al. .............. 136/256 |
| 2004/0115858 A1 | * | 6/2004 | Spivack et al. .............. 136/263 |
| 2004/0118448 A1 | * | 6/2004 | Scher et al. ................. 136/252 |
| 2004/0187911 A1 | * | 9/2004 | Gaudiana et al. ............ 136/252 |
| 2004/0187917 A1 | * | 9/2004 | Pichler ........................ 136/263 |
| 2004/0201878 A1 | * | 10/2004 | Agrawal et al. ............. 359/266 |
| 2004/0250848 A1 | * | 12/2004 | Sager et al. ................. 136/252 |
| 2005/0098204 A1 | * | 5/2005 | Roscheisen et al. ........ 136/263 |
| 2005/0098205 A1 | * | 5/2005 | Roscheisen et al. ........ 136/263 |
| 2005/0126629 A1 | * | 6/2005 | Okada et al. ................ 136/263 |
| 2005/0189014 A1 | * | 9/2005 | Gaudiana et al. ............ 136/256 |

FOREIGN PATENT DOCUMENTS

| | | | |
|---|---|---|---|
| JP | 2001-031962 A | | 6/2001 |
| JP | 2002-184477 A | | 6/2002 |
| JP | P2003-123855 A | | 4/2003 |
| JP | 2003-174178 A | * | 6/2003 |
| JP | 2004-296669 A | * | 10/2004 |
| WO | WO 98/36433 | | 8/1998 |
| WO | WO 98/36434 | | 8/1998 |
| WO | WO 99/59024 | | 11/1999 |
| WO | WO 99/66519 | | 12/1999 |
| WO | WO 99/66520 | | 12/1999 |
| WO | WO 00/11725 | | 3/2000 |
| WO | WO 00/38001 | | 6/2000 |
| WO | WO 00/57441 | | 9/2000 |
| WO | WO 00/65617 | | 11/2000 |
| WO | WO 03/041177 A1 | | 5/2003 |

* cited by examiner

PHOTOVOLTAIC CELLS UTILIZING MESH ELECTRODES

BACKGROUND OF THE INVENTION

The desire to reduce our consumption of and dependency on fossil fuel has been largely responsible for the development of many photovoltaic materials and devices. The widespread adoption of photovoltaics as an energy source has principally been restricted by the costs and technical difficulties associated with fabricating photovoltaic cells. The energy and material costs of such cells must be recoverable in the electrical energy produced by the cells over some reasonable time frame for photovoltaic cells to be a commercially feasible energy source.

When manufacturing a typical photovoltaic cell comprising a photovoltaic material disposed between two electrodes (sandwich-type), the transparency of one or both of the electrodes to incident light can be a source of economic and technical concerns. In a sandwich-type cell at least one side of the cell is an exposure side, i.e., a side of the cell through which incident light passes to reach the photovoltaic material. As the maximum output energy of a photovoltaic material depends on the amount of incident light it receives, sandwich-type photovoltaic cells almost invariably use a semiconductor oxide film (such as, e.g., indium tin oxide) as the exposure side electrode. Although such semiconductor oxide films are relatively costly, difficult to manufacture and only semiconductors, prior art photovoltaic cells employ these films because it is generally believed and taught that their transparency, combined with conductivity is required to produce a useful photovoltaic cell.

SUMMARY OF THE INVENTION

The invention provides various embodiments of photovoltaic cells which utilize a mesh electrode on at least one exposure side of the photovoltaic cell. Suitable mesh electrode materials include, but are not limited to, metallic wires, conductive polymeric fibers, metal coated or metallized synthetic polymeric fibers (such as, e.g., nylons) and metal coated or metallized natural fibers (such as, e.g., flax, cotton, wool and silk). Preferably, the mesh electrode comprises a metallic mesh, such as, for example, a metal wire mesh and/or metal coated or metallized fibers. As used herein, the term "wire" refers not only to mesh strands substantially circular or elliptical in cross section, but also to strands of non-circular and non-elliptical cross section, such as, for example, semicircular, square, and rectangular cross section.

Although the wires or fibers of a metallic mesh are opaque (i.e., they block light), the photovoltaic cells of the invention can provide several advantages over prior art cells that utilize semiconductor oxide films as exposure side electrodes. For example, the conductivity of a metallic mesh electrode, being composed of a highly conductive metal (such as, e.g., stainless steel or titanium) exceeds that of the best transparent semiconductor oxide films currently available. In addition, in various embodiments, the formation of a photovoltaic cell using a mesh electrode also reduces or eliminates the cost and technical problems associated with using semiconductor oxide film electrodes in such cells. Further, the use of a flexible mesh electrode facilitates the fabrication of the photovoltaic cells of the invention via a continuous manufacturing process (such as, e.g., roll-to-roll, web) as opposed to the batch processes typically used to make photovoltaic cells on rigid substrates.

Further, although the opaque portions of the mesh electrodes of the invention inherently reduce overall electrode transmisivity, by proper choice of wire (or fiber) diameter and the number of wires (or fibers) per unit area of the mesh, in various embodiments the invention provides mesh electrodes with a transmisivity that exceeds 80%. In various embodiments, the photovoltaic cells of the invention comprise a exposed side mesh electrode having a transmisivity in the range from about 60% to about 95%. It is preferred that the exposed side mesh electrode have a transmisivity greater than about 80%, and more preferred that the transmisivity is greater than about 90%.

According to one aspect, the invention provides a photovoltaic cell that comprises a photosensitized nanomatrix layer and a charge carrier media disposed between two electrodes, where at least one exposure side electrode is made of an opaque material in the form of a mesh. Preferably, the photovoltaic cells also include a catalytic media disposed adjacent to at least one of the electrodes to facilitate charge transfer or current flow to and/or from an electrode and the charge carrier media.

As used herein, the term "photosensitized nanomatrix layer" includes a photosensitized layer comprising nanoparticles, a heterojunction composite material, or combinations thereof. In one embodiment, the photosensitized nanomatrix layer includes one or more types of interconnected nanoparticles and can also include a photosensitizing agent. Examples of suitable nanoparticles include, but are not limited to, nanoparticles of titanium oxides, zirconium oxides, zinc oxides, tungsten oxides, niobium oxides, lanthanum oxides, tin oxides, terbium oxides, tantalum oxides, and combinations thereof. The photosensitizing agent can be, for example, a dye or organic molecule, such as, e.g., a xanthine, cyanine, merocyanine, pthalocyanine or pyrrole. In another embodiment, the photosensitized nanomatrix layer comprises a heterojunction composite material, such as, for example, a composite of fullerene in polythiophene. It is to be understood that, in various embodiments, long-range order is not required of the photosensitized nanomatrix layer. For example, the photosensitized nanomatrix layer need not be crystalline, nor must the particles or phase regions be arranged in a regular, repeating, or periodic array.

In one embodiment, at least one exposure side electrode is a mesh electrode comprised of a metallic material. Preferably, the metallic material comprises platinum, stainless steel, and/or alloys thereof. Other suitable metallic materials include, but are not limited to palladium, titanium, and alloys thereof. It is further preferred that a mesh electrode comprise a flexible mesh material. Flexible mesh materials facilitate the fabrication of the present invention's photovoltaic cells with continuous manufacturing processes, such as, e.g., roll-to-roll or web processes.

In another embodiment, at least one exposure side electrode comprises a mesh electrode with a semiconductor oxide film deposited in the openings of the mesh. Although in such embodiments semiconductor oxides are used, the production specifications for the semiconductor oxide film can be less stringent than those that may be required for a prior art photovoltaic cell. For example, because of the mesh electrode the cell does not need to rely on the semiconductor oxide film alone to convey current from the cell to an external load. Accordingly, for example, lower quality semiconductor oxide films (e.g., those with lower conductivity) could be used than may otherwise be required in a prior art photovoltaic cell.

In another embodiment, the photovoltaic cell of the present invention further comprises a first substrate and a second substrate between which the two electrodes, photosensitized nanomatrix layer and charge carrier media are disposed. In one version, a mesh electrode is partially embedded in the first substrate where, e.g., the first substrate is an exposure side substrate. Preferably, at least a portion of the mesh electrode is coated with a catalytic media, either before partial embedding into the first substrate, after partial embedding, or both before and after partial embedding. In another version, the partially embedded mesh electrode further comprises a semiconductor oxide film deposited on the first substrate and in the openings of the mesh.

In another aspect, the present invention provides a flexible photovoltaic material comprising a first flexible substrate, a flexible mesh electrode, and a first flexible electrode, where a photosensitized nanomatrix layer and a charge carrier media are both disposed between the first flexible electrode and the flexible mesh electrode. Suitable first flexible electrodes include, but are not limited to, mesh electrodes, conductive foils, and conductive films. In one embodiment, the first flexible electrode is disposed adjacent the first flexible substrate. In another embodiment, the first flexible electrode comprises a metal layer deposited on the first flexible substrate.

In another aspect, the invention provides a photovoltaic cell that comprises a photoactive material disposed between two electrodes, where at least one exposure side electrode is made of an opaque material in the form of a mesh. The photoactive material can be a form of silicon (such as, e.g., crystalline, polycrystalline, amorphous), a thin film type photoconducter, or a photosensitized nanomatrix material.

In another aspect, the invention provides a photovoltaic module having two or more photovoltaic cells of the present invention interconnected in series, parallel, or combinations of both. Preferably, the photovoltaic module is formed of photovoltaic cells disposed between a first substrate and a second substrate. The photovoltaic cells each comprise a photosensitized nanomatrix layer and charge carrier media disposed between a first electrode and a mesh electrode. In one embodiment, an electrically insulative material is disposed between the photovoltaic cells and two or more of the photovoltaic cells are electrically connected in series by a wire embedded in the electrically insulative material that is in electrical contact with the mesh electrode of one photovoltaic cell and the first electrode of another photovoltaic cell. Preferably, the electrically insulative material also has adhesive properties, which, e.g., can facilitate combining two substrates, or substrate portions, to form a photovoltaic module according to the invention.

In another aspect, the invention provides methods for fabricating photovoltaic modules comprising a plurality of the photovoltaic cells of the present invention, the methods facilitate the production of such photovoltaic modules using a continuous manufacturing processes, such as roll-to-roll or web processes. In one embodiment, the method comprises: forming a group of photovoltaic cell portions on a first substrate; disposing between at least two of the cell portions on the first substrate an electrically insulative material; forming a group of photovoltaic cell portion on a second substrate; embedding a wire in the electrically insulative material between at least two photovoltaic cell portions on the first substrate; combining the respective substrates and photovoltaic cell portions to form a plurality of photovoltaic cells, wherein at least two photovoltaic cells are electrically connected in series by the wire.

BRIEF DESCRIPTION OF THE DRAWINGS

The foregoing and other objects, features and advantages of the invention will be more fully understood from the following descriptions of various embodiments of the invention and the accompanying drawings. In the drawings like reference characters generally refer to the same parts throughout the different views. The drawings are not necessarily to scale, emphasis instead being placed upon illustrating the principles of the invention.

DETAILED DESCRIPTION OF THE INVENTION

A. Photovoltaic Cells Utilizing a Mesh Electrode

The invention provides various embodiments of photovoltaic cells that utilize a mesh electrode on at least one exposure side of the photovoltaic cell. Preferably, the mesh electrode comprises a metallic mesh, such as, for example, a metal wire mesh and/or metal coated or metallized fibers.

In one embodiment, the invention provides dye-sensitized solar cells (DSSC) having a wire mesh exposure side electrode, where the photosensitized nanomatrix layer of the cell comprises a photosensitized interconnected nanoparticle material. In one embodiment, the wire mesh electrode can function as the transparent cathode of a DSSC. Preferably, the mesh is at least partially coated with a catalytic media. For example, the mesh can be plantinized by electrochemical deposition, such as, for example, by using chloroplatinic acid in an electrochemical cell; by vacuum deposition; or by pyrolysis of a coating containing a platinum compound, e.g. chloroplatinic acid. In another embodiment, the wire mesh electrode can function as the anode of the DSSC where, for example, the photosensitized interconnected nanoparticle material is coated on the wire mesh. In addition, wire mesh electrodes can be used as both the anode and the cathode of a DSSC where, for example, light transmission through both sides of the cell is deemed advantageous.

Figure 1A:
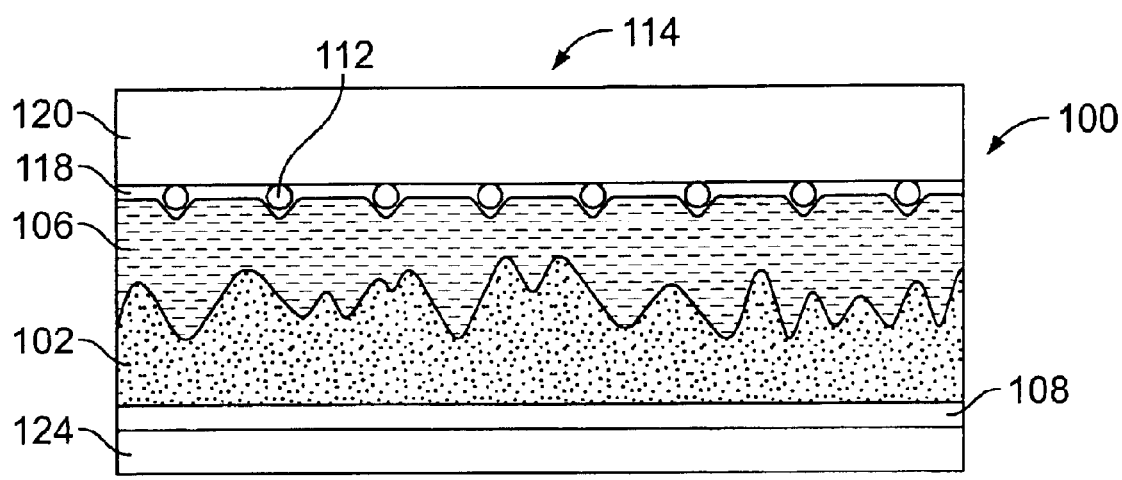
FIGS. 1A and 1B are schematic cross-sectional views of various embodiments of a photovoltaic cell comprising a mesh electrode according to the invention.
Figure 1B:
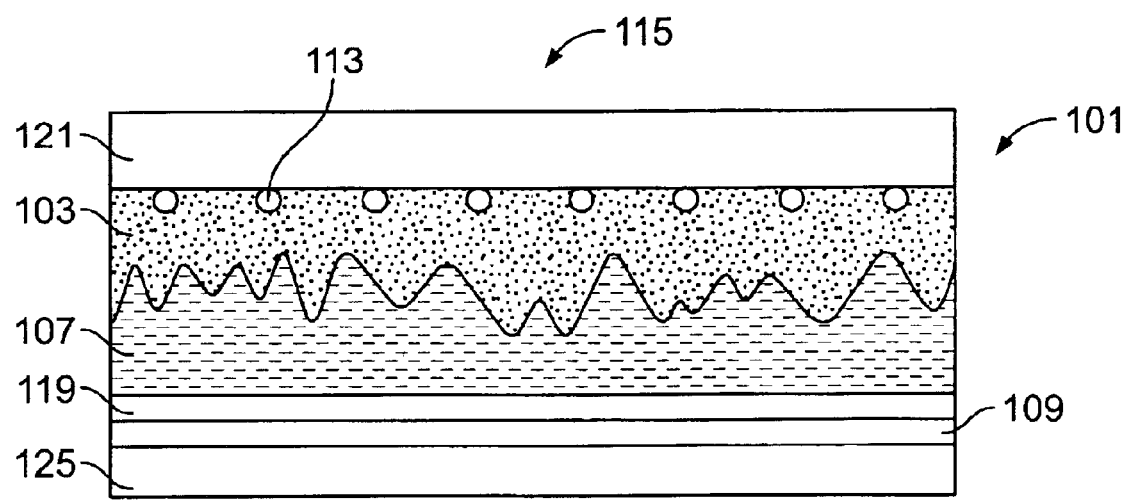

FIGS. 1A and 1B depict photovoltaic cells 100, 101 in accordance with various embodiments of the invention, which include a photosensitized nanomatrix layer 102, 103 and a charge carrier media 106, 107 disposed between a first electrode 108, 109 and a mesh electrode 112, 113 on an exposure side 114, 115 of the photovoltaic cell 100, 101. As depicted in FIG. 1A the mesh electrode 112 serves as a cathode of the photovoltaic cell 100, whereas as depicted in FIG. 1B the mesh electrode 113 serves as an anode of the photovoltaic cell 101. Preferably, the photovoltaic cell further includes a catalytic media 118, 119. In one embodiment, the catalytic media 118 is disposed in electrical contact with the charge carrier media 106 and the mesh electrode 112. In another embodiment, the catalytic media 119 is disposed in electrical contact with the charge carrier media 107 and the first electrode 109. In addition, a wire or lead line (not shown) may be connected to the first electrode and/or mesh electrode to electrically connect the photovoltaic cell to an external load.

Preferably, the photovoltaic cell also includes two substrates between which the electrodes, the photosensitized nanomatrix layer and the charge carrier media are disposed. Referring again FIGS. 1A and 1B, in various embodiments, the photovoltaic cell includes a first significantly light transmitting substrate 120, 121 and a second substrate 124, 125. Preferably, the substrates are also flexible to facilitate, for example, formation of the photovoltaic cell by a continuous manufacturing process.

In various embodiments, a protective coating may be substituted for one or more substrates or used in addition to one or more substrates. Protective coatings can be selected, for example, based on their ability to keep contaminants (e.g., dirt, water or oxygen) out of a cell, to keep chemicals or compositions in a cell, and to protect or ruggedize the cell. Suitable protective coatings include, but are not limited to, fluorocarbon polymers.

As used herein, the term "significantly light transmitting substrate" refers to a substrate that transmits at least about 60% of the visible light incident on the substrate in a wavelength range of operation. Suitable substrates include flexible, semi-rigid and rigid substrates. Preferably, the thickness of a substrate is in the range from about 6 micrometers (μm or microns) to about 200 μm. Examples of suitable flexible substrates include, but are not limited to, substrates with a flexural modulus of less than about 5,000 mega pascals (MPa) for the thickness of substrate material used in the photovoltaic cell. As discussed in further detail below, methods of nanoparticle interconnection are provided herein that enable construction of a flexible photovoltaic cell according to the invention at temperatures and heating times compatible with flexible, significantly light transmitting substrate. Preferably, the flexible, significantly light transmitting substrates comprise a polymeric material. Suitable substrate materials include, but are not limited to, polyethylene terephthalates (PETs), polyimides, polyethylene naphthalates (PENs), polymeric hydrocarbons, cellulosics, or combinations thereof.

Substrates for use in the photovoltaic cells of the present invention may be colored or colorless. Preferably, a substrate is non-scattering and transparent. A substrate may have one or more substantially planar surfaces or may be substantially non-planar. For example, a non-planar substrate may have a curved or stepped surface (e.g., to form a Fresnel lens) or be otherwise patterned.

The mesh electrode of the photovoltaic cell comprises a conductive mesh material. Suitable mesh materials include, but are not limited to, metals (such as, for example, palladium, platinum, titanium, stainless steels, and alloys thereof) and conductive polymers such as, e.g., poly(3,4-ethylene dioxythiophene), polythiopene derivatives and polyaniline. Preferably, the mesh material comprises metal wire. The conductive mesh material can also comprise an electrically insulative material that has been rendered conductive by, for example, a metal coating or metallization. The electrically insulative material can comprise a fiber such as, for example, a textile fiber or optical fiber. Examples of suitable fibers include synthetic polymeric fibers (such as, e.g., nylons) and natural fibers (such as, e.g., flax, cotton, wool and silk). Preferably, the mesh electrode is flexible to facilitate, for example, formation of the photovoltaic cell by a continuous manufacturing process.

The mesh electrodes of the invention may take a wide variety of forms with respect to, for example, wire (or fiber) diameters and mesh densities (i.e., the number of wires (or fibers) per unit area of the mesh). The mesh can be, for example, regular or irregular, with any number of opening shapes. It is to be understood that the form factors of the mesh are not critical to the present invention. Suitable mesh form factors (such as, e.g., wire diameter and mesh density)

can be chosen, for example, based on the conductivity of the wire (or fibers) of the mesh, the transmisivity desired, flexibility, and/or mechanical strength.

In one embodiment, the mesh electrode comprises a metal wire mesh with an average wire diameter in the range from about 1 μm to about 400 μm, and an average open area between wires in the range from about 60% to about 95%. In one version, the metal wire mesh has an average wire diameter in the range from about 10 μm to about 200 μm, and an average open area between wires in the range from about 75% to about 90%. In one version, the mesh electrode comprises a stainless steel woven wire mesh with an average wire diameter in the range from about 25 μm to about 35 μm, and an average open area between wires in the range from about 80% to about 85%. Preferably, the stainless steel comprises 332 stainless steel or some other stainless steel suitably resistant to any corrosive properties of e.g., the charge carrier material or nanomatrix layer. For example, in some embodiments 316 stainless steel is sufficiently corrosion resistant.

In another embodiment, the mesh electrode comprises a metal coated fiber mesh with an average fiber diameter in the range from about 10 μm to about 400 μm, and an average open area between fibers in the range from about 60% to about 95%. In one version, the fiber mesh has an average fiber diameter in the range from about 10 μm to about 200 μm, and an average open area between fibers in the range from about 75% to about 90%. In one version, the mesh electrode comprises nylon fibers coated with titanium having a thickness in the range from about 1 μm to about 50 μm; the resultant mesh has an average fiber diameter in the range from about 10 μm to about 250 μm, and an average open area between fibers in the range from about 60% to about 95%.

In various embodiments, the mesh electrode further includes a transparent semiconductor oxide film deposited in the openings of the mesh. Because of the mesh electrode, the cell does not need to rely on the transparent semiconductor oxide film alone to convey current from the cell to an external load. This can allow, for example, the use of lower quality semiconductor oxide films (e.g., those with lower conductivity) and/or thinner films than may otherwise be required in a prior art photovoltaic cell.

In one embodiment, the semiconductor oxide film does not substantially coat the wires (or fibers) of the mesh electrode. In another embodiment, the mesh electrode is coated with a transparent semiconductor oxide film. The transparent semiconductor oxide film can provide a transparent, uniform, semiconductor surface between the wires of the mesh electrode. Preferably, the transparent semiconductor oxide film and the mesh electrode are in electrical contact, as a result, the mesh electrode facilitates conducting electrons out of the cell to an external load. For example, for a mesh electrode serving as an anode in a DSSC, the transparent semiconductor oxide film can provide a semiconductor surface for the interconnected nanoparticle material and aid in removing photogenerated electrons from the interconnected nanoparticle material. Further, for example, for a mesh electrode serving as a cathode in a DSSC, the transparent semiconductor oxide film can provide a semiconductor surface for a catalytic media and/or charge carrier media and aid in electron transfer to these media from the mesh electrode.

Figure 2A:
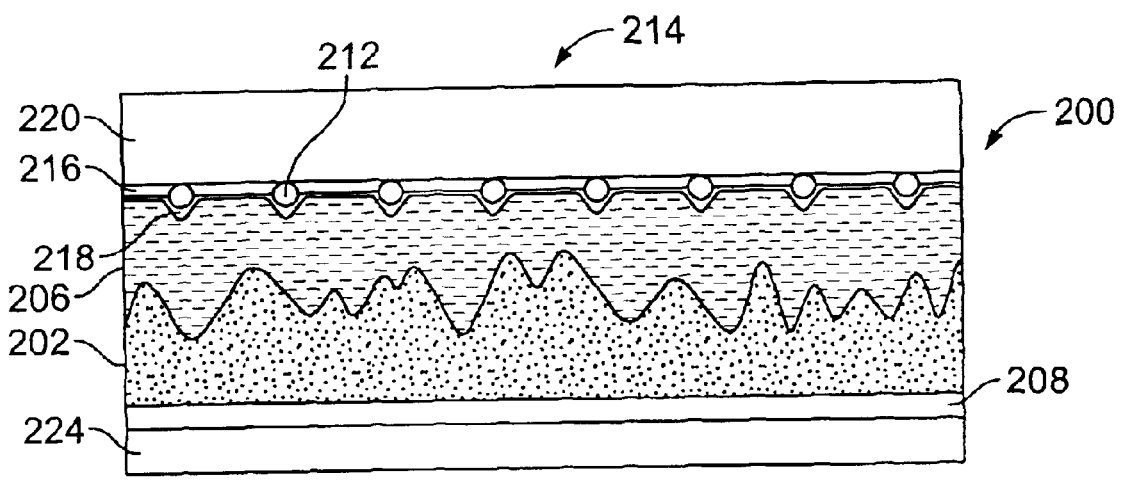
FIGS. 2A and 2B are schematic cross-sectional views of various embodiments of a photovoltaic cell comprising a mesh electrode and a semiconductor oxide film according to the invention.
Figure 2B:
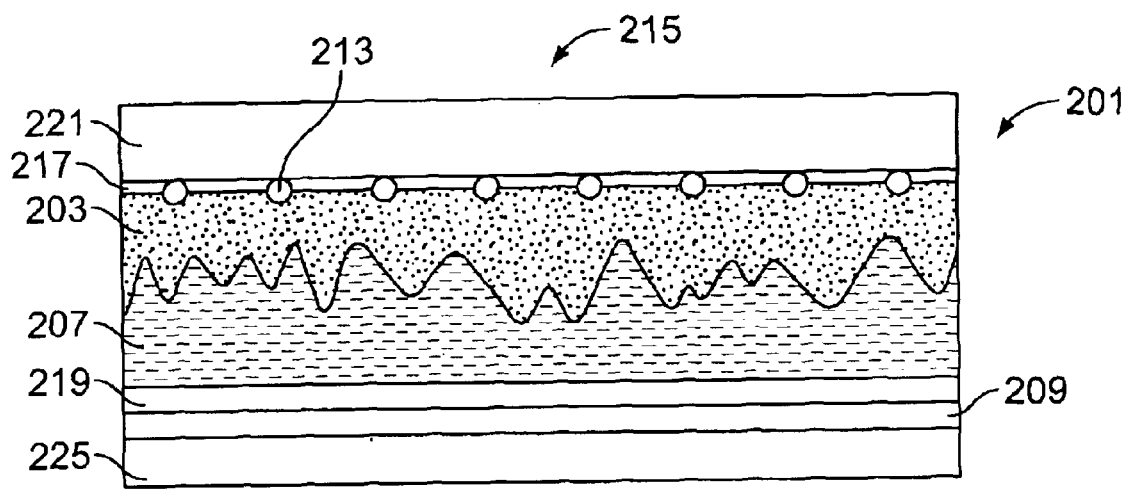

Referring to FIGS. 2A and 2B, in various embodiments, the photovoltaic cells 200, 201 include a photosensitized nanomatrix layer 202, 203 and a charge carrier media 206, 207 disposed between a first electrode 208, 209, a mesh electrode 212, 213 on an exposure side 214, 215 of the photovoltaic cell 200, 201, and a transparent semiconductor oxide film 216, 217 disposed at least in the openings of the mesh electrode. Preferably, the photovoltaic cell further includes a catalytic media 218, 219. In one embodiment, the catalytic media 218 is disposed in electrical contact with the charge carrier media 206 and the mesh electrode 212; and the catalytic media preferably is also disposed in electrical contact with at least a portion of the transparent semiconductor oxide film 216. In another embodiment, the catalytic media 219 is disposed in electrical contact with the charge carrier media 207 and the first electrode 209; and preferably the catalytic media is also disposed in electrical contact with at least a portion of the transparent semiconductor oxide film 217. In addition, a wire or lead line (not shown) may be connected to the first electrode and/or mesh electrode to electrically connect the photovoltaic cell to an external load. Preferably, the photovoltaic cell further includes a first significantly light transmitting substrate 220, 221 and a second substrate 224, 225. Preferably, the substrates are flexible to facilitate, for example, formation of the photovoltaic cell by a continuous manufacturing process. In various embodiments, a protective coating may be substituted for one or more substrates or used in addition to one or more substrates.

Suitable transparent semiconductor oxide film materials include, but are not limited to, indium tin oxide ("ITO"), a fluorine-doped tin oxide, tin oxide, or the like. In one embodiment, the transparent semiconductor oxide film is deposited as a layer between about 100 nm and about 500 nm thick. In another embodiment the transparent semiconductor oxide film is between about 150 nm and about 300 nm thick.

In various embodiments, the mesh electrode is partially embedded into a substrate of the photovoltaic cell. In one embodiment, partially embedding the mesh electrode into a substrate of the cell facilitates fabrication by a continuous manufacturing process and fabrication of a more rugged cell. In one embodiment, a mesh electrode is partially embedded in the first substrate where, e.g., the first substrate is an exposure side substrate. Preferably, at least a portion of the mesh electrode is coated with a catalytic media, either before partial embedding into the first substrate, after partial embedding, or both before and after partial embedding.

Preferably, overall the mesh electrode is embedded in a substrate to a depth no greater than about 70% of the average diameter of the wire (or fiber) of the mesh. It is preferred that the mesh is embedded in a substrate to the minimum extent possible to sufficiently anchor the mesh to the substrate and thereby maximize the area of the mesh in electrical contact with, for example, a charge carrier or nanomatrix layer. For example, in one embodiment having a woven wire mesh, underlying wires at wire intersections are completely embedded in the substrate, the overlying wires at intersections are not embedded, and the portions of wire between wire intersections are partially embedded.

In various embodiments including a mesh electrode embedded in a substrate, the wires of the mesh electrode extend above the substrate a distance greater than about 30% of the average diameter of the wire (or fiber) of the mesh. In one embodiment, the mesh electrode is embedded in a substrate such that the wires of the mesh electrode preferably extend above the substrate a distance in the range between about 25% and about 50% of the average diameter of the wire (or fiber) of the mesh.

In various other embodiments including a mesh electrode embedded in a substrate, the wires (or fibers) of the mesh electrode are preferably embedded in a substrate to a depth no greater than about 70% of the average diameter of the wire (or fiber) of the mesh. In one embodiment, the wires (or fiber) are embedded in a substrate to a depth in the range between about 50% and about 75% of the average diameter of the wire (or fiber) of the mesh.

Figure 3A:
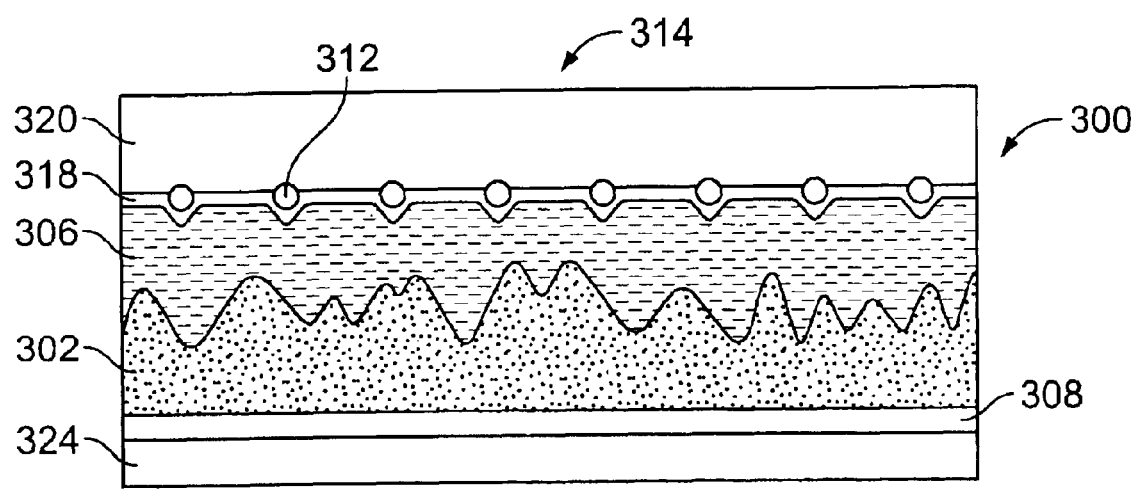
FIGS. 3A to 3D are schematic cross-sectional views of a portion of a photovoltaic cell according to various embodiments of the invention comprising a partially embedded mesh electrode.
Figure 3B:
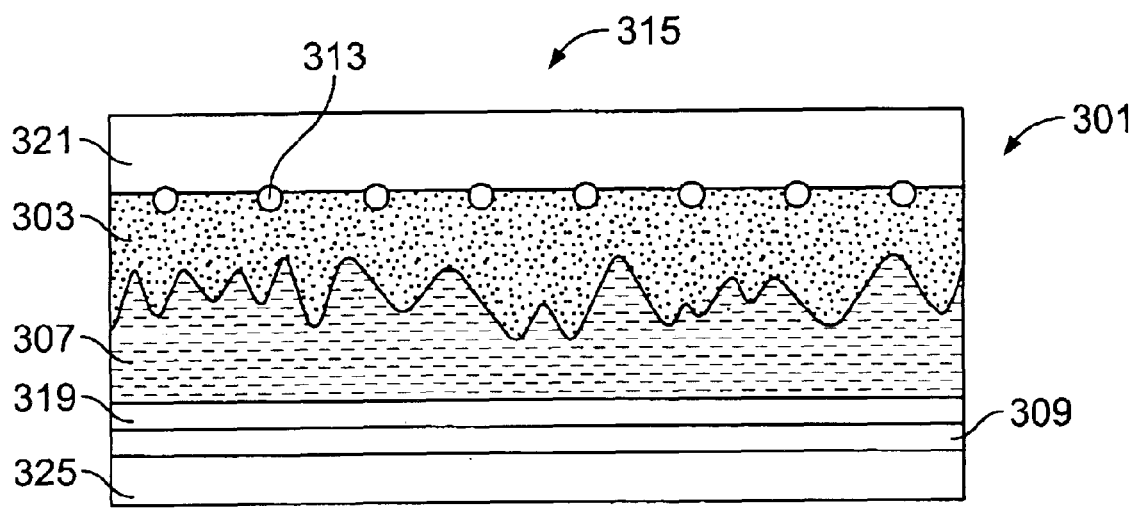

Referring to FIGS. 3A and 3B, in various embodiments, the photovoltaic cells 300, 301 include a photosensitized nanomatrix layer 302, 303 and a charge carrier media 306, 307 disposed between a first electrode 308, 309, a mesh electrode 312, 313 on an exposure side 314, 315 of the photovoltaic cell 300, 301 which is partially embedded in a first significantly light transmitting substrate 320, 321. Preferably, the photovoltaic cell further includes a second substrate 324, 325. Preferably, the substrates are flexible to facilitate, for example, formation of the photovoltaic cell by a continuous manufacturing process. In various embodiments, a protective coating may be substituted for one or more substrates or used in addition to one or more substrates.

It is also preferred that the photovoltaic cell further includes a catalytic media 318, 319. In one embodiment, the catalytic media 318 is disposed in electrical contact with the charge carrier media 306 and the mesh electrode 312. In another embodiment, the catalytic media 319 is disposed in electrical contact with the charge carrier media 307 and the first electrode 309. In addition, a wire or lead line (not shown) may be connected to the first electrode and/or mesh electrode to electrically connect the photovoltaic cell to an external load.

Figure 3C:
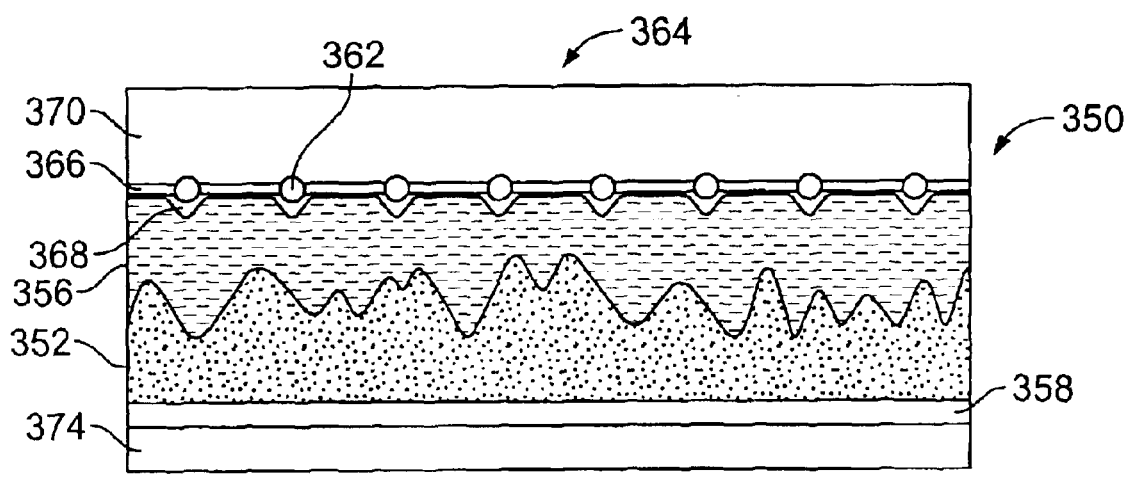
Figure 3D:
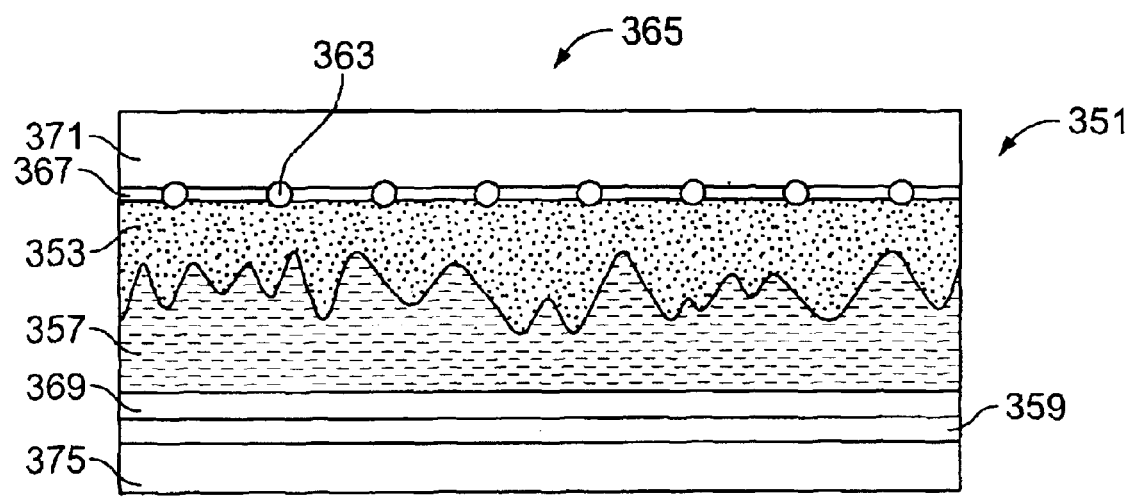

In various embodiments, the photovoltaic cells of the present invention having a partially embedded mesh electrode further comprise a semiconductor oxide film deposited in the openings of the mesh. Referring to FIGS. 3C and 3D, in various embodiments, the photovoltaic cells 350, 351 include a photosensitized nanomatrix layer 352, 353 and a charge carrier media 356, 357 disposed between a first electrode 358, 359, a mesh electrode 362, 363 on an exposure side 364, 365 of the photovoltaic cell 350, 351, which is partially embedded in a first significantly light transmitting substrate 370, 371, and a transparent semiconductor oxide film 366, 367 disposed at least in the openings of the mesh electrode. Preferably, the photovoltaic cell further includes a second substrate 374, 375. Preferably, the substrates are flexible to facilitate, for example, formation of the photovoltaic cell by a continuous manufacturing process. In various embodiments, a protective coating may be substituted for one or more substrates or used in addition to one or more substrates.

It is also preferred that the photovoltaic cell further includes a catalytic media 368, 369. In one embodiment, the catalytic media 368 is disposed in electrical contact with the charge carrier media 356 and the mesh electrode 362; and preferably also in electrical contact with at least a portion of the transparent semiconductor oxide film 366. In another embodiment, the catalytic media 369 is disposed in electrical contact with the charge carrier media 357 and the first electrode 359; and preferably also in electrical contact with at least a portion of the transparent semiconductor oxide film 367. In addition, a wire or lead line (not shown) may be connected to the first electrode and/or mesh electrode to electrically connect the photovoltaic cell to an external load.

The first electrodes of the invention (such as, for example, those illustrated in FIGS. 1A–1B, 2A–2B, 3A–3B, and 4–6) may take a wide variety of forms including, but not limited to, a mesh, a metal foil, a deposited metal layer, a conductive polymer film, a semiconductor oxide film, or one or more combinations thereof. Where the first electrode side of the photovoltaic cell is also an exposure side, it is preferred that the first electrode comprises a mesh electrode as described herein, including catalytic media coated mesh electrodes and mesh electrodes with a transparent semiconductor oxide film in the mesh openings. In other embodiments, it is preferred that the first electrode comprises a metal foil. Examples of suitable metal foil materials for the first electrode include, but are not limited to, palladium, platinum, titanium, stainless steels, and alloys thereof. In various embodiments the first electrode comprise a metal foil with an average thickness in the range from between about 10 µm and about 100 µm. Preferably, the metal foil has an average thickness in the range from between about 25 µm and about 50 µm.

In one embodiment, where the photosensitized nanomatrix layer comprises a dye-sensitized interconnected titanium dioxide nanoparticle material, the first electrode comprises a titanium metal foil about 25 µm thick. In one version, the photosensitized nanomatrix layer is formed directly on the titanium metal foil or on a suitable primer layer (further discussed below).

In another embodiment, the first electrode comprises a metal layer deposited on a substrate. Suitable metals include, but are not limited to, palladium, platinum, titanium, stainless steels, and alloys thereof. In various embodiments the deposited metal layer an average thickness in the range from between about 0.1 µm and about 3 µm. Preferably, a deposited metal layer has an average thickness in the range from between about 0.5 µm and about 1 µm.

In another embodiment, the first electrode comprises a conductive polymer such as, for example, poly(3,4,-ethylene dioxythiopene), polyaniline, and polythiopene derivatives.

In yet another embodiment, the first electrode comprises a significantly light transmitting material, which include transparent semiconductor oxide film such as, for example, ITO, a fluorine-doped tin oxide, tin oxide, or the like. In one version, the first electrode is deposited on a substrate as a layer between about 100 nm and about 500 nm thick. In another version, the first electrode is between about 150 nm and about 300 nm thick.

In another aspect, the present invention provides a flexible photovoltaic material comprising a first flexible substrate, a flexible mesh electrode, and a first flexible electrode, where a photosensitized nanomatrix layer and a charge carrier media are both disposed between the first flexible electrode and the flexible mesh electrode. Preferably, the photovoltaic material includes a catalytic media in electrical contact with the charge carrier media. In addition, in various embodiments the flexible photovoltaic material further comprises a second substrate such that the flexible mesh electrode, first flexible electrode, photosensitized nanomatrix layer and charge carrier media are disposed between the first flexible substrate and the second substrate. In addition, a wire or lead line (not shown) may be connected to the first flexible electrode and/or flexible mesh electrode to electrically connect the photovoltaic material to an external load.

The flexible photovoltaic material may take a wide variety of forms including, but not limited to, those illustrated in FIGS. 1A–1B, 2A–2B, 3A–3B, and 4–6. For example, in various embodiments, the first flexible substrate of the photovoltaic material may be a first significantly light transmitting substrate. Preferably, the flexible, significantly light transmitting substrate comprises a polymeric material. Suitable substrate materials include, but are not limited to, polyethylene terephthalates (PETs), polymides, polyethylene naphthalates (PENs), polymeric hydrocarbons, cellulosics, or combinations thereof.

In other embodiments, the first flexible substrate is not an exposure side substrate. In one version of these embodiments, the first flexible substrate is opaque. In another version, the flexible photovoltaic material further comprises a transparent protective coating on the exposure side of the material. It is to be understood that where the first flexible substrate is not an exposure side substrate a wide range of materials are suitable for use as flexible substrates. Preferable substrate materials include polyethylene terephthalates (PETs), polyimides, polyethylene naphthalates (PENs), and poly carbonates. Other suitable substrate materials include, but are not limited to, cellosics (filled and unfilled); polyamides and copolymers thereof, polyethers, and polyether ketones.

Examples of suitable protective coatings include, but are not limited to fluorocarbon polymers and dysiloxanes. For example, where the flexible photovoltaic material comprises a DSSC having a wire mesh exposure side electrode as the flexible mesh electrode, and where the photosensitized nanomatrix layer of the cell comprises a photosensitized interconnected nanoparticle material, preferred protective coatings include, but are not limited to Tefzel (Dupont).

Suitable first flexible electrodes include, but are not limited to, mesh electrodes, conductive foils, conductive films, and other first electrodes described herein. In one embodiment, the first flexible electrode is disposed adjacent the first flexible substrate. In another embodiment, the first flexible electrode comprises a metal layer deposited on the first flexible substrate. Where the first flexible electrode side of the flexible photovoltaic material is also an exposure side, it is preferred that the first flexible electrode comprises a mesh electrode as described herein that is flexible.

The photosensitized nanomatrix layer of the photovoltaic cells of the present invention can include a photosensitized nanoparticle material, heterojunction composite material, or combinations thereof. As discussed above, it is to be understood that while long-range order can be present in the photosensitized nanomatrix layer, long-range order is not required. For example, the photosensitized nanomatrix layer need not be crystalline, nor must the particles or phase regions be arranged in a regular, repeating, or periodic array. In one embodiment, the photosensitized nanomatrix layer is between about 1 micron (μm) and about 5 μm thick. In another embodiment, the photosensitized nanomatrix layer is between about 5 μm and about 20 μm thick. Preferably, the photosensitized nanomatrix layer is between about 8 μm and about 15 μm thick and comprises photosensitized interconnected nanoparticles.

In one embodiment, the photosensitized nanomatrix layer includes a heterojunction composite material. Suitable heterojunction composite materials include fullerenes (e.g., $C_{60}$), fullerene particles, or carbon nanotubes. The heterojunction composite material may be dispersed in polythiopene or some other hole transport material. In various embodiments, the heterojunction composite material includes fullerenes particles and/or aggregates of fullerene particles that have an average size of between about 14 nm and about 500 nm. Other examples of suitable heterojunction composite materials are composites including conjugated polymers, such as polyphenylene vinylene, in conjunction with non-polymeric materials. In various embodiments, the heterojunction composite material is between about 0.1 μm and about 20 μm thick. Preferably, the heterojunction composite material is about 0.1 μm thick.

In another embodiment, the photosensitized nanomatrix layer includes one or more types of interconnected nanoparticles. Suitable nanoparticles include, but are not limited to, nanoparticles of the formula $M_xO_y$, where M may be, for example, titanium (Ti), zirconium (Zr), tungsten (W), niobium (Nb), lanthanum (La), tantalum (Ta), terbium (Tb), or tin (Sn) and x and y are integers greater than zero. Other suitable nanoparticle materials include, but are not limited to, sulfides, selenides, tellurides, and oxides of titanium, zirconium, lanthanum, niobium, tin, tantalum, terbium, and tungsten, and combinations thereof. For example, $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium sulfides, and potassium niobate are suitable nanoparticle materials. In various embodiments, the photosensitized nanomatrix layer includes nanoparticles with an average size between about 2 nm and about 100 nm. In other embodiments, the photosensitized nanomatrix layer includes nanoparticles with an average size between about 10 nm and about 40 nm. Preferably, the nanoparticles are titanium dioxide particles with an average particle size of about 20 nm.

The nanoparticles can be interconnected, for example, by high temperature sintering, or preferably by a reactive polymeric linking agent, such as, e.g., poly(n-butyl titante). As described in more detail below, a polymeric linking agent (hereinafter a "polylinker") enables the fabrication of an interconnected nanoparticle layer at relatively low temperatures (less than about 300° C.) and in various embodiments at room temperature. The relatively low temperature interconnection process enables the manufacture of the photovoltaic cells of the invention on flexible polymer substrates. By employing flexible substrates, the invention further facilitates using a continuous manufacturing process to fabricate the cells.

In various embodiments, the interconnected nanoparticle materials are photosensitized by a photosenstizing agent. The photosensitizing agent facilitates conversion of incident visible light into electricity to produce the desired photovoltaic effect. It is believed that the photosensitizing agent absorbs incident light resulting in the excitation of electrons in the photosensitizing agent. The energy of the excited electrons is then transferred from the excitation levels of the photosensitizing agent into a conduction band of the interconnected nanoparticles. This electron transfer results in an effective separation of charge and the desired photovoltaic effect. Accordingly, the electrons in the conduction band of the interconnected nanoparticles are made available to drive an external load electrically connected to the photovoltaic cell.

The photosensitizing agent is sorbed (e.g., chemisorbed and/or physisorbed) on the interconnected nanoparticles. The photosensitizing agent may be sorbed on the surfaces of the interconnected nanoparticles, throughout the interconnected nanoparticles 603, or both. The photosensitizing agent is selected, for example, based on its ability to absorb photons in a wavelength range of operation, its ability to produce free electrons (or electron holes) in a conduction band of the interconnected nanoparticles, and its effectiveness in complexing with or sorbing to the interconnected nanoparticles. Suitable photosensitizing agents may include, for example, dyes that include functional groups, such as carboxyl and/or hydroxyl groups, that can chelate to the nanoparticles, e.g., to Ti(IV) sites on a $TiO_2$ surface. Examples of suitable dyes include, but are not limited to, anthocyanins, porphyrins, phthalocyanines, merocyanines, cyanines, squarates, eosins, and metal-containing dyes such as, for example, cis-bis(isothiocyanato)bis(2,2'-bipyridyl-4,4'-25 dicarboxylato)-ruthenium(II) ("N3"); tris (isothiocyanato)-ruthenium(II)-2,2':6',2"-terpyridine-4,4', 4"-tricarboxylic acid; cis-bis(isothiocyanato)bis(2,2'-bipyridyl-4,4'-dicarboxylato)-ruthenium(II) bis-tetrabutylammonium; cis-bis(isocyanato) (2,2'-bipyridyl-4, 4'dicarboxylato) ruthenium(II); and tris(2,2'-bipyridyl-4,4'-dicarboxylato) ruthenium (II) dichloride, all of which are available from Solaronix.

The charge carrier media portion of the photovoltaic cells of the present invention may form a layer in the photovoltaic cell, be interspersed with the material that forms the photosensitized nanomatrix layer, or be a combination of both. The charge carrier media is a material that facilitates the transfer of electrical charge from a ground potential or a current source to the photosensitized nanomatrix layer (and/or a photosensitizing agent associated therewith). A general class of suitable charge carrier materials include, but are not limited to, solvent based liquid electrolytes, polyelectrolytes, polymeric electrolytes, solid electrolytes, n-type and p-type transporting materials (e.g., conducting polymers), and gel electrolytes, which are described in more detail below.

Other choices for the charge carrier media are possible. For example, the electrolyte composition may include a lithium salt that has the formula LiX, where X is an iodide, bromide, chloride, perchlorate, thiocyanate, trifluoromethyl sulfonate, or hexafluorophosphate. In one embodiment, the charge carrier media includes a redox system. Suitable redox systems may include organic and/or inorganic redox systems. Examples of such systems include, but are not limited to, cerium(III) sulfate/cerium(IV), sodium bromide/bromine, lithium iodide/iodine, $Fe^{2+}/Fe^{3+}$, $Co^{2+}/Co^{3+}$, and viologens. Furthermore, an electrolyte solution may have the formula $M_iX_j$, where i and j are greater than or equal to 1, where X is an anion, and M is selected from the group consisting of lithium (Li), copper (Cu), barium (Ba), zinc (Zn), nickel (Ni), lanthanides, cobalt (Co), calcium (Ca), aluminum (Al), and magnesium (Mg). Suitable anions include, but are not limited to, chloride, perchlorate, thiocyanate, trifluoromethyl sulfonate, and hexafluorophosphate.

The charge carrier media can include an electrolyte composition having an organic compound capable of complexing with a metal ion at a plurality of sites; a metal ion such as lithium; and an electrolyte solution. These materials can be combined to produce a gelled electrolyte composition suitable for use in the charge carrier media. In one embodiment, the charge carrier media includes a redox system. Suitable redox systems may include organic and/or inorganic redox systems. Examples of such systems include, but are not limited to, cerium(III) sulfate/cerium(IV), sodium bromide/bromine, lithium iodide/iodine, $Fe^{2+}/Fe^{3+}$, $Co^{2+}/Co^{3+}$, and viologens.

In some embodiments the charge carrier media includes a polymeric electrolyte. In one version, the polymeric electrolyte includes poly(vinyl imidazolium halide) and lithium iodide. In another version, the polymeric electrolyte includes polyvinyl pyridinium salts). In still another embodiment, the charge carrier media includes a solid electrolyte. In one version, the solid electrolyte includes lithium iodide and pyridinium iodide. In another version, the solid electrolyte includes substituted imidazolium iodide.

In some embodiments, the charge carrier media includes various types of polymeric polyelectrolytes. In one version, the polyelectrolyte includes between about 5% and about 100% (e.g., 5–60%, 5–40%, or 5–20%) by weight of a polymer, e.g., an ion-conducting polymer, about 5% to about 95% (e.g., about 35–95%, 60–95%, or 80–95%) by weight of a plasticizer, about 0.05 M to about 10 M of a redox electrolyte of organic or inorganic iodides (e.g., about 0.05 M to about 10 M, e.g., 0.05–2 M, 0.05–1 M, or 0.05–0.5 M), and about 0.01 M to about 1 M (e.g., 0.05–5 M, 0.05–2 M, or 0.05–1 M) of iodine. The ion-conducting polymer may include, for example, polyethylene oxide (PEO), polyacrylonitrile (PAN), polymethylmethacrylate (acrylic) (PMMA), polyethers, and polyphenols. Examples of suitable plasticizers include, but are not limited to, ethyl carbonate, propylene carbonate, mixtures of carbonates, organic phosphates, butyrolactone, and dialkylphthalates.

Preferably, the photovoltaic cells of the present invention also include a catalytic media disposed in electrical contact with the charge carrier media. Suitable catalytic media materials include, for example, ruthenium, osmium, cobalt, rhodium, iridium, nickel, activated carbon, palladium, platinum, and hole transporting polymers (e.g., poly(3,4-ethylene dioxythiophene, polythiopene derivatives and polyaniline). Preferably, the catalytic media further includes titanium, or some other suitable metal, to facilitate adhesion of the catalytic media to an electrode, substrate, substrate coating, and/or electrode coating. Preferably, the titanium is deposited in regions or as a layer about 5 Angstroms (Å) thick.

In one embodiment, the catalytic media comprises a platinum layer between about 13 Å and about 35 Å thick. In another embodiment, the catalytic media comprises a platinum layer between about 15 Å and about 50 Å thick. In another embodiment, the catalytic media comprises a platinum layer between about 10 Å and about 800 Å thick. Preferably, the catalytic media includes a platinum layer about 5 Å thick. In one embodiment where a mesh electrode serves as a cathode of a photovoltaic cell of the present invention, the catalytic media preferably comprises a platinum layer about 50 Å thick coating at least the side of the mesh facing the charge carrier media.

In one embodiment, the catalytic media comprises a conductive polymer. Examples of suitable conductive polymers include, but are not limited to poly(3,4-ethylene dioxythiophene, polythiopene derivatives and polyaniline.

In another aspect, the invention provides a photovoltaic module having two or more photovoltaic cells of the present invention interconnected in series, parallel, or combinations of both. Preferably, the photovoltaic module is formed of photovoltaic cells disposed between a first substrate and a second substrate.

Figure 4A:
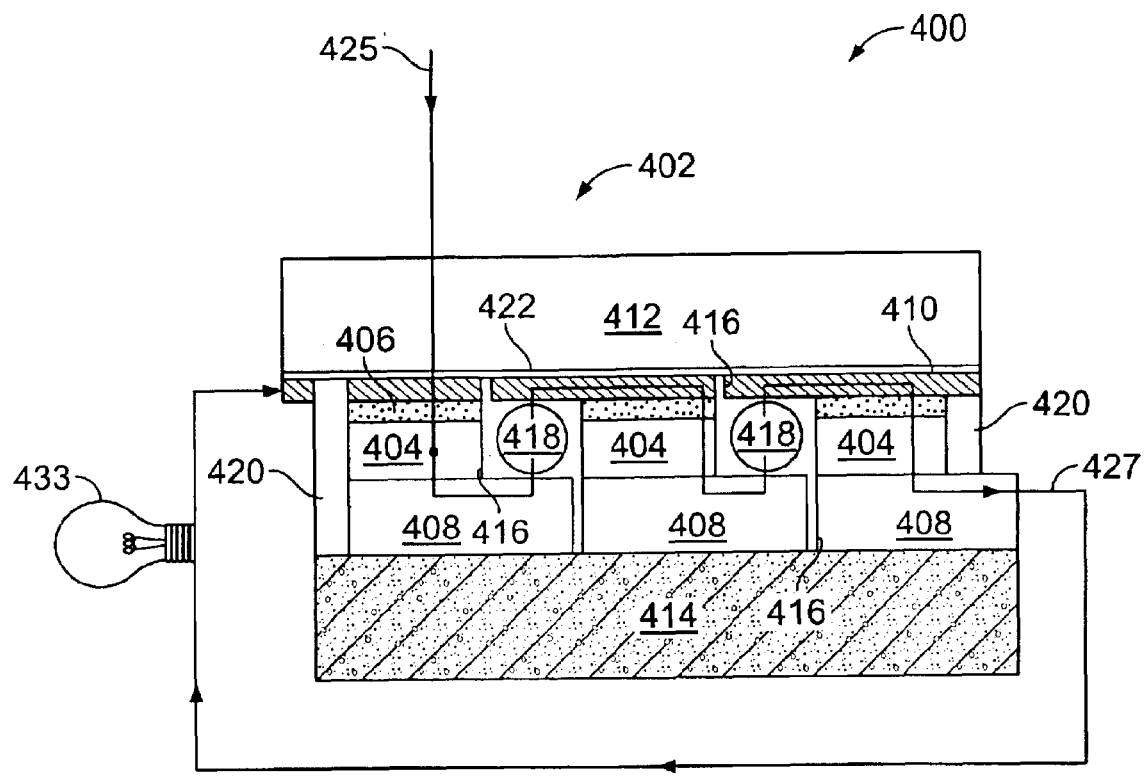
FIG. 4A is a schematic cross-sectional view of one embodiment of photovoltaic cells and a photovoltaic module according to the invention having one exposure side.

FIG. 4 depicts a photovoltaic module 400, in accordance with various embodiments of the invention, with a single exposure side 402. The photovoltaic cells each comprise a photosensitized nanomatrix layer 404 and charge carrier media 406 disposed between a first electrode 408 and a mesh electrode 410, where the mesh electrode 410 is preferably at least partially coated with a catalytic media. Preferably, the photovoltaic cells are disposed between a first significantly light transmitting substrate 412 and a second substrate 414. In various embodiments, a protective coating may be substituted for one or more substrates or used in addition to one or more substrates.

An electrically insulative material 416 is disposed between the photovoltaic cells and two or more of the photovoltaic cells are electrically connected in series by a wire 418 embedded in the electrically insulative material 416 that is in electrical contact with the first electrode of one photovoltaic cell and the mesh electrode of another photovoltaic cell. Preferably, a side sealant 420 (such as, e.g., tape, coatings, etc.) is used to seal in and protect the photovoltaic cells.

In one embodiment, the mesh electrode 410 is adhered to the first significantly light transmitting substrate 412 with a laminating adhesive 422. In various embodiment, the mesh electrode 410 is partially embedded in the first significantly light transmitting substrate 412 as described herein, for example, such as above and with respect to FIGS. 3A–3D. In addition, as described herein, the mesh electrode 410 may further comprise a transparent semiconductor oxide film (not shown) disposed at least in the openings of the mesh electrode 410.

As illustrated in FIG. 4, the mesh electrodes 410 serve as cathodes for their respective associated photovoltaic cells. For example, incoming light 425 interacts with the photosensitized nanomatrix layer 404 to generate a photoelectron, as illustrated the cells are connected in series such that a photoelectron can generate a current path 427 through one or more cells of the module to power an external load 433. In addition, a wire or lead line may be connected to the first electrode 408 and/or mesh electrode 410 to electrically connect the photovoltaic cell to an external load 433.

Figure 4B:
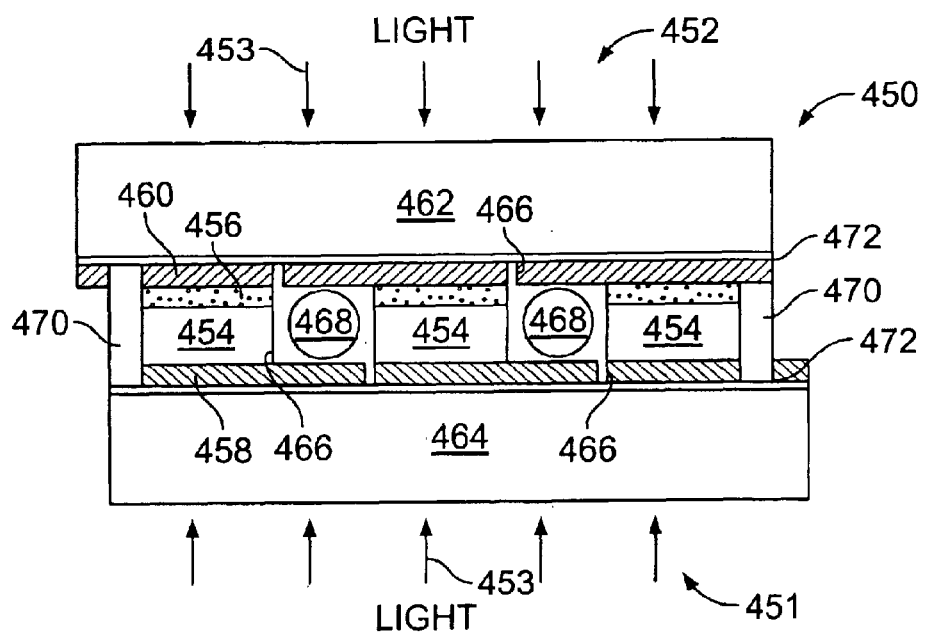
FIG. 4B is a schematic cross-sectional view of one embodiment of photovoltaic cells and a photovoltaic module according to the invention having two exposure sides.

FIG. 4B depicts a photovoltaic module 450, in accordance with various embodiments of the invention, with two exposure sides 451, 452 for incident light 453. The photovoltaic cells each comprise a photosensitized nanomatrix layer 454 and charge carrier media 456 disposed between a first electrode 458 (which is also in the form of a mesh electrode) and a mesh electrode 460, where the mesh electrode 460 is preferably at least partially coated with a catalytic media. Preferably, the photovoltaic cells are disposed between a first significantly light transmitting substrate 462 and a second significantly light transmitting substrate 464. In various embodiments, a protective coating may be substituted for one or more substrates or used in addition to one or more substrates.

An electrically insulative material 466 is disposed between the photovoltaic cells and two or more of the photovoltaic cells are electrically connected in series by a wire 468 embedded in the electrically insulative material 466 that is in electrical contact with the first electrode of one photovoltaic cell and the mesh electrode of another photovoltaic cell. Preferably, a side sealant 470 (such as, e.g., tape, coatings, etc.) is used to seal in and protect the photovoltaic cells.

In one embodiment, one or both of the electrodes 458, 460 are adhered to their adjacent substrates 462, 464 with a laminating adhesive 472. In various embodiments, the one or both of the electrodes 458, 460 are partially embedded their adjacent substrates 462, 464 as described herein, for example, such as above and with respect to FIGS. 3A–3D. In addition, as described herein, one or both of the electrodes 458, 460 may further comprise a transparent semiconductor oxide film (not shown) disposed at least in the openings of the electrode mesh.

Preferably, the electrically insulative material of the photovoltaic modules also has adhesive properties, which, e.g., can facilitate combining two substrates, or substrate portions, to form a photovoltaic module according to the invention. Suitable insulative materials include, but are not limited to, epoxies, and acrylates.

Suitable materials for the wire interconnecting photovoltaic cells include, but are not limited to, titanium, stainless steel, cooper, sliver, gold, platinum, and alloys thereof. Preferably, the wire interconnecting photovoltaic cells comprises stainless steel. As it is to be understood, the dimensions of the wire interconnecting photovoltaic cells are chosen based, for example, on the distance between photovoltaic cells and the distance between the first electrode of on cell and the mesh electrode of an adjacent cell.

The photovoltaic modules of the invention may further comprise electrically insulative beads, rods or fibers (hereinafter collectively referred to as "spacers") between the mesh electrode and first electrode to help prevent shorting by electrode/counter electrode contact. For example, spacers may be disposed in the charge carrier media, the insulative material, or both. The size (e.g., diameter) and length of the spacers can be chosen based, for example on the thickness of the wire and the dimensions of the open space between the wires interconnecting the photovoltaic cells. In modules comprising large area cells, maintaining a space between the electrodes to thereby prevent shorting contact can be an important concern.

It is to be understood that any of the mesh electrodes, substrates, photosensitized nanomatrix layers, charge carrier media, catalytic media, and other features described herein (e.g., low temperature interconnection, primer layers, etc.) may be used in the photovoltaic modules of the present invention. In addition, it is to be understood that the photovoltaic modules of the present invention may be flexible photovoltaic modules. Flexible photovoltaic modules in accordance with the invention may be made, for example, by use of flexible electrode and substrate materials. Examples of suitable flexible materials and methods include, but are not limited to, those described herein, for example, as described in the contexts of flexible photovoltaic cells and/or fabrication by a continuous manufacturing process.

In preferred embodiments, the photovoltaic modules comprise a plurality of DSSC in accordance with the invention where, for example, the mesh electrode comprises a platinum coated stainless steel, the photosensitized nanomatrix layer comprises dye-sensitized interconnected titanium dioxide nanoparticles, and the first electrode comprises a titanium foil (or a stainless steel mesh electrode where the first electrode side of the module also is an exposure side). The wire interconnecting photovoltaic cells comprises a stainless steel, copper, silver, gold, platinum wire, the insulative material comprises hydrocarbon, polymer polypropylene derivatives, epoxies, urethanes, siloxanes, and flurocarbons, the first significantly light transmitting substrate comprises PEN, and the second substrate comprises PEN. In addition, the module is sealed with a malaic acid treated polyethylene tape (such as, e.g., Bynel™ available from DuPont) as a side sealant.

In one embodiment, the dimensions of the various components are as follows: (1) mesh electrode with 35 μm average diameter 316 stainless steel wire with an average open area between wires of about 82% and having a 0.001 μm thick platinum coating; (2) first electrode is a 25 μm thick titanium foil; (3) the first significantly light transmitting substrate is about 75 μm thick PEN; (4) the second substrate is about 75 μm thick PEN; (5) the photosensitized nanomatrix layer is about 10 μm to 15 μm thick and comprises titanium dioxide nanoparticles with an average diameter of 20 to 40 nm that have been sensitized with a dye comprising cis-bis(isothiocyanato)bis(2,2'-bipyridyl-4,4'-dicarboxylato)-ruthenium(II) bis-tetrabutylammonium; cis-bis(isocyanato) (2,2'-bipyridyl-4,4'-dicarboxylato) ruthenium(II); (6) the charge carrier media is about 5 μm to about 35 μm thick, and comprises a potassium iodide/iodine electrolyte; (7) the wire connecting the photovoltaic cells comprises a stainless steel wire with an average diameter of 50 μm; and (8) the insulative material comprises an adhesive (such as, e.g., Bynel™ available from DuPont. In another embodiment, where the first electrode side of the module also is an exposure side: the first electrode is mesh electrode with 35 μm average diameter 316 stainless steel wire with an average open area between wires of about 82%; the second substrate is significantly light transmitting and comprises about 75 μm thick PEN; and the remaining components having dimensions substantially as described immediately above in this paragraph.

Figure 5A:
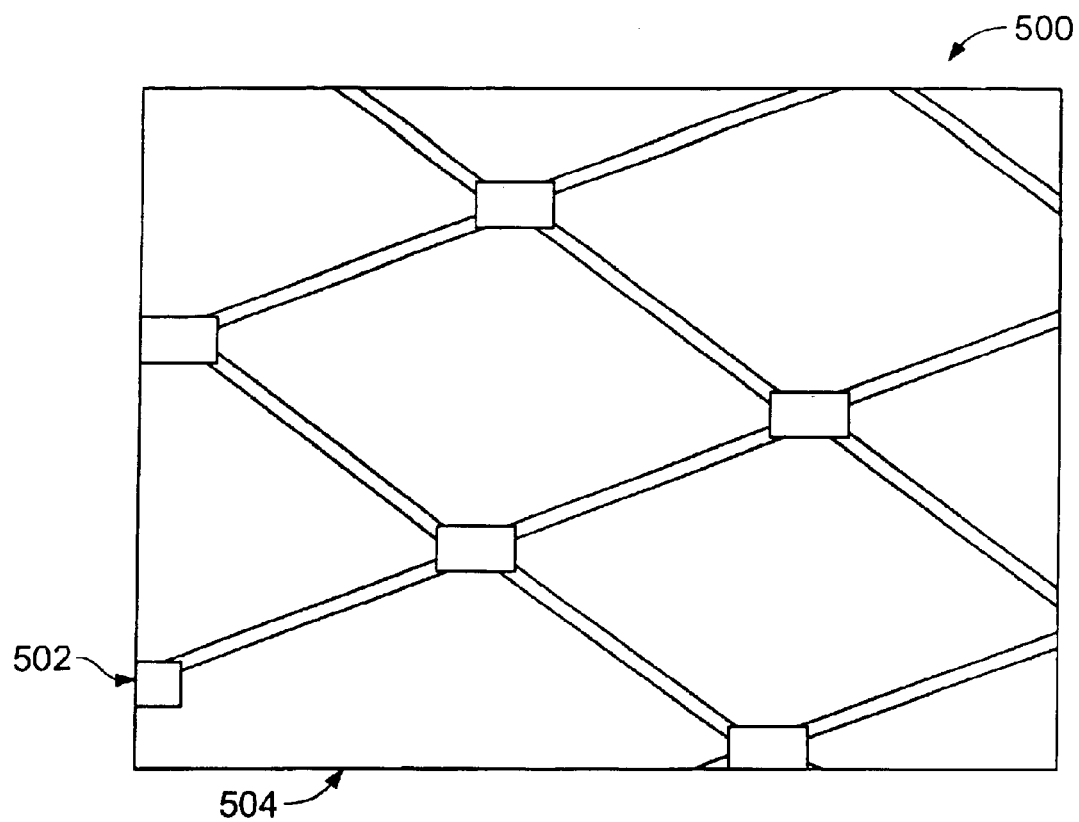
FIGS. 5A and 5B are photomicrographs of embodiments of a mesh electrode.
Figure 5B:
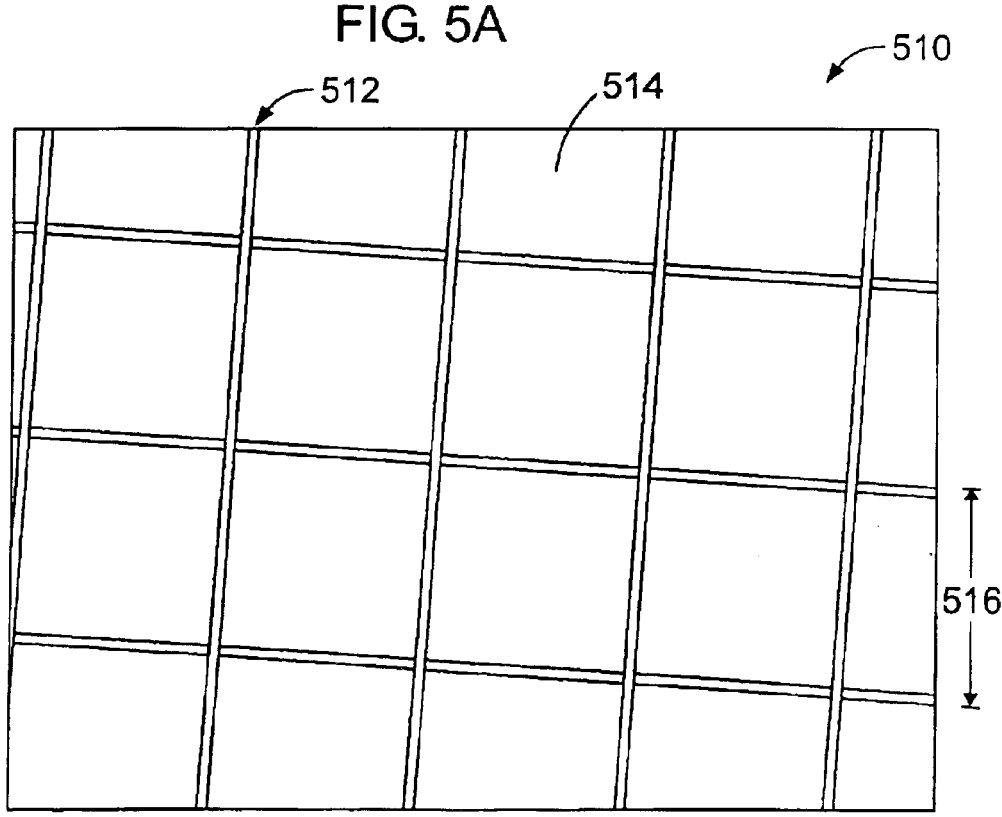

A wide variety of mesh structures can be used as mesh electrodes in the present invention. FIGS. 5A and 5B each illustrate examples of embodiments of a mesh electrode. FIG. 5A shows a photomicrograph 500 of an expanded metal mesh electrode 502 partially embedded in a fluoropolymer adhesive 504. The mesh 502 is an expanded metal mesh made from a piece of titanium foil, which is perforated with a series of slits and expanded to produce the mesh 502. The strands of the mesh in FIG. 5A are approximately 62 microns to about 75 microns in width and the open area of the mesh is about 60%. In another embodiment, the mesh electrode comprises an expanded metal mesh with an open area in the range from about 80% to about 85% with strands about 25 microns wide. In a preferred embodiment, the mesh electrode comprises an expanded metal mesh with an open area of 90% or greater and with strands about 25 microns wide.

FIG. 5B shows a photomicrograph 510 of a woven wire mesh electrode 512 partially embedded in a fluoropolymer adhesive 514. The mesh 502 comprises 316 stainless steel wires about 30 microns (0.0012 inches) in diameter woven into a mesh with an open area of about 82% and a spacing between wires 516 of about 330 microns. It should be noted that at wire intersections the underlying wire portion (the wire furthest into the plane of the page) is substantially or even completely embedded in the fluoropolymer adhesive 514, whereas the overlying wire portion is only slightly embedded or not embedded in the fluoropolymer adhesive 514. It is to be understood that although portions of the mesh are completely embedded and other portions are not embedded, overall the mesh is partially embedded in the fluoropolymer adhesive 514.

In another aspect, the invention provides methods for fabricating photovoltaic cells and modules comprising a plurality of the photovoltaic cells of the present invention, that facilitate production using continuous manufacturing processes, such as, e.g., roll-to-roll or web processes. These methods may be used, for example, to produce DSSCs.

The current processes for producing DSSCs in large numbers, for example using a continuous and cost effective assembly line process, are extremely difficult at best. The formation of semiconductor oxide films as suitable electrodes places limitations on process to prevent cracking of the film and to form suitable films. Such limitations can slow down the manufacturing process, thereby raising costs. In comparison, the use of mesh electrodes or a mesh electrode and foil electrode can facilitate increasing the speed of the manufacturing process. For example, as mesh and foil electrodes can be provided in large sheets or rolls, these electrodes facilitate the use and cost effectiveness of a continuous manufacturing process.

In addition, the difficulties associated with a continuous assembly process for a DSSC may arise from the cell support or substrate, which is generally rigid and typically includes thermally resistant materials such as glass and metal. The primary reason for this is related to the high temperature sintering process for producing fused nanocrystals (typically about 400–500° C.). Rigid substrate materials, by their very nature, generally do not lend themselves to a continuous process for manufacture, but rather to a more expensive batch process.

Figure 6:
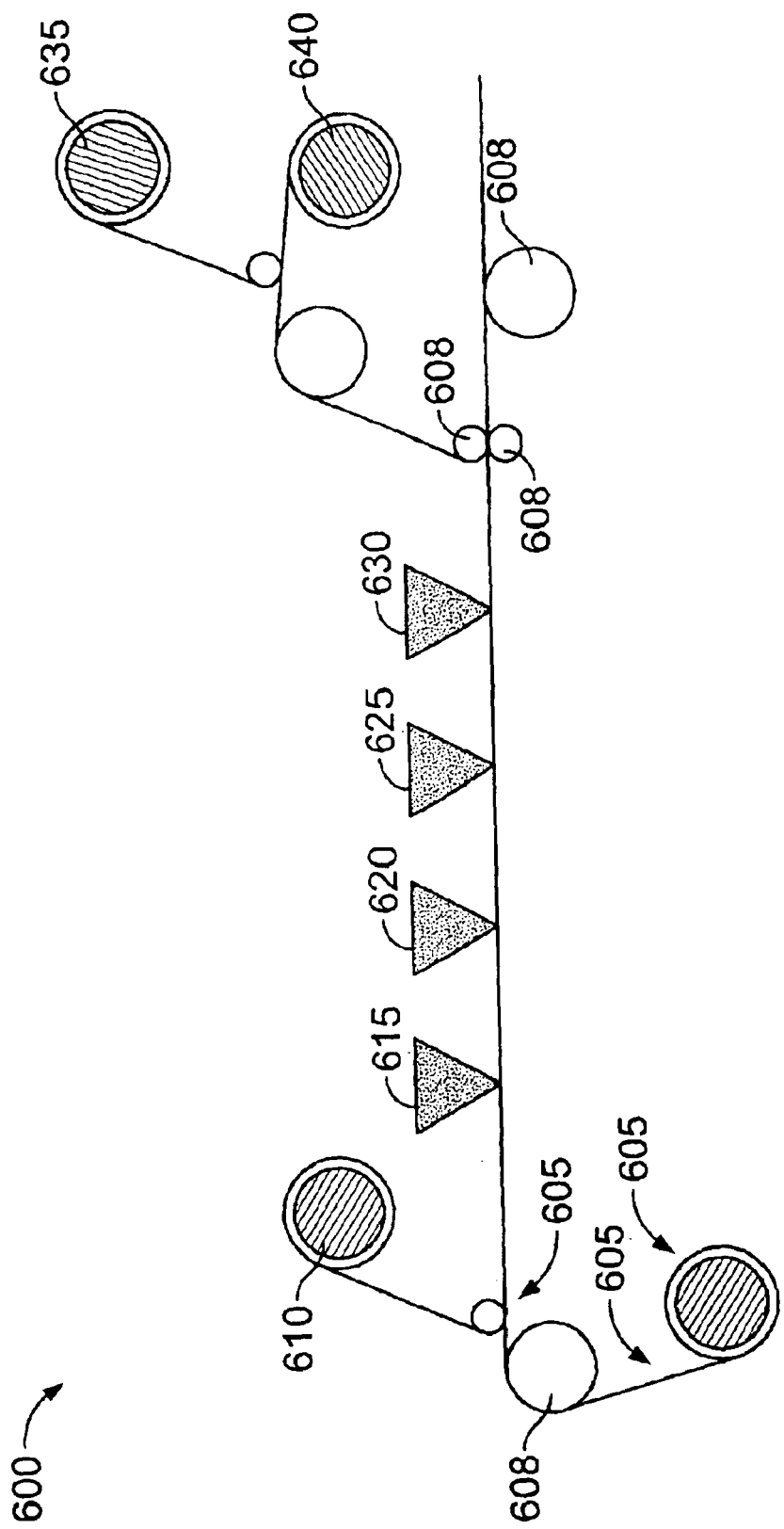
FIG. 6 depicts various embodiments of a continuous manufacturing process that may be used to form a photovoltaic cell or photovoltaic module of the present invention.

FIG. 6 depicts various embodiments of a continuous manufacturing process 600 that may be used to form the photovoltaic cells and modules of the present invention. In one embodiment, a photovoltaic cell or module is formed on an advancing first significantly light transmitting substrate sheet 605, which may be continuously advanced, periodically advanced, and/or irregularly advanced during a manufacturing run using rollers 608. In one embodiment, the mesh electrode is contained on a roll 610 and attached to the advancing substrate 605.

In various embodiments of methods for manufacturing photovoltaic modules, the mesh electrode comprises an interrupted mesh supported on a release sheet with insulative material disposed in the gaps between portions the mesh. In other embodiments, the mesh is a cut to the desired length, attached to the advancing substrate 605, and an insulative material disposed in the gaps between portions of mesh. In yet other embodiments, an insulative material is disposed on the advancing substrate 605, and mesh portions are applied from a release sheet (or cut and applied) to the advancing substrate. In addition, in various embodiments, the insulative material also can serve as an adhesive, a polymeric material, and/or thermosetting material that is used to attach the mesh electrode to the substrate and/or partially embed the mesh electrode in the substrate or a coating on the substrate.

The mesh electrode can be attached to the advancing substrate 605 in many ways. For example, in various embodiments, the mesh electrode is attached with an adhesive that can be applied before the mesh electrode roll 610, after the mesh electrode roll 610, or both. In various embodiments, the mesh electrode is attached to the advancing substrate 605 by partially embedding the mesh in the substrate or a coating on the substrate. For example, in one embodiment, the mesh electrode is heated and pressed into the advancing substrate 605 to partially embed the mesh electrode. In another embodiment, the advancing substrate is heated to soften a side of the advancing substrate 605 and the mesh electrode is pressed into the softened substrate. In another embodiment, a polymeric layer is coated on the advancing substrate 605 and either the mesh electrode, polymeric layer, or both are heated and the mesh electrode is pressed into the polymeric layer to partially embed the electrode. In yet another embodiment, a thermosetting material is coated on the advancing substrate 605 (before, after, or both before and after the mesh electrode roll) and thermosetting material is heated to partially embed the mesh electrode.

In addition, in one embodiment, the mesh electrode is first at least partially coated with a catalytic media (e.g., platinum, a conductive polymer) before attachment to the advancing substrate 605. In another embodiment, a catalytic media 615 is deposited on the mesh electrode after the mesh electrode is attached to the advancing substrate 605. In various embodiments, the catalytic media comprises platinum. In one embodiment, the mesh electrode is first plantinized by electrochemical deposition by use, for example, of chloroplatinic acid in an electrochemical cell, by vacuum deposition, or by pyrolysis of a coating containing a platinum compound (e.g. chloroplatinic acid). The mesh electrode is then, for example, attached to the advancing substrate 605 and the platinum is electrochemically deposited.

In various embodiments, the charge carrier media 620 is then deposited. The charge carrier media 620 may be applied by, for example, spray coating, roller coating, knife coating, or blade coating. The charge carrier media 620 may be prepared by forming a solution having an ion-conducting polymer, a plasticizer, and a mixture of iodides and iodine. The polymer provides mechanical and/or dimensional stability; the plasticizer helps the gel/liquid phase transition temperature; and the iodides and iodine act as redox electrolytes.

In one embodiment, an interconnected nanoparticle material 625 is then deposited. As described herein, the interconnected nanoparticle material 625 may be formed by applying a solution having a polylinker and metal oxide nanoparticles onto the advancing sheet. The polylinker-nanoparticle solution may be applied by any suitable technique including, but not limited to, dip tanks, extrusion coating, spray coating, screen printing, and gravure printing. In various other embodiments, the polylinker solution and metal oxide nanoparticles are separately applied to form the interconnected nanoparticle material 625. In one embodiment, the polylinker solution is applied to the advancing sheet and the metal oxide nanoparticles (preferably dispersed in a solvent) are disposed on the polylinker. In another embodiment, the metal oxide nanoparticles (preferably dispersed in a solvent) are applied to the advancing sheet and the polylinker solution is applied to the nanoparticles to form the interconnected nanoparticle material 625.

As described herein, a wide variety of photosensitizing agents may be applied 630 to and/or associated with the nanoparticles to produce a photosensitized interconnected nanoparticle material (and hence various embodiments of a photosensitized nanomatrix layer). After deposition of the photosensitizing agent 630, the advancing sheet may proceed to further processing stations depending on the ultimate product desired.

In various embodiments of methods for manufacturing photovoltaic modules, the photosensitized nanomatrix layer and charge carrier media are deposited as an interrupted layer with an insulative material disposed in the gaps. In various embodiments, an interconnecting wire is disposed in the gaps and the insulative material applied. In various other embodiments, an interconnecting wire is disposed in the gaps, which contain a previously applied insulative material. In addition, in various embodiments, the insulative material also can serve as an adhesive, a polymeric material, and/or thermosetting material that is used to hold the interconnecting wires in place, and/or facilitate holding a finished module together.

In various embodiment, the first electrode comprises a foil (or mesh) contained on a roll 635 is contained on a roll and applied to the advancing sheet. In another embodiment, the first electrode is contained on a roll 635 and is first attached to a second substrate 640.

In various embodiments of methods for manufacturing photovoltaic modules, the first electrode comprises an interrupted foil (or mesh) the supported on a release sheet with insulative material disposed in the gaps between portions of foil (or mesh). In other embodiments, the foil (or mesh) is cut to the desired length, attached to the second substrate (or the advancing sheet), and an insulative material disposed in the gaps between portions of foil (or mesh). In yet other embodiments, an insulative material is disposed on the second substrate (or advancing sheet), and foil (or mesh) portions are applied from a release sheet (or cut and applied) to the second substrate (or advancing sheet). In addition, in various embodiments, the insulative material also can serve as an adhesive, a polymeric material, and/or thermosetting material that is used to attach the first electrode to the substrate (or advancing sheet) and/or partially embed the first electrode in the substrate or a coating on the substrate.

The first electrode can be attached to the second substrate 640 in many ways. For example, in various embodiments, the first electrode is attached with an adhesive that can be applied before the first electrode roll 635, after the first electrode roll 635, or both. In various embodiments, the first electrode is attached to the second substrate 640 by partially embedding the first electrode in the substrate or a coating on the substrate. Examples of suitable methods of embedding are discussed above in the context of the mesh electrode.

In other embodiments, the first electrode comprises a deposited metal layer and/or semiconductor oxide film and is deposited on a target region of the second substrate 640 by for example, thermal evaporation, low temperature sputtering, and/or by vacuum deposition. In other embodiments, the first electrode comprises a conductive polymer, that is applied by any suitable technique including, but not limited to, dip tanks, extrusion coating, spray coating, screen printing, and gravure printing. In addition, in embodiments where the first electrode comprises a mesh, a transparent semiconductor oxide film may be, for example, vacuum coated at least in the openings of the mesh.

In addition, in various embodiments of methods for manufacturing photovoltaic modules, spacers may be applied to the advancing sheet 605 at any point in the manufacturing process.

According to various embodiments, the second substrate 640 (which may have attached the first electrode) is then applied to the advancing sheet 605 to complete the photovoltaic cell (or modules) using the continuous manufacturing process 600.

It is to be understood that the above various embodiments of a continuous manufacturing process that may be used to form the photovoltaic cells and modules of the present invention are illustrative and that the order of the may be reversed. For example, in one embodiment, the first electrode is attached to the substrate, the photosensitized nanomatrix layer formed on the first electrode.

EXAMPLE 1

Mesh Electrode Photovoltaic Cells

In this example, three photovoltaic cells were assembled comprising 25 μm thick titanium foil laminated to a 75 μm thick flexible substrate made of PEN, a high temperature sintered titanium dioxide nanoparticle layer (dye sensitized with a 0.5 mM cis-bis(isothiocyanato)bis(2,2'-bipyridyl-4, 4'-dicarboxylato)-ruthenium(II) bis-tetrabutylammonium; cis-bis(isocyanato) (2,2'-bipyridyl-4,4'dicarboxylato) ruthenium (II) dye), an potassium iodide/iodine electrolyte, and a stainless steel mesh electrode. The mesh electrode was made of woven wires of 316 stainless steel having a 30 μm diameter, and the mesh having about an 82% open area between wires. Prior to its incorporation into the cell, the stainless steel mesh electrode was platinized electrochemically (with about a 0.001 μm thick platinum coating) and bonded to a 75 μm thick flexible substrate made of PEN. The mesh electrode was incorporated into the cell as the cell cathode.

The completed solar cells exhibited the following photovoltaic (PV) characteristics at AM 1.5 solar simulator conditions (i.e., irradiation with light having an intensity of 1000 W/m$^2$) listed in Table 1, where the characteristics measured were as follows: average solar conversion efficiency ("η"); fill factor (FF); average open circuit voltage ("$V_{oc}$"); short circuit current ("$I_{sc}$"); voltage at maximum power output ("$V_m$") It should be noted that the fill factor ("FF") can be calculated from the ratio of solar, and current at maximum power output ("$I_m$") conversion efficiency to the product of the open circuit voltage and the short circuit current, i.e., $FF=\eta/[V_{oc}*I_{sc}]$.

TABLE 1

| Photovoltaic Characteristics | A | B | C |
|---|---|---|---|
| Cell Area (cm$^2$) | 0.873 | 0.900 | 1.17 |
| η (%) | 2.86 | 3.86 | 3.12 |
| I$_{sc}$ (mA/cm) | 5.62 | 7.75 | 8.72 |
| V$_{oc}$ (V) | 0.643 | 0.659 | 0.669 |
| V$_m$ (V) | 0.507 | 0.507 | 0.487 |
| I$_m$ (mA/cm$^2$) | 5.65 | 7.60 | 6.40 |
| FF | 0.693 | 0.680 | 0.625 |

Figure 7:
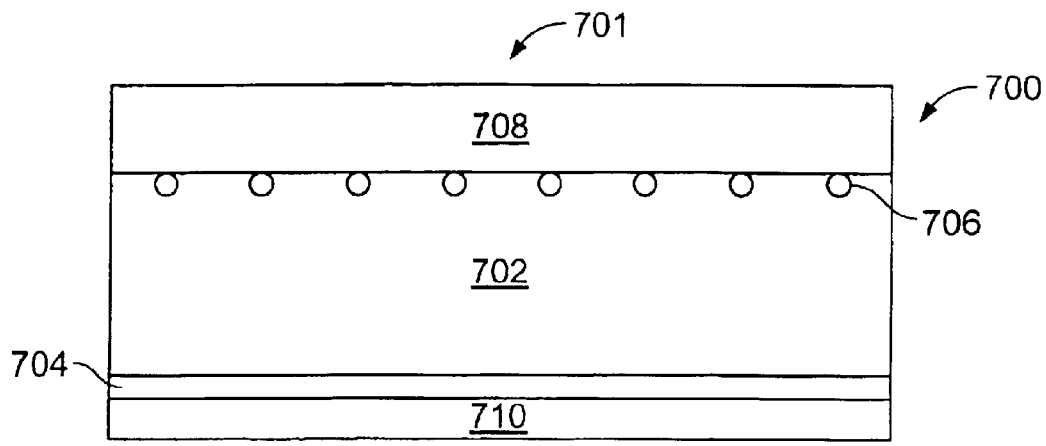
FIG. 7 is a schematic cross-sectional view of one embodiment of photovoltaic cells in accordance with one aspect of the present invention comprising a photoactive material.

Referring to FIG. 7, in another aspect, the invention provides a photovoltaic cell 700 having an exposure side 701, where the photovoltaic cell 700 comprises a photoactive material 702 disposed between a first electrode 704 and an exposure side mesh electrode 706. The photoactive material can be a form of silicon (such as, e.g., crystalline, polycrystalline, amorphous), a thin film type photoconductor, or a photosensitized nanomatrix material. Preferably, the "photovoltaic cell" further comprise a first significantly light transmitting substrate 708 and a second substrate 710.

B. Low Temperature Interconnection of Nanoparticles

As discussed above, in one embodiment the invention provides a polymeric linking agent (hereinafter a "polylinker") that enables the fabrication of thin film solar cells at relatively low "sintering" temperatures (less than about 300° C.). Although the term "sintering" conventionally refers to high temperature (greater than about 400° C.) processes, as used herein, the term "sintering" is not temperature specific, but instead refers generally to the process of interconnecting nanoparticles at any suitable temperature. In one illustrative embodiment, the invention provides a method for using polylinkers to interconnect nanoparticles in a thin film solar cells. According to another illustrative embodiment, the relatively low temperature sintering process enables the manufacture of such photovoltaic cells using flexible polymer substrates. By employing flexible substrates, the invention also enables a continuous roll-to-roll or web manufacturing process to be employed.

Figure 8:
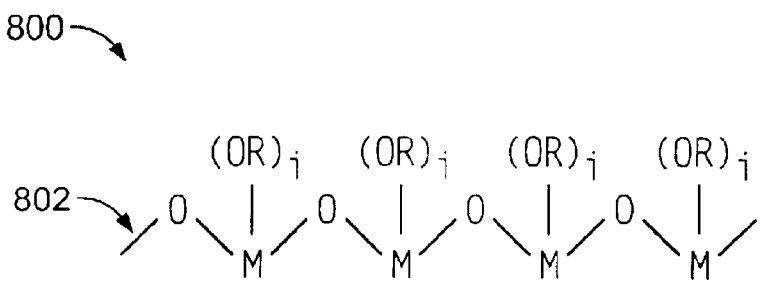
FIG. 8 depicts an exemplary chemical structure of an illustrative embodiment of a polylinker for nanoparticles of an oxide of metal M, in accordance with the invention.
Figure 9:
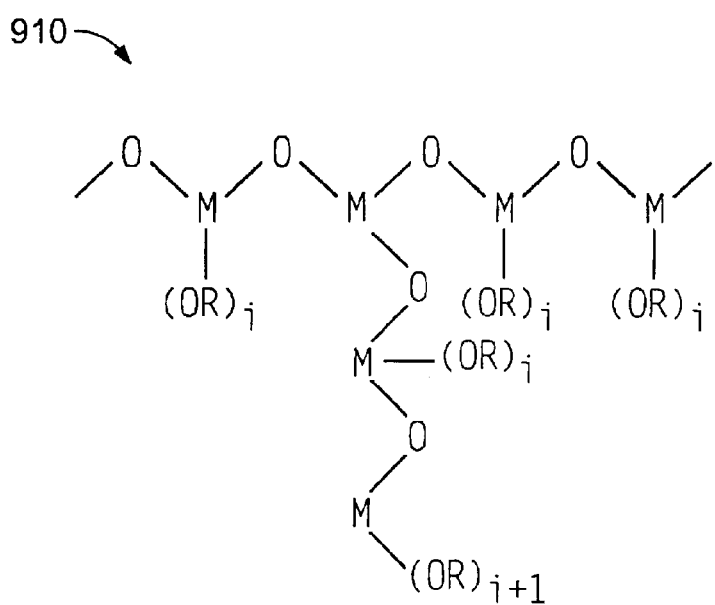
FIG. 9 depicts another exemplary chemical structure of an illustrative embodiment of a polylinker, in accordance with the invention, for nanoparticles of an oxide of metal M.

FIGS. 8 and 9 schematically depict chemical structures of illustrative polylinkers, according to the invention. The particular polylinkers structures depicted are for use with nanoparticles of the formula M$_x$O$_y$, where M may be, for example, titanium (Ti), zirconium (Zr), tungsten (W), niobium (Nb), lanthanum (La), tantalum (Ta), terbium (Tb), or tin (Sn) and x and y are integers greater than zero. According to the illustrative embodiment of FIG. 8, the polylinker 800 includes a backbone structure 102, which is similar in structure to the metal oxide nanoparticles, and (OR)$_i$ reactive groups, where R may be, for example, acetate, an alkyl, alkene, alkyne, aromatic, or acyl group; or a hydrogen atom and i is an integer greater than zero. Suitable alkyl groups include, but are not limited to, ethyl, propyl, butyl, and pentyl groups. Suitable alkenes include, but are not limited to, ethene, propene, butene, and pentene. Suitable alkynes include, but are not limited to, ethyne, propyne, butyne, and pentyne. Suitable aromatic group include, but are not limited to, phenyl, benzyl, and phenol. Suitable acyl groups include, but are not limited to, acetyl and benzoyl. In addition, a halogen including, for example, chlorine, bromine, and iodine may be substituted for the (OR)$_i$ reactive groups.

Referring to FIG. 9, the polylinker 910 has a branched backbone structure that includes two —M—O—M—O— M—O— backbone structures, which include (OR)$_i$ reactive groups and (OR)i$_{+1}$ reactive groups, where R may be, for example, one of the atoms, molecules, or compounds listed above and i is an integer greater than zero. The two backbone structures have similar structures to the metal oxide nanoparticles. Collectively, the structure depicted in FIG. 9 can be represented by —M(OR)$_i$—O—(M(OR)$_i$—O)$_n$—M (OR)$_{i+1}$, where i and n are integers greater than zero.

Figure 10A:
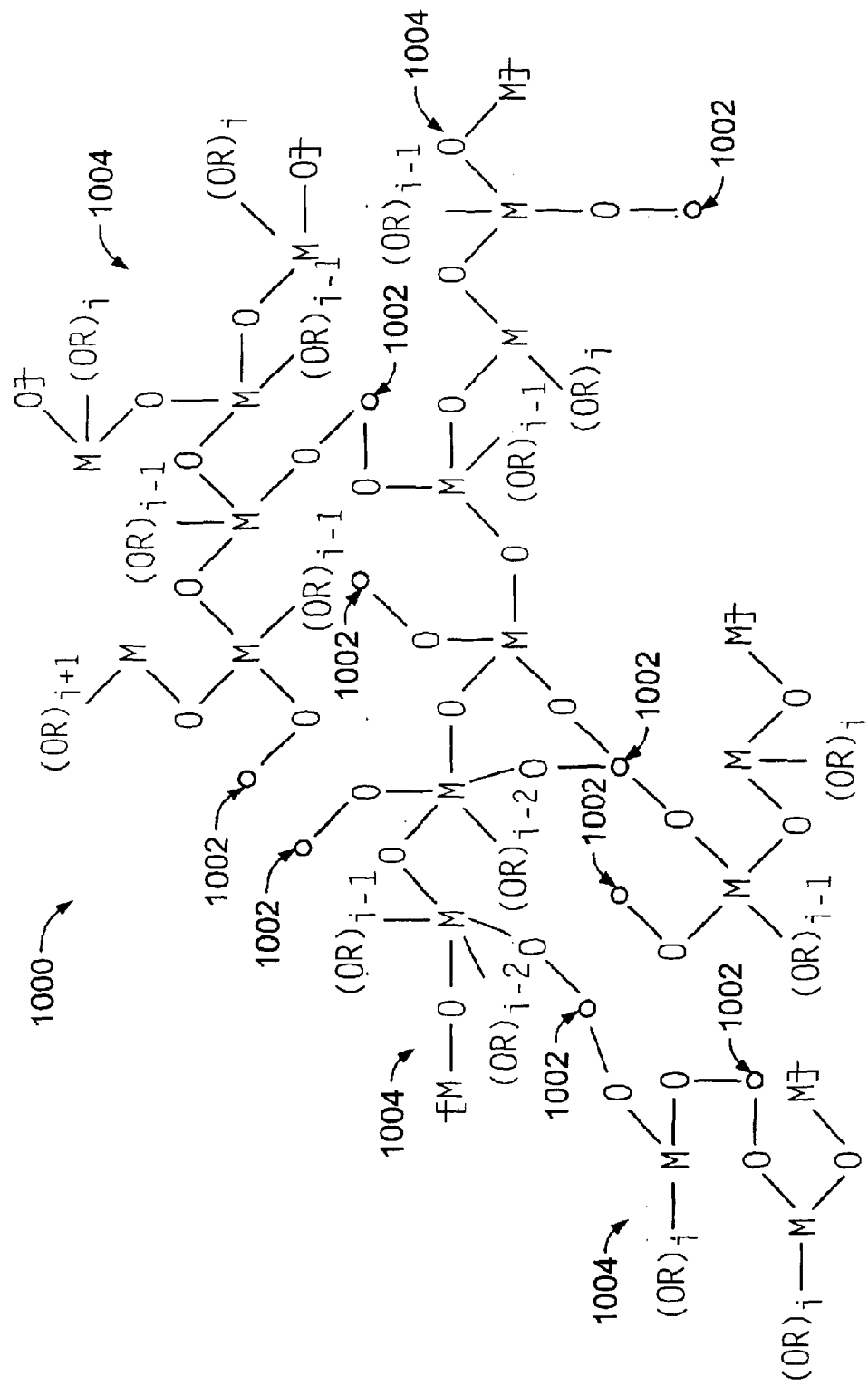
FIG. 10A shows an exemplary chemical structure for an interconnected nanoparticle film with a polylinker, in accordance with the invention.

FIG. 10A depicts schematically the chemical structure 1000 resulting from interconnecting the M$_x$O$_y$ nanoparticles 1002 with a polylinker 1004. In various embodiments, the polylinker 1004 has the chemical structure of the polylinkers 800 and 910 depicted in FIGS. 8 and 9, respectively. According to the illustrative embodiment, the nanoparticles 1002 are interconnected by contacting the nanoparticles 1002 with a polylinker 1004 at or below room temperature or at elevated temperatures that are less than about 300° C. Preferably, the polylinker 1004 is dispersed in a solvent to facilitate contact with the nanoparticles 1002. Suitable solvents include, but are not limited to, various alcohols, chlorohydrocarbons (e.g., chloroform), ketones, cyclic and linear chain either derivatives, and aromatic solvents among others. It is believed that the reaction between surface hydroxyl groups of the nanoparticles 1002 with alkoxy groups on the polymer chain of the polylinker 1004 leads to bridging (or linking) the many nanoparticles 1002 together through highly stable covalent links, and as a result, to interconnecting the nanoparticles 1002. It also is believed that since the polylinker 1004 is a polymeric material with a chemical structure similar to that of the nanoparticles 1002, even a few binding (or linking) sites between the nanoparticles 1002 and the polylinker 1004 leads to a highly interconnected nanoparticle film with a combination of electrical and mechanical properties superior to those of a non-sintered or non-interconnected nanoparticle film. The electrical properties include, for example, electron and/or hole conducting properties that facilitate the transfer of electrons or holes from one nanoparticle to another through, for example, π-conjugation. The mechanical properties include, for example, improved flexibility.

Still referring to FIG. 10A, at low concentrations of the polylinker 1004, a single polylinker 1004 polymer can link many nanoparticles 1002 forming a cross-linked nanoparticle network. However, by increasing the concentration of the polylinker 1004 polymer, more polylinker 1004 molecules may be attached to the surface of the nanoparticles 1002 forming polymer-coated nanoparticles 1000. Such polymer-coated nanoparticles 1000 may be processed as thin films due to the flexibility of the polymer. It is believed that the electronic properties of the polymer-coated nanoparticles are not affected to a significant extent due to the similar electronic and structural properties between the polylinker polymer and the nanoparticles.

Figure 10B:
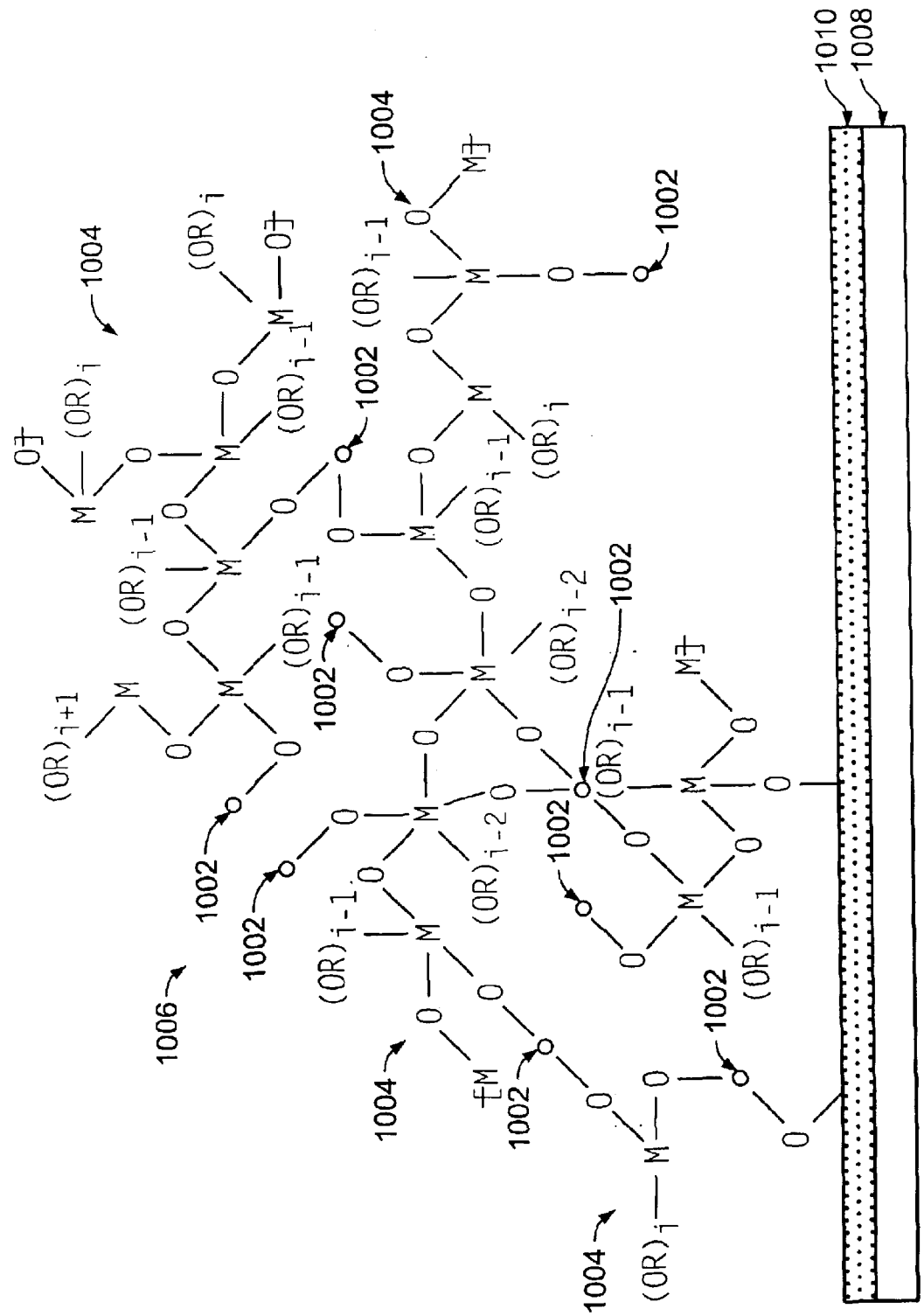
FIG. 10B shows the interconnected nanoparticle film of FIG. 3A attached to a substrate oxide layer, in accordance with the invention.

FIG. 10B depicts the chemical structure 1006 of an illustrative embodiment of the interconnected nanoparticle film 1000 from FIG. 10A formed on a flexible substrate 1008 that includes an oxide layer coating 1010, which is an electrical conductor. In particular, the polylinkers may be used to facilitate the formation of such nanoparticle films 1000 on flexible, significantly light transmitting substrates 1008. Examples of flexible substrates 1008 include polyethylene terephthalates (PETs), polyimides, polyethylene naphthalates (PENs), polymeric hydrocarbons, cellulosics, combinations thereof, and the like. PET and PEN substrates may be coated with one or more electrical conducting, oxide layer coatings 1010 of, for example, indium tin oxide (ITO), a fluorine-doped tin oxide, tin oxide, zinc oxide, and the like.

According to one preferred embodiment, by using the illustrative polylinkers, the methods of the invention interconnect nanoparticles 1002 at temperatures significantly below 400° C., and preferably below about 300° C. Operating in such a temperature range enables the use of the flexible substrates 1008, which would otherwise be destructively deformed by conventional high temperature sintering methods. In one illustrative embodiment, the exemplary structure 1006 is formed by interconnecting the nanoparticles 1002 using a polylinker 1004 on a substrate 1008 at temperatures below about 300° C. In another embodiment, the nanoparticles 1002 are interconnected using a polylinker 1004 at temperatures below about 100° C. In still another embodiment, the nanoparticles 1002 are interconnected using a polylinker 1004 at about room temperature and room pressure, from about 18 to about 22° C. and about 760 mm Hg, respectively.

In embodiments where the nanoparticles are deposited on a substrate, the reactive groups of the polylinker bind with the substrate, substrate coating and/or substrate oxide layers. The reactive groups may bind to the substrate, substrate coating and/or substrate oxide layers by, for example, covalent, ionic and/or hydrogen bonding. It is believed that reactions between the reactive groups of the polylinker with oxide layers on the substrate result in connecting nanoparticles to the substrate via the polylinker.

According to various embodiments of the invention, metal oxide nanoparticles are interconnected by contacting the nanoparticles with a suitable polylinker dispersed in a suitable solvent at or below room temperature or at elevated temperatures below about 300° C. The nanoparticles may be contacted with a polylinker solution in many ways, for example, a nanoparticle film may be formed on a substrate and then dipped into a polylinker solution. A nanoparticle film may be formed on a substrate and the polylinker solution sprayed on the film. The polylinker and nanoparticles may be dispersed together in a solution and the solution deposited on a substrate. To prepare nanoparticle dispersions, techniques such as, for example, microfluidizing, attritting, and ball milling may be used. Further, a polylinker solution may be deposited on a substrate and a nanoparticle film deposited on the polylinker.

In embodiments where the polylinker and nanoparticles are dispersed together in a solution, the resultant polylinker-nanoparticle solution may be used to form an interconnected nanoparticle film on a substrate in a single step. In various versions of this embodiment, the viscosity of the polylinker-nanoparticle solution may be selected to facilitate film deposition using printing techniques such as, for example, screen-printing and gravure-printing techniques. In embodiments where a polylinker solution is deposited on a substrate and a nanoparticle film deposited on the polylinker, the concentration of the polylinker can be adjusted to achieve a desired adhesive thickness. In addition, excess solvent may be removed from the deposited polylinker solution prior to deposition of the nanoparticle film.

The invention is not limited to interconnection of nanoparticles of a material of formula $M_xO_y$. Suitable nanoparticle materials include, but are not limited to, sulfides, selenides, tellurides, and oxides of titanium, zirconium, lanthanum, niobium, tin, tantalum, terbium, and tungsten, and combinations thereof. For example, $TiO_2$, $SrTiO_3$, $CaTiO_3$, $ZrO_2$, $WO_3$, $La_2O_3$, $Nb_2O_5$, $SnO_2$, sodium titanate, and potassium niobate are suitable nanoparticle materials.

The polylinker may contain more than one type of reactive group. For example, the illustrative embodiments of FIGS. 8–10B depict one type of reactive group OR. However, the polylinker may include several types of reactive groups, e.g., OR, OR', OR", etc.; where R, R' and R" are one or more of a hyrogen, alkyl, alkene, alkyne, aromatic, or acyl group or where one or more of OR, OR', and OR" are a halide. For example, the polylinker may include polymer units of formulas such as, $-[O-M(OR)_i(OR')_j-]-$, and $[O-M(OR)_i(OR')_j(OR")_k-]-$, where i, j and k are intergers greater than zero.

Figure 11:
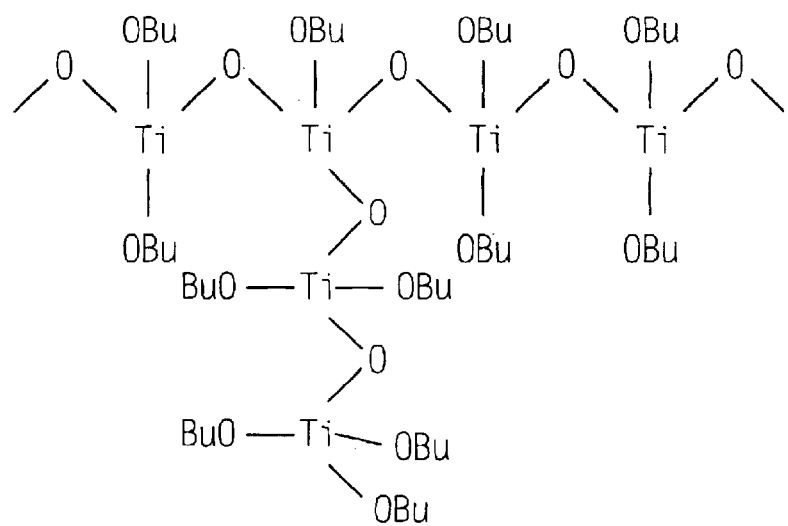
FIG. 11 depicts the chemical structure of poly(n-butyl titanate)

FIG. 11 depicts the chemical structure of a representative polylinker, poly(n-butyl titanate) 1100 for use with titanium dioxide ($TiO_2$) nanoparticles. Suitable solvents for poly(n-butyl titanate) 1100 include, but are not limited to, various alcohols, chlorohydrocarbons (e.g., chloroform), ketones, cyclic and linear chain either derivatives, and aromatic solvents among others. Preferably, the solvent is n-butanol. The poly(n-butyl titanate) polylinker 400 contains a branched —Ti—O—Ti—O—Ti—O— backbone structure with butoxy (Obu) reactive groups.

Figure 12A:
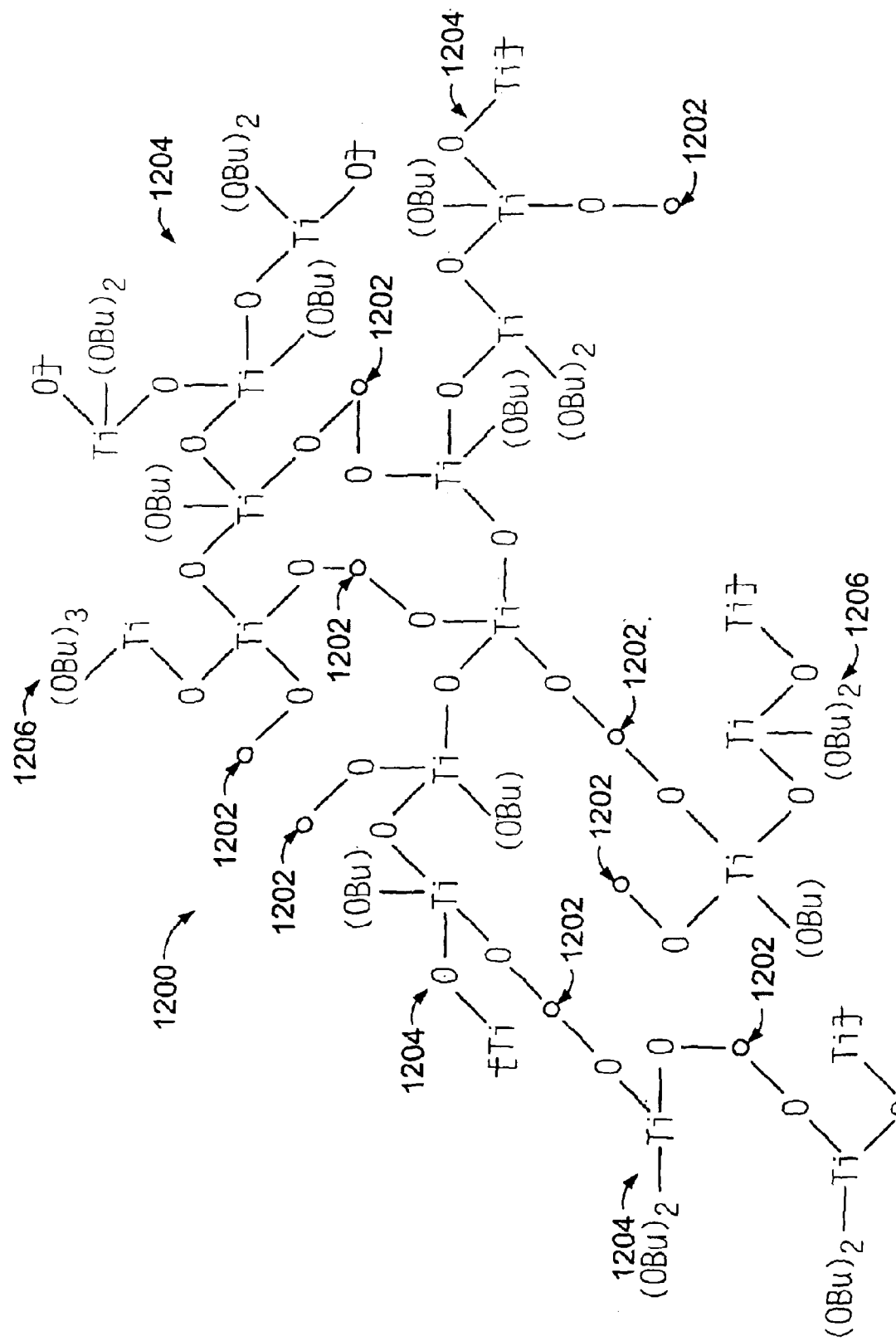
FIG. 12A shows the chemical structure of a titanium dioxide nanoparticle film interconnected with poly(n-butyl titanate), in accordance with the invention.

FIG. 12A depicts the chemical structure of a nanoparticle film 1200, which is constructed from titanium dioxide nanoparticles 1202 interconnected by poly(n-butyl titanate) polylinker molecules 1204. It is believed that the reaction between surface hydroxyl groups of the $TiO_2$ nanoparticles 1202 with butoxy groups 1206 (or other alkoxy groups) of the polylinker 1204 leads to the bridging (or linking) of many manoparticles 1202 together through highly stable covalent links, and as a result, interconnecting the nanoparticles 1202. Furthermore, it is believed that since the polylinker 1204 is a polymeric material with a chemical structure similar to that of $TiO_2$, even a few binding (or linking) sites between nanoparticles 1202 and polylinker 1204 will lead to a highly interconnected nanoparticle film 1200, with electronic and mechanical properties superior to those of a non-sintered or non-interconnected nanoparticle film.

Figure 12B:
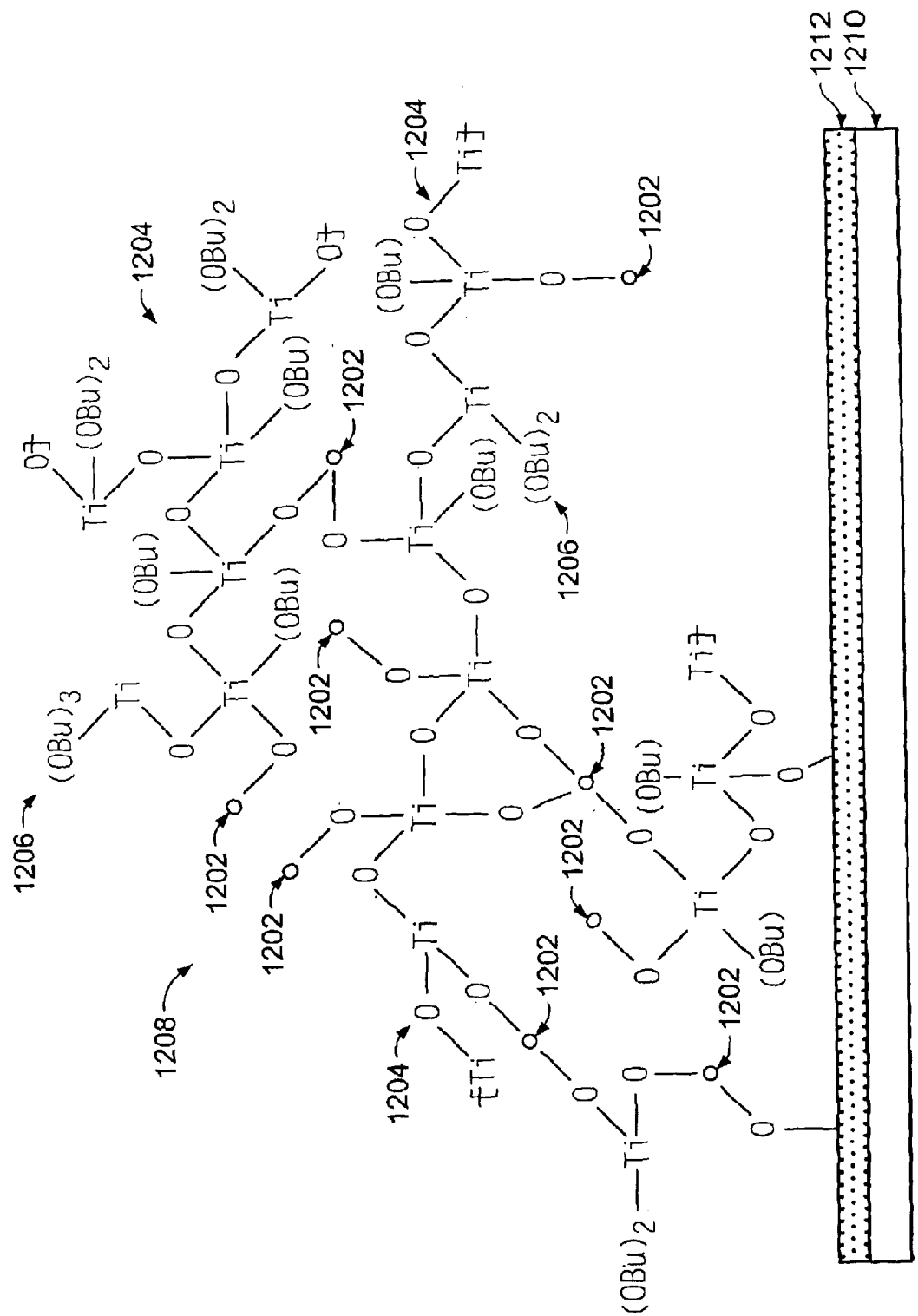
FIG. 12B shows the interconnected titanium dioxide nanoparticle film of FIG. 12A attached to a substrate oxide layer, in accordance with the invention.

FIG. 12B depicts the chemical structures 1208 of the nanoparticle film 1200 from FIG. 12A formed on a substrate 1210, which includes an electrically-conducting oxide layer coating 1212, by applying the polylinker solution to the substrate 1210 and then depositing the nanoparticles 1202 on the polylinker 1204. In the illustrative example using titanium dioxidenanoparticles 1202, a polylinker solution including poly(n-butyl titanate) 1204 is dissolved in n-butanol and applied to the substrate 1210. The concentration of the polylinker 1204 can be adjusted to achieve a desired adhesive thickness for the polylinker solution. A titanium dioxide nanoparticle film 1200 is then deposited on the polylinker coated substrate 1210. Reaction between the surface hydroxyl groups of the $TiO_2$ nanoparticles with reactive butoxy groups 1206 (or other alkoxy groups) of poly(n-butyl titanate) 1204 results in interconnecting the nanoparticles 1202, as well as connecting nanoparticles 1202 with the oxide layers 1212 on the substrate 1210.

Figure 12C:
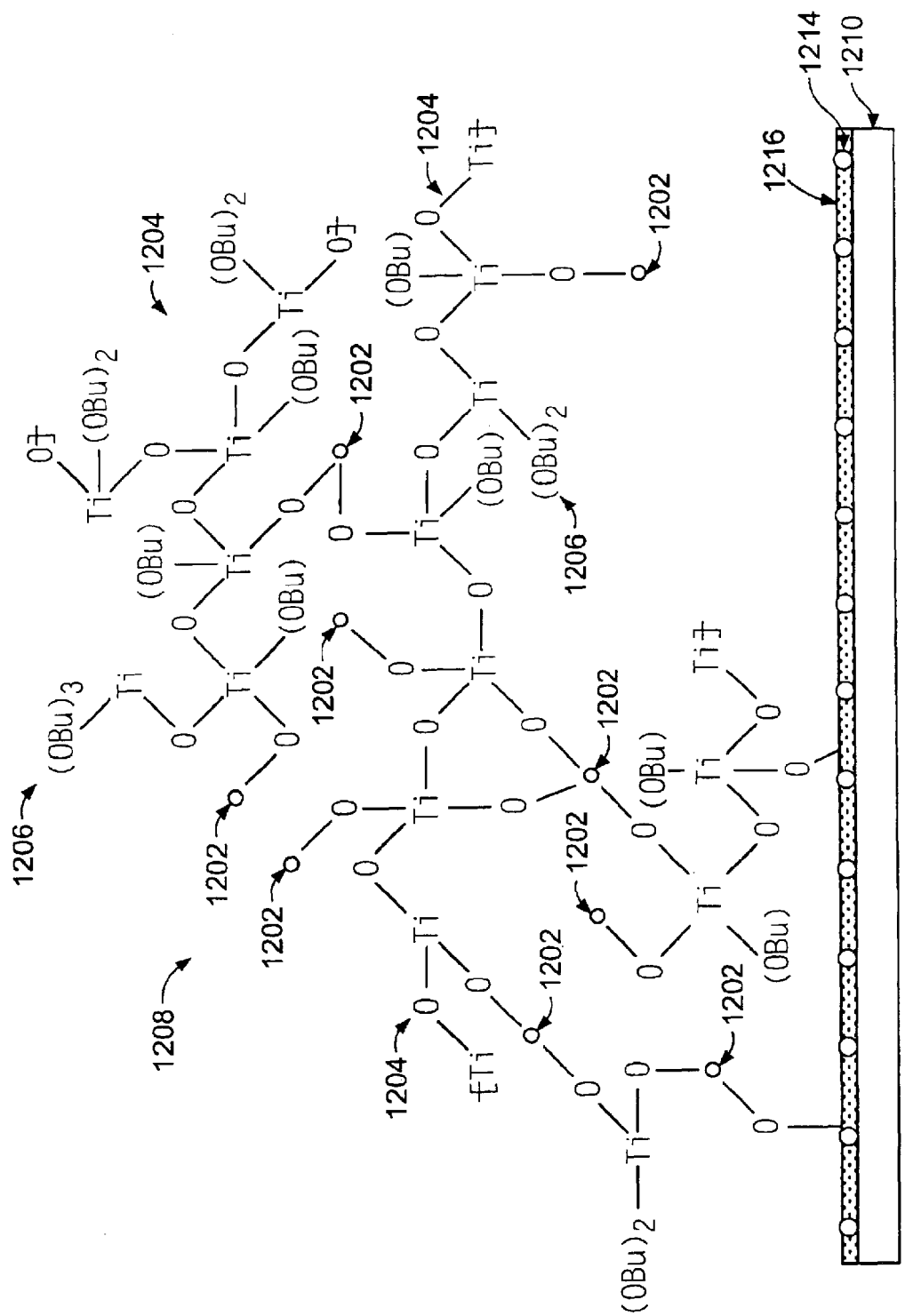
FIG. 12C shows the interconnected titanium dioxide nanoparticle film of FIG. 12A attached to a mesh electrode, in accordance with the invention.

FIG. 12C depicts the chemical structures 1208 of the nanoparticle film 1200 from FIG. 12A formed on a metal wire mesh electrode 1214 by applying the polylinker solution to the mesh electrode 1214 and then depositing the nanoparticles 1202 on the polylinker 1204. In one embodiment, the mesh electrode 1214 further includes a transparent semiconductor oxide film 1216 disposed at least between the openings of the mesh electrode 1214. In the illustrative example using titanium dioxidenanoparticles 1202, a polylinker solution including poly(n-butyl titanate) 1204 is dissolved in n-butanol and applied to the mesh electrode 1214, and transparent semiconductor oxide film 1216 if present. The concentration of the polylinker 1204 can be adjusted to achieve a desired adhesive thickness for the polylinker solution. A titanium dioxide nanoparticle film 1200 is then deposited on the polylinker coated mesh electrode 1214, and transparent semiconductor oxide film 1216 if present. Reaction between the surface hydroxyl groups of the $TiO_2$ nanoparticles with reactive butoxy groups 1206 (or other alkoxy groups) of poly(n-butyl titanate) 1204 results in interconnecting the nanoparticles 1202, as well as connecting nanoparticles 1202 with the oxide layers on the mesh electrode 1214, and transparent semiconductor oxide film 1216 if present.

In another aspect, the invention also provides methods of forming a layer of interconnected metal oxide nanoparticles on a substrate using a continuous manufacturing process, such as, for example, a roll-to-roll or web process. These methods may be used, for example, to produce DSSCs. The current processes for producing DSSCs in large numbers, for example using a continuous and cost effective assembly line process, are extremely difficult at best. The difficulties associated with a continuous assembly process for a DSSC may arise from the cell support or substrate, which is generally rigid and typically includes thermally resistant materials such as glass and metal. The primary reason for this is related to the high temperature sintering process for producing fused nanocrystals (typically about 400–500° C.). Rigid substrate materials, by their very nature, generally do not lend themselves to a continuous process for manufacture, but rather to a more expensive batch process.

Figure 13:
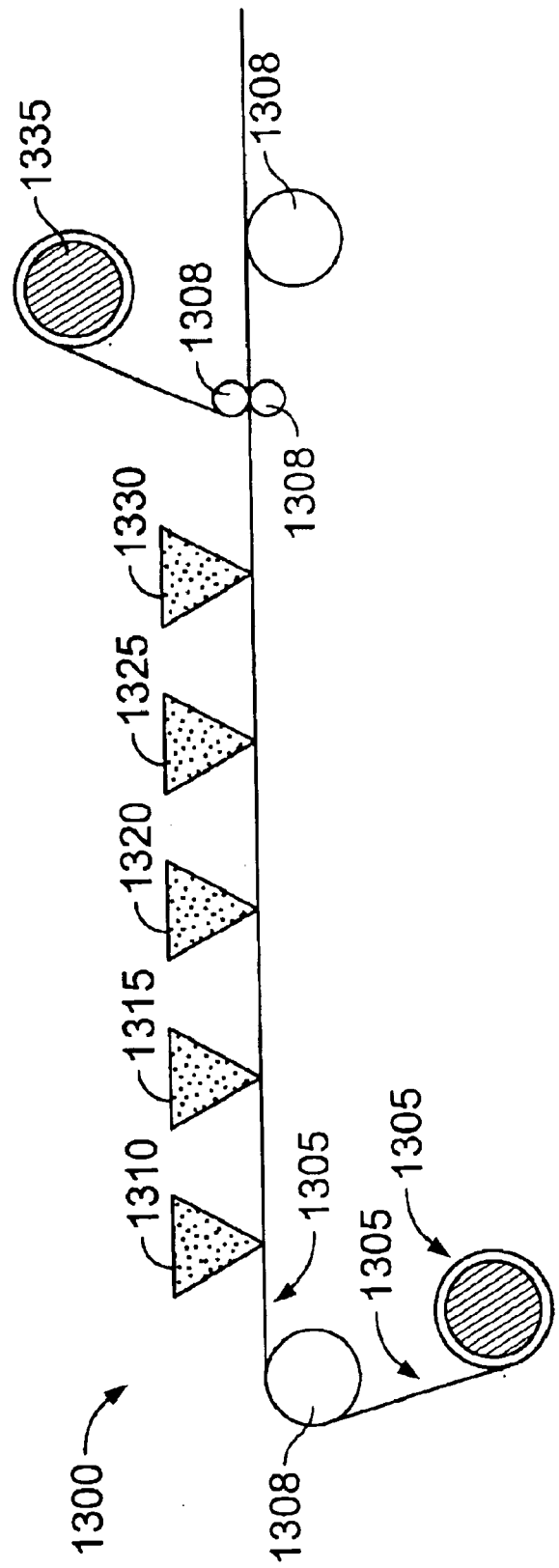
FIG. 13 depicts an illustrative embodiment of a continuous manufacturing process that may be used to form the flexible photovoltaic cells, in whole or part.

FIG. 13 depicts an illustrative embodiment of a continuous manufacturing process 1300 that may be used to form, for example, in whole or part, the photovoltaic cell shown in FIGS. 1A–1B, 2A–2B, 3A–3D, and 4–6. According to the illustrative embodiment, an interconnected nanoparticle film is formed on an advancing substrate sheet 1305, which may be continuously advanced, periodically advanced, and/or irregularly advanced during a manufacturing run using rollers 1308. In this illustrative embodiment, the electrical conductor material 1310, which serves as the basis for one electrode of a photovoltaic cell, is deposited on the advancing substrate 1305. In various embodiments, the electrical conductor material 1310 may be deposited on a target region of the substrate 1305 by thermal evaporation or low temperature sputtering. In addition, the electrical conductor material 1310 may be deposited, for example, by vacuum deposition.

According to the illustrative embodiment shown in FIG. 13, the photosensitized nanoparticle material 1315 is then deposited. As described herein, the photosensitized nanoparticle material 1315 may be formed by applying a solution having a polylinker and metal oxide nanoparticles onto the advancing substrate sheet 1305. The polylinker-nanoparticle solution may be applied by any suitable technique including, but not limited to, dip tanks, extrusion coating, spray coating, screen printing, and gravure printing. In other illustrative embodiments, the polylinker solution and metal oxide nanoparticles are separately applied to the advancing substrate sheet 1305 to form the photosensitized nanoparticle material 1315. In one illustrative embodiment, the polylinker solution is applied to the advancing substrate 1305 and the metal oxide nanoparticles (preferably dispersed in a solvent) are disposed on the polylinker. In another illustrative embodiment, the metal oxide nanoparticles (preferably dispersed in a solvent) are applied to the advancing substrate 1305 and the polylinker solution is applied to the nanoparticles to form the photosensitized nanoparticle material 1315. As described herein, a wide variety of photosensitizing agents may be applied to and/or associated with the nanoparticles to produce the photosensitized nanoparticle material 1315.

After deposition of the photosensitized nanomatrix material 1315, the substrate sheet 1305 may proceed to further processing stations depending on the ultimate product desired. According to this illustrative embodiment, the charge carrier material 1320, which facilitates the transfer of electrical charge from a ground potential or a current source to the photosensitized nanoparticle material 1315, is deposited. The charge carrier material 1320 may be applied by, for example, spray coating, roller coating, knife coating, or blade coating. The charge carrier media 1320 may be prepared by forming a solution having an ion-conducting polymer, a plasticizer, and a mixture of iodides and iodine. The polymer provides mechanical and/or dimensional stability; the plasticizer helps the gel/liquid phase transition temperature; and the iodides and iodine act as redox electrolytes.

Still referring to FIG. 13, the catalytic media layer 1325, which facilitates the transfer of electrons ejected by the photoexcited molecules within the photovoltaic cell, is then deposited. Subsequently, a second electrical conductor layer 1330 is deposited. The second electrical conductor layer 1330 serves as the basis for a second electrode of the photovoltaic cell. A second, flexible substrate 1335 is then unwound and applied to the advancing sheet 1305 to complete the photovoltaic cell using the continuous manufacturing process 1300.

Further illustrative examples of the invention in the context of a DSSC including titanium dioxide nanoparticles are provided below. The following examples are illustrative and not intended to be limiting. Accordingly, it is to be understood that the invention may be applied to a wide range of nanoparticles including, but not limited to, $SrTiO_3$, $CaTiO_3$, $ZrO_2$, $WO_3$, $La_2O_3$, $Nb_2O_5$, sodium titanate, and potassium niobate nanoparticles. In addition, it should be realized that the invention is generally applicable to formation of interconnected nanoparticles for a wide variety of applications in addition to DSSC, such as, for example, metal oxide and semiconductor coatings.

EXAMPLE 2

Dip-Coating Application of Polylinker

Figure 14:
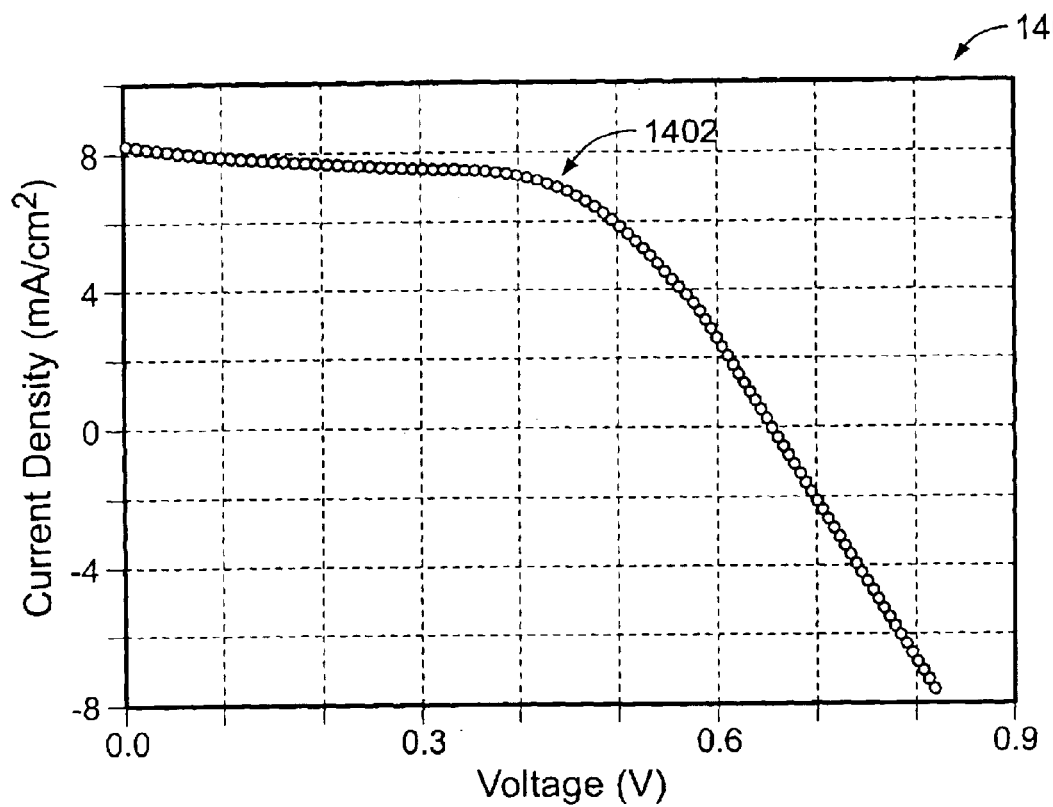
FIG. 14 depicts a current-voltage curve for an exemplary solar cell.

In this illustrative example, a DSSC was formed as follows. A titanium dioxide nanoparticle film was coated on a $SnO_2$:F coated glass slide. The polylinker solution was a 1% (by weight) solution of the poly(n-butyl titanate) in n-butanol. In this embodiment, the concentration of the polylinker in the solvent was preferably less than 5% by weight. To interconnect the particles, the nanoparticle film coated slide was dipped in the polylinker solution for 15 minutes and then heated at 150° C. for 30 minutes. The polylinker treated $TiO_2$ film was then photosensitized with a $3\times10^{-4}$ N3 dye solution for 1 hour. The polylinker treated $TiO_2$ film coated slide was then fabricated into a 0.6 cm$^2$ photovoltaic cell by sandwiching a triiodide based liquid redox electrolyte between the $TiO_2$ film coated slide a platinum coated $SnO_2$:F glass slide using 2 mil SURLYN 1702 hot melt adhesive available from DuPont. The platinum coating was approximately 60 nm thick. The cell exhibited a solar conversion efficiency of as high as 3.33% at AM 1.5 solar simulator conditions (i.e., irradiation with light having an intensity of 1000 W/m$^2$). The completed solar cells exhibited an average solar conversion efficiency ("η") of 3.02%; an average open circuit voltage ("$V_{oc}$") of 0.66 V; an average short circuit current ("$I_{sc}$") of 8.71 mA/cm$^2$, and an average fill factor ("FF") of 0.49 (0.48 to 0.52). FIG. 14 depicts a graph 1400 that shows the current voltage curve 1402 for the dip-coated photovoltaic cell.

EXAMPLE 3

Polylinker-Nanoparticle Solution Application

Figure 15:
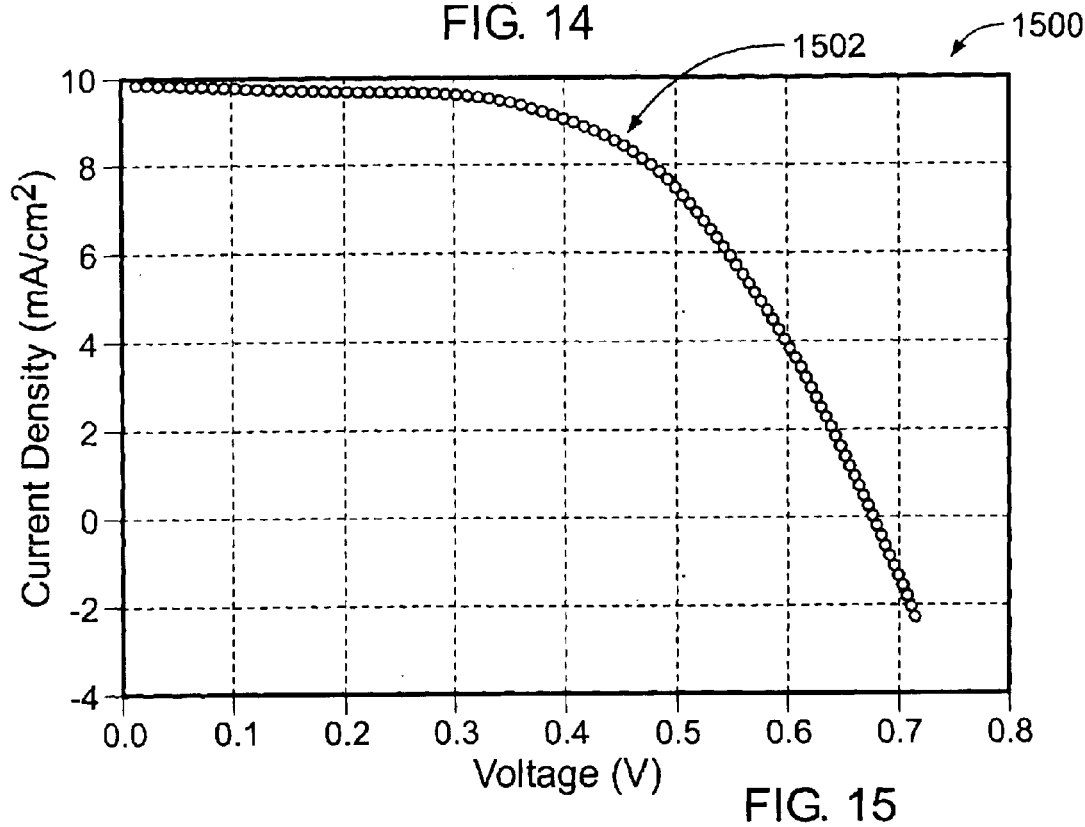
FIG. 15 shows a current-voltage curve for an exemplary solar cell, in accordance with the invention.

In this illustrative example, a 5.0 mL suspension of titanium dioxide (P25, which is a titania that includes approximately 80% anatase and 20% rutile crystalline $TiO_2$ nanoparticles and which is available from Degussa-Huls) in n-butanol was added to 0.25 g of poly(n-butyl titanate) in 1 mL of n-butanol. In this embodiment, the concentration of the polylinker in the polylinker-nanoparticle solution was preferably less than about 50% by weight. The viscosity of the suspension changed from milk-like to toothpaste-like with no apparent particle separation. The paste was spread on a patterned $SnO_2$:F coated glass slide using a Gardner knife with a 60 μm thick tape determining the thickness of wet film thickness. The coatings were dried at room temperature forming the films. The air-dried films were subsequently heat treated at 150° C. for 30 minutes to remove solvent, and sensitized overnight with a $3 \times 10^{-4}$ M N3 dye solution in ethanol. The sensitized photoelectrodes were cut into desired sizes and sandwiched between a platinum (60 nm thick) coated $SnO_2$:F coated glass slide and a tri-iodide based liquid electrolyte. The completed solar cells exhibited an average η of 2.9% (2.57% to 3.38%) for six cells at AM 1.5 conditions. The average $V_{oc}$ was 0.68 V (0.66 to 0.71 V); the average $I_{sc}$ was 8.55 mA/cm² (7.45 to 10.4 mA/cm²); and the average fill factor was 0.49 (0.48 to 0.52). FIG. 15 depicts a graph 1500 showing the current-voltage curve 1502 for the photovoltaic cell formed from the polylinker-nanoparticle solution.

EXAMPLE 4

DSSC Cells Formed Without Polylinker

Figure 16:
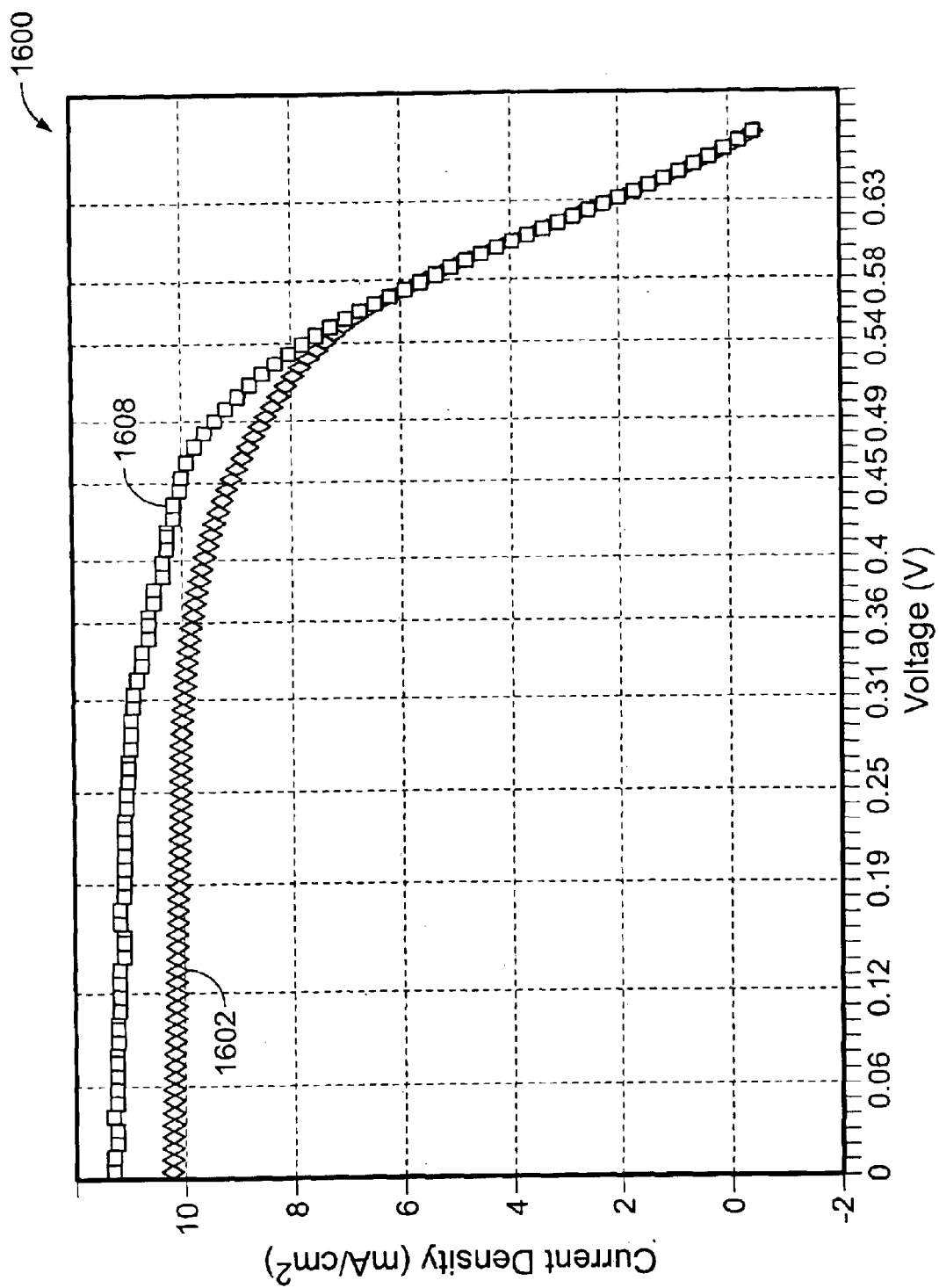
FIG. 16 shows current-voltage curves for two additional exemplary solar cells.

In this illustrative example, an aqueous titanium dioxide suspension (P25) containing about 37.5% solid content was prepared using a microfluidizer and was spin coated on a fluorinated $SnO_2$ conducting electrode (15 Ω/cm²) that was itself coated onto a coated glass slide. The titanium dioxide coated slides were air dried for about 15 minutes and heat treated at 150° C. for 15 minutes. The slides were removed from the oven, cooled to about 80° C., and dipped into $3 \times 10^{-4}$ M N3 dye solution in ethanol for about 1 hour. The sensitized titanium dioxide photoelectrodes were removed from dye solution rinsed with ethanol and dried over a slide warmer at 40° C. The sensitized photoelectrodes were cut into small pieces (0.7cm×0.5–1 cm active area) and sandwiched between platinum coated $SnO_2$:F-transparent conducting glass slides. A liquid electrolyte containing 1 M LiI, 0.05 M iodine, and 1 M t-butyl pyridine in 3-methoxybutyronitdle was applied between the photoelectrode and platinized conducting electrode through capillary action. Thus constructed photocells exhibited an average solar conversion efficiency of about 3.83% at AM 1.5 conditions. The η at AM 1.5 conditions and the photovoltaic characteristics $I_{sc}$, $V_{oc}$, voltage at maximum power output ("$V_m$"), and current at maximum power output ("$I^m$") of these cells are listed in Table 1 under column A. FIG. 16 depicts a graph 1600 showing the current-voltage curve 1602 for the photovoltaic cell formed without the polylinker.

TABLE 2

|  | A Untreated | B 0.1% polymer solution | C 0.4% polymer solution | D 1% polymer solution | E 2% polymer solution |
|---|---|---|---|---|---|
| η(%) | Avg = 3.83 (3.37–4.15) | Avg. = 4.30 (4.15–4.55) | Avg = 4.55 (4.4–4.82) | Avg = 4.15 (3.48–4.46) | Avg = 4.15 (3.7–4.58) |
| $I_{sc}$ (mA/cm2) | Avg = 10.08 (8.88–10.86) | Avg = 10.96 (10.44–11.5) | Avg = 10.60 (9.79–11.12) | Avg = 11.00 (10.7–11.28) | Avg = 11.24 (10.82–11.51) |
| $V_{oc}$ (V) | Avg = 0.65 (0.65–0.66) | Avg = 0.66 (0.6–0.7) | Avg = 0.71 (0.69–0.74) | Avg = 0.7 (0.69–0.71) | Avg = 0.69 (0.68–0.71) |
| $V_m$ (V) | Avg = 0.454 (0.43–0.49) | Avg = 0.46 (0.43–0.477) | Avg = 0.50 (0.47–0.53) | Avg = 0.45 (0.4–0.47) | Avg = 0.44 (0.42–0.46) |
| $I_m$ (mA/cm²) | Avg = 8.4 (7.5–8.96) | Avg = 9.36 (8.75–9.71) | Avg = 9.0 (8.31–9.57)8 | Avg = 9.14 (8.70–9.55) | Avg = 9.28 (8.66–9.97) |

EXAMPLE 5

DSSC Cells Formed with Various Concentrations of Polylinker Solution

In this illustrative example, a P25 suspension containing about 37.5% solid content was prepared using a microfluidizer was spin coated on fluorinated $SnO_2$ conducting electrode (15 Ω/cm2) coated glass slide. The titanium dioxide coated slides were air dried for about 15 minutes and heat treated at 150° C . for 15 minutes. The titanium dioxide coated conducting glass slide were dipped into a polylinker solution including poly(n-butyl titanate) in n-butanol for 5 minutes in order to carry out interconnection (polylinking) of nanoparticles. The polylinker solutions were used were 0.1 wt % poly(n-butyl titanate), 0.4 wt % poly (n-butyl titanate), 1 wt % poly (n-butyl titanate), and 2 wt % poly (n-butyl titanate). After 5 minutes, the slides were removed from the polylinker solution, air dried for about 15 minutes and heat treat in an oven at 150° C. for 15 minutes to remove solvent. The slides were removed from the oven, cooled to about 80° C., and dipped into $3 \times 10^{-4}$ M N3 dye solution in ethanol for about 1 hour. The sensitized titanium dioxide photoelectrodes were removed from dye solution, rinsed with ethanol, and dried over a slide warmer at 40° C. The sensitized photoelectrodes were cut into small pieces (0.7 cm×0.5–1 cm active area) and sandwiched between platinum coated $SnO_2$:F-transparent conducting glass slides. A liquid electrolyte containing 1 M LiI, 0.05 M iodine, and 1 M t-butyl pyridine in 3-methoxybutyronitrile was applied between the photoelectrode and platinized conducting electrode through capillary action. The η at AM 1.5 conditions and the photovoltaic characteristics $I_{sc}$, $V_{oc}$, $V_m$, and $I_m$ of the constructed cells are listed in Table 2 for the 0.1 wt % solution under column B, for the 0.4 wt % solution under column C, for the 1 wt % solution under column D, and for the 2 wt % solution under column E. FIG. 16 depicts the current-voltage curve 1608 for the photovoltaic cell formed with the polylinker.

EXAMPLE 6

Modifier Solutions

In this illustrative example, titanium dioxide coated transparent conducting oxide coated glass slides were prepared by spin coating process as described in Example 5. The titanium oxide coated conducting glass slides were treated with polylinker solution including a 0.01 M poly(n-butyl titanate) solution in n-butanol for 5 minutes to interconnect the nanoparticles. The slides were air dried for about 5 minutes after removing from the polylinker solution. The slides were later dipped into a modifier solution for about 1 minute. The modifier solutions used were 1:1 water/ethanol mixture, 1 M solution of t-butyl pyridine in 1:1 water/ethanol mixture, 0.05 M HCl solution in 1:1 water/ethanol mixture. One of the slides was treated with steam from humidifier for 15 seconds. The slides were air dried for 15 minutes and heat-treated at 150° C. for 15 minutes to remove solvent and then sensitized with a $3 \times 10^{-4}$ M N3 dye solution for 1 hour. The sensitized photoelectrodes were sandwiched between platinized $SnO_2$:F coated glass slides and studied for photovoltaic characteristics using a liquid electrolyte containing 1 M LiI, 0.05 M iodine, and 1 M t-butyl pyridine in 3-methoxybutyronitrile. Acid seems to help in increasing the photoconductivity and efficiency of these photocells. The $\eta$ at AM 1.5 conditions and the photovoltaic characteristics of the cells of this example are listed in Table 3 as follows: slides not dipped into a modifier solution and not treated with polylinker solution (column A); slides not dipped into a modifier, but treated with polylinker solution (column B); slides were first treated with polylinker solution and then dipped in 1:1 water/ethanol mixture (column C); slides were first treated with polylinker solution and then dipped in 1 M solution of t-butyl pyridine in 1:1 water/ethanol mixture (column D); slides were first treated with polylinker solution and then dipped in 0.05 M HCl solution in 1:1 water/ethanol mixture (column E); and slides were first treated with polylinker solution and then treated with steam from humidifier (column F).

an oven. The heat-treated titanium oxide layer was sensitized with N3 dye solution for 1 hour, washed with ethanol, and warmed on a slide warmer at 40° C. for 10 minutes. The sensitized photoelectrodes were cut into 0.7 cm×0.8 cm active area photocells and were sandwiched between platinized conducting electrodes. A liquid electrolyte containing 1 M LiI, 0.05 M iodine, and 1 M t-butyl pyridine in 3-methoxybutyronitrile was applied between the photoelectrode and platinized conducting electrode through capillary action. The photocells exhibited an average $\eta$ of 3.88% (3.83, 3.9 and 3.92), an average $V_{oc}$ of 0.73 V (0.73, 0.74 and 0.73 V), and an average $I_{sc}$ of 9.6 mA/cm² (9.88, 9.65 and 9.26), all at AM 1.5 conditions.

EXAMPLE 8

Post-Interconnection Heating to 70° C.

In this illustrative example, a titanium-dioxide-coated, transparent-conducting-oxide-coated glass slide was prepared by a spin coating process as described in Example 5. The slide was dipped into 0.01 M poly(n-butyl titanate) in n-butanol for 30 seconds and was air dried for 15 minutes. The slide was later heated treated at 70° C. for 10 minutes in an oven. The heat-treated titanium oxide layer was sensitized with N3 dye solution for 1 hour, washed with ethanol, and warmed on a slide at 40° C. for 10 minutes. The sensitized photoelectrodes were cut into 0.7 cm×0.7 cm active area photocells and were sandwiched between platinized conducting electrodes. A liquid electrolyte containing 1 M LiI, 0.05 M iodine, and 1 M t-butyl pyridine in 3-methoxybutyronitrile was applied between the photoelectrode and platinized conducting electrode through capillary action. The photocells exhibited an average $\eta$ of 3.62% (3.55, 3.73 and 3.57), an average $V_{oc}$ of 0.75 V (0.74, 0.74 and 0.76 V), and average $I_{sc}$ of 7.96 mA/cm2 (7.69, 8.22 and 7.97), all at AM 1.5 conditions.

EXAMPLE 9

Formation on a Flexible, Transparent Substrate

In this illustrative example, a PET substrate about 200 μm thick and about 5 inches by 8 feet square was coated with

TABLE 3

| | A Untreated | B Treated with 0.01 M TiBut | C Treated with 1:1 EtOH/H$_2$O | D Treated with 1 M t-BuPy/1:1 EtOH/H$_2$O | E Treated with 05 M HCl/1:1 EtOH/H$_2$O | F Steam from Humidifier for 15 sec. |
|---|---|---|---|---|---|---|
| $\eta$(%) | Avg = 3.92 (3.75–4.15) | Avg = 4.41 (4.12–4.74) | Avg = 4.11 (4.06–4.15) | Avg = 4.34 (4.27–4.38) | Avg = 4.67 (4.61–4.73) | Avg = 4.41 (4.38–4.45) |
| $V_{oc}$ (V) | Avg = 0.66 (0.66–0.67) | Avg = 0.66 (0.65–0.66) | Avg = 0.65 (0.64–0.65) | Avg = 0.65 (0.64–0.66) | Avg = 0.66 (0.65–0.66) | Avg = 0.66 (0.66–0.67) |
| $I_{sc}$ (mA/cm²) | Avg = 9.97 (9.48–10.56) | Avg = 12.57 (11.7–13.22) | Avg = 11.85 (11.21–12.49) | Avg = 11.85 (11.21–12.49) | Avg = 12.51 (12.15–12.87) | Avg = 11.63 (11.25–12.01) |
| $V_m$ (V) | Avg = 0.46 (0.46–0.48) | Avg = 0.434 (0.4–0.457) | Avg = 0.44 (0.43–0.45) | Avg = 0.45 (0.44–0.456) | Avg = 0.457–0.453–0.46 | Avg = 0.45 (0.44–0.46) |
| $I_m$ (mA/cm²) | Avg = 8.36 (7.85–8.89) | Avg = 10.08 (9.57–10.37) | Avg = 9.27 (9.01–9.53) | Avg = 9.52 (9.22–9.75) | Avg = 10.23 (10.17–10.29) | Avg = 9.67 (9.38–9.96) |

EXAMPLE 7

Post-Interconnection Heating to 150° C.

In this illustrative example, a titanium-dioxide-coated, transparent-conducting-oxide-coated glass slide was prepared by a spin coated process as described in Example 5. The slide was dipped into 0.01 M poly(n-butyl titanate) in n-butanol for 30 seconds and was air-dried for 15 minutes. The slide was later heat treated at 150° C. for 10 minutes in ITO and loaded onto a loop coater. An 18.0 mL suspension of titanium dioxide (P25 with 25% solid content) in n-butanol and 0.5 g of poly(n-butyl titanate) in 10 mL of n-butanol were in-line blended and coated onto the ITO coated PET sheet. After deposition, the coating was heated at about 50° C. for about 1 minute. The interconnected nanoparticle layer was then dye-sensitized by coating with a $3 \times 10^{-4}$ M solution of N3 dye in ethanol.

C. Semiconductor Oxide Formulations

In a further illustrative embodiment, the invention provides semiconductor oxide formulations for use with DSSCs of the present invention formed using a low temperature nanoparticle interconnection, as described herein. The semiconductor oxide formulations may be coated at room temperature and, upon drying at temperatures between about 50° C. and about 150° C., yield mechanically stable semiconductor nanoparticle films with good adhesion, for example, to electrodes (including mesh electrode and catalytic media coated mesh electrodes) and transparent conducting oxide (TCO) coated plastic substrates. In one embodiment, the nanoparticle semiconductor of a photosensitized interconnected nanoparticle material is formed from a dispersion of commercially available $TiO_2$ nanoparticles in water, a polymer binder, and with or without acetic acid. Suitable polymer binders include, but are not limited to, polyvinylpyrrolidone (PVP), polyethylene oxide (PEO), hydroxyethyl cellulose (HOEC), hydroxypropyl cellulose, polyvinyl (PVA) and other water-soluble polymers. The ratio of semiconductor oxide particles (e.g., $TiO_2$) to polymer can be between about 100:0.1 to 100:20 by weight, and preferably is between about 100:1 to 100:10 by weight. The presence of acetic acid in the formulation helps to improve the adhesion of the coating to, for example, a TCO coated substrate. However, acetic acid is not essential to this aspect of the invention and semiconductor oxide dispersions without acetic acid perform satisfactory. In another embodiment, the $TiO_2$ nanoparticles are dispersed in an organic solvent, such as, e.g., isopropyl alcohol, with polymeric binders such as, e.g., PVP, butvar, ethylcellulose, etc.

In another illustrative embodiment, the mechanical integrity of the semiconductor oxide coatings and the photovoltaic performance of the dye sensitized cells based on these coatings can be further improved by using a crosslinking agent to interconnect the semiconductor nanoparticles. The polylinkers described herein may be used for this purpose. These crosslinking agents can be applied, e.g., in the titania coating formulation directly or in a step subsequent to drying the titania coating as a solution in an organic solvent such as ethanol, isopropanol or butanol. For example, subsequent heating of the films to temperatures in the range of about 70° C. to about 140° C. leads to the formation of $TiO_2$ bridges between $TiO_2$ nanoparticles. Preferably, the concentration of the polylinker in this example ranges from about 0.01 to about 20 weight % based on titania.

D. Semiconductor Primer Layer Coatings

Figure 17:
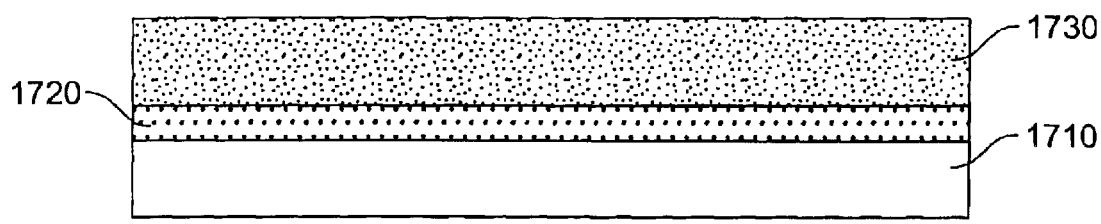
FIG. 17 depicts an illustrative embodiment of the coating of a semiconductor primer layer coating, according to the invention.

In another illustrative embodiment, the invention provides semiconductor oxide materials and methods of coating semiconductor oxide nanoparticle layers on a base material to form DSSCs. FIG. 17 depicts an illustrative embodiment 1700 of a coating process in accordance with various embodiments of the invention. In one illustrative embodiment, a base material 1710 is coated with a first primer layer 1720 of a semiconductor oxide, and then a suspension of nanoparticles 1730 of the semiconductor oxide is coated over the primer layer 1720. Numerous semiconducting metal oxides, include $SnO_2$, $TiO_2$, $Ta_2O_5$, $Nb_2O_5$, and ZnO, among others in the form of thin films, fine particles, or precursor solutions may be used as primer layer coatings using vacuum coating, spin coating, blade coating or other coating methods.

In one embodiment, the primer layer 1720 includes a vacuum-coated semiconductor oxide film (e.g., a $TiO_2$ film). In another embodiment, the primer layer 1720 includes a thin coating with fine particles of a semiconductor oxide (e.g. $TiO_2$, $SnO_2$). The primer layer 1720 may also include a thin layer of a polylinker or precursor solution, one example of which is the Ti (IV) butoxide polymer 1100 shown in FIG. 11. According to one illustrative embodiment of the invention, the base material 1710 is a flexible, significantly light transmitting substrate; for example, such as found in some embodiments of the photovoltaic cells of FIGS. 1A–1B, 2A–2B, 3A–3D and 4–6. The base material 1710 may also be a transparent, conducting, plastic substrate. According to one illustrative embodiment, the suspension of nanoparticles 1730 is a photosensitized interconnected nanoparticle material.

The primer layer 1720 improves the adhesion of nano-structured semiconductor oxide films (like, for example, layer 1730) to the base material 1710. Enhancements in the performance of DSSCs with such primer layers have been observed and will be described below. The enhancement arises from an increase in the adhesion between the semiconductor oxide nanoparticles (or photoelectrodes) and the transparent conducting oxide coated plastic substrates, as well as from higher shunt resistance.

Examples of various illustrative embodiments of this aspect of the invention, in the context of a DSSC including a titanium dioxide nanoparticle layer, are as follows.

EXAMPLE 10

Vacuum Coated $TiO_2$ as Primer Layers for Nanoparticle $TiO_2$ Photoelectrodes

In this illustrative example, thin $TiO_2$ films with thicknesses ranging from 2.5 nm to 100 nm were sputter-coated under vacuum on an ITO layer coated on a polyester (here, PET) substrate. A water based $TiO_2$ (P25, with an average particle size of 210 nm) slurry was spin-coated on both the ITO/PET with sputter-coated thin $TiO_2$ and on the plain ITO/PET (i.e., the portion without sputter-coated thin $TiO_2$). The coated films were soaked in poly $[Ti(OBU)_4]$ solution in butanol and then heat treated at 120° C. for 2 minutes. The low-temperature reactively interconnected films were placed into an aprotic, polar solvent-based N3 dye solution (8 mM) for 2 minutes. Photovoltaic cells were made with platinum (PT) counter-electrodes, an $I/I_3$ liquid electrolyte, 2 mil SURLYN, and copper conducting tapes. I–V characterization measurements were performed with a solar simulator.

Adhesion of nanostructured $TiO_2$ as compared to those on the plain ITO/PET. Improvement on the fill-factor was achieved as well. A FF as high as 0.67 was measured for the photovoltaic cells made on the ITO/PETs with sputter-coated, thin $TiO_2$. For the photovoltaic cells made on the plain ITO/PET, the FF observed was not greater than 0.60. Higher photovoltaic conversion efficiencies (about 17% higher than the photoelectrodes made from the plain ITO/PET) were measured for the photoelectrodes prepared on the ITO/PET with thin sputter-coated $TiO_2$. Improvement in shunt resistance was also observed for the photovoltaic cells made on the ITO/PET with this sputter-coated $TiO_2$.

EXAMPLE 11

Fine Particles of $TiO_2$ as Primer Layer for $TiO_2$ Suspension

In this illustrative example, fine particles of $TiO_2$, small enough such that they would stick in the valleys between spikes of ITO on the PET substrate, were prepared by hydrolyzing titanium (IV) isopropoxide. The fine particles were then spin coated at 800 rpm onto the ITO layer. A 37% $TiO_2$ (P25) suspension of approximately 21 nm average particle size was then spin coated at 800 rpm onto the fine particle layer. The coated $TiO_2$ was low temperature interconnected by dipping in 0.01 molar Ti (IV) butoxide polymer in butanol for 15 minutes followed drying on a slide warmer at 50° C. before heating at 120° C. for 2 minutes. The interconnected coating was dyed with N3 dye by dipping into an 8 mM aprotic polar solvent solution for 2 minutes, then rinsed with ethanol and dried on a slide warmer at 50° C. for 2 minutes. Control coatings were prepared in the same way, except without the fine particle prime coat. The cells' performance characteristics were measure using a solar simulator. Results for test and control are listed below in Table 4. Fine particles of tin oxide as primer coating for $TiO_2$ suspensions yielded similar improvements.

TABLE 4

|  | Voc | Isc | η | FF |
|---|---|---|---|---|
| Control | 0.64 | 4.86 | 1.67% | 0.54 |
| Invention | 0.66 | 6.27 | 2.36% | 0.57 |

EXAMPLE 12

Titanium (IV) Butoxide Polymer in Butanol (Precursor Solution) as Primer Layer for $TiO_2$ In another test, titanium (IV) butoxide polymer in butanol at 0.01 molar was spin coated on an ITO/PET plastic base at 800 rpm. A 43% $TiO_2$ (P25) suspension of approximately 21 nm average particle size was spin coated at 800 rpm. The coated $TiO_2$ was interconnected at low temperature by dipping in 0.01 M titanium (IV) butoxide polymer in butanol for 15 minutes and then drying on a slide warmer at 50° C. before heating at 120° C. for 2 minutes. The sintered coating was dyed with N3 dye by dipping into an 8 mM aprotic, polar solvent solution for 2 minutes, then rinsed with ethanol and dried on a slide warmer at 50° C. for 2 minutes. Control coatings were prepared in the same way only without the primer layer coating. The I–V properties of the cells were measured with a solar simulator. Results for test and control are listed below in Table 5.

TABLE 5

|  | Voc | Isc | η | FF |
|---|---|---|---|---|
| Control | 0.66 | 7.17 | 2.62% | 0.56 |
| Invention | 0.70 | 8.11 | 3.38% | 0.59 |

E. Photosensitizing Agents: Co-Sensitizers

According to one illustrative embodiment, the photosensitizing agent described above includes a first sensitizing dye and second electron donor species, the "co-sensitizer." The first sensitizing dye and the co-sensitizer may be added together or separately to form a photosensitized interconnected nanoparticle material. The sensitizing dye facilitates conversion of incident visible light into electricity to produce the desired photovoltaic effect. In one illustrative embodiment, the co-sensitizer donates electrons to an acceptor to form stable cation radicals, which improves the efficiency of charge transfer from the sensitizing dye to the semiconductor oxide nanoparticle material and reduces back electron transfer to the sensitizing dye or co-sensitizer. The co-sensitizer preferably includes: (1) conjugation of the free electron-pair on a nitrogen atom with the hybridized orbitals of the aromatic rings to which the nitrogen atom is bonded and, subsequent to electron transfer, the resulting resonance stabilization of the cation radicals by these hybridized orbitals; and (2) a coordinating group, such as a carboxy or a phosphate, the function of which is to anchor the co-sensitizer to the semiconductor oxide. Examples of suitable co-sensitizers include, but are not limited to, aromatic amines (e.g., such as triphenylamine and its derivatives), carbazoles, other fused-ring analogues.

The co-sensitizer is electronically coupled to a conduction band of the photosensitized interconnected nanoparticle material. Suitable coordinating groups include, but are not limited to, carboxylate groups, phosphates groups, or chelating groups, such as, for example, oximes or alpha keto enolates.

Tables 6–12 below present results showing the increase in photovoltaic cell efficiency when co-sensitizers are co-absorbed along with sensitizing dyes on the surface of high temperature sintered or low temperature interconnected titania. In Tables 6–12, characterization was conducted using AM 1.5 solar simulator conditions (i.e., irradiation with light having an intensity of 1000W/m$^2$). A liquid electrolyte including 1 m LiI, 1 M t-butylpyridine, 0.5 M $I_2$ in 3-methxypropanitrile was employed. The data shawn in the tables indicates an enhancement of one or more operating cell parameters for both low-temperature-interconnected (Tables 9, 11 and 12) and high-temperature-sintered (Tables 6, 7, 8 and 10) titania nanoparticles. The solar cells characteristics listed include η, $V_{oc}$, $I_{sc}$, FF, $V_m$ and $I_m$. The ratios of sensitizer to co-sensitizer are based on the concentrations of photosensitizing agents in the sensitizing solution.

In particular, it was discovered that aromatic amines enhance cell performance of sensitized titania solar cells if the concentration of the co-sensitizer is below about 50% mol of the dye concentration. An example of the general molecular structure of the preferred aromatic amines is shown in FIGS. 18 and 19. Preferably, the concentration of the co-sensitizer is in the range of about 1 mol % to about 20 mol %, and more preferably in the range of about 1 mol % to about 5 mol %.

Figure 18A:
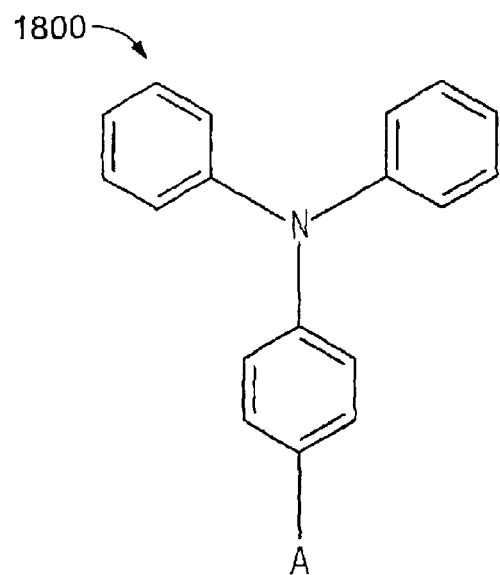
FIGS. 18A–18C depict chemical structures for exemplary co-sensitizers, in accordance with the invention.
Figure 18B:
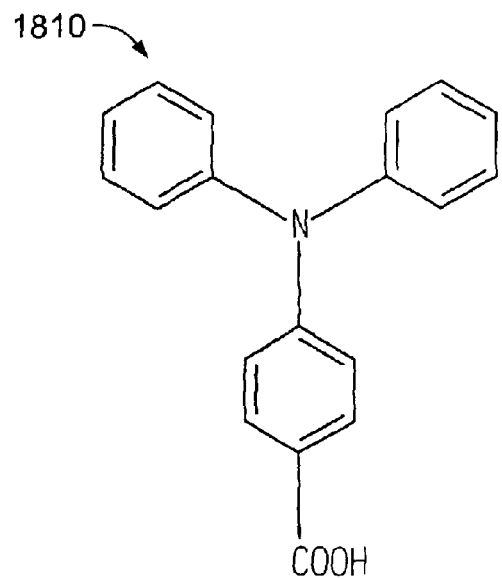
Figure 18C:
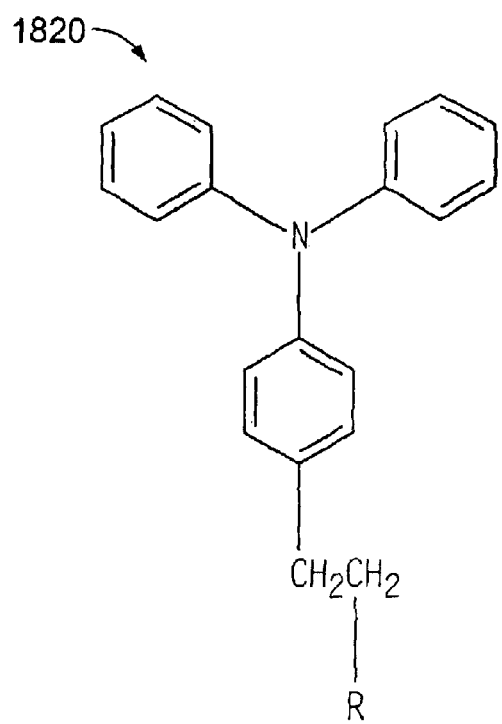

FIG. 18A depicts a chemical structure 1800 that may serve as a co-sensitizer. The molecule 1800 adsorbs to the surface of a nanoparticle layer via its coordinating group or chelating group, A. A may be a carboxylic acid group or derivative thereof, a phosphate group, an oxime or an alpha ketoenolate, as described above. FIG. 18B depicts a specific embodiment 1810 of the structure 1800, namely DPABA (diphenylaminobenzoic acid), where A=COON. FIG. 13C depicts another specific amine 1820 referred to as DEAPA (N',N-diphenylaminophenylpropionic acid), with A as the carboxy derivative COON.

Figure 19A:
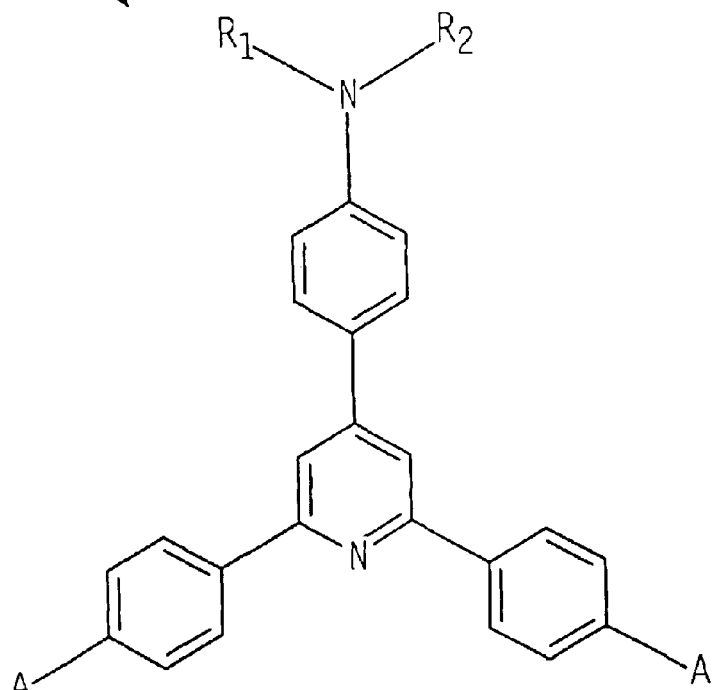
FIGS. 19A–19B depict additional exemplary chemical structures of co-sensitizers, in accordance with the invention.
Figure 19B:
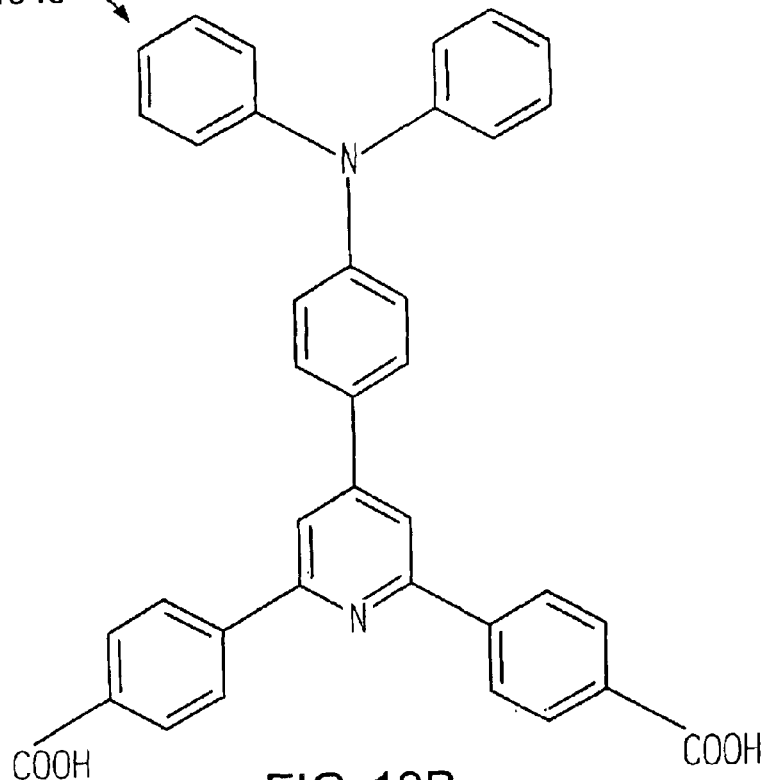

FIG. 19A shows a chemical structure 1930 that may serve as either a co-sensitizer, or a sensitizing dye. The molecule does not absorb radiation above 500 nm, and adsorbs to a surface of the nanoparticle layer via its coordinating or chelatine groups, A. A may be a carboxylic acid group or derivative thereof, a phosphate group, an oxime or an alpha ketoenolate. $R_1$ and $R_2$ may each be a phenyl, alkyl, substituted phenyl, or benzyl group. Preferably, the alkyl may contain between 1 and 10 carbons. FIG. 19B depicts a specific embodiment 1940 of the structure 1930, namely DPACA (2,6 bis (4-bezoicacid)-4-(4-N,N-diphenylamino) phenylpyridine carboxylic acid), where $R_1$ and $R_2$ are phenyl and A is COOH.

DPACA may be synthesized as follows. 1.49 g (9.08 mmol) of 4-acetylbenzoic acid, 1.69 g (6.18 mmol) of 4-N,N-diphenylbenzaldehyde, and 5.8 g (75.2 mmol) of ammonium acetate were added to 60 ml of acetic acid in a 100 ml round bottom flask equipped with a condenser and stirring bar. The solution was heated to reflux with stirring under nitrogen for 5 hours. The reaction was cooled to room temperature and poured into 150 ml of water, which was extracted with 150 ml of dichloromethane. The dichloromethane was separated and evaporated with a rotary evaporator, resulting in a yellow oil. The oil was then eluted on a silica gel column with 4% methanol/dichloromethane to give the product, an orange solid. The solid was washed with methanol and vacuum dried to give 0.920 g of 2,6 bis (4-venzoicacid)-4-(-4N,N-diphenylamino)phenylpyridine (DPACA). The melting point was 199°–200° C., the $\lambda_{max}$ was 421 nm, and the molar extinction coefficient, E was 39,200 L mole$^{-1}$ cm$^{-1}$. The structure was confirmed by NMR spectroscopy.

Figure 20:
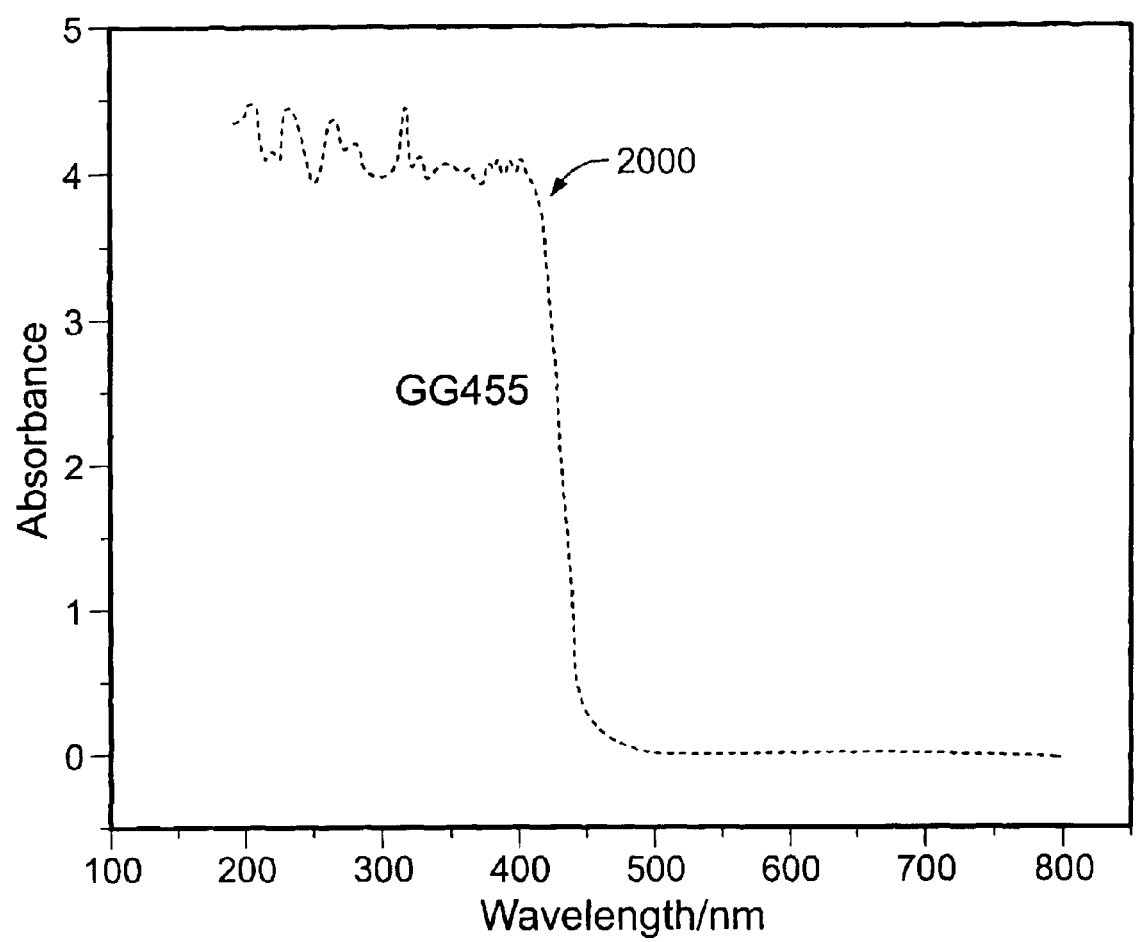
FIG. 20 shows a graph of the absorbance of the 455 nm cut-off filter (GC455) used to characterize photovoltaic cells.

Table 6 shows the results for high-temperature-sintered titania; photosensitized by overnight soaking in solutions of 1 nM N3 dye and three concentrations of DPABA. Table 6 also shows that the average η is greatest for the preferred 20/1 (dye/co-sensitizer) ratio.

present is not simply due to adsorption of UV light by DPABA followed by charge injection. FIG. 20 shows a plot 2000 of the absorbance versus wavelength for cut-off filter used to characterize the photovoltaic cells, according to an illustrative embodiment of the

TABLE 6

I–V CHARACTERIZATION

| General conditions | Conditions | Cell area cm$^2$ | $V_{oc}$ V | $I_m$ mA/cm$^2$ | $V_m$ V | $I_{sc}$ mA/cm$^2$ | FF | η % | σ |
|---|---|---|---|---|---|---|---|---|---|
| Adsorption Temp. RT ° C. | 1 mM N3/EtOH, Overnight | 0.44 | 0.62 | 6.69 | 0.44 | 8.38 | 0.56 | 2.91 | |
| | | 0.52 | 0.64 | 6.81 | 0.43 | 8.59 | 0.54 | 2.94 | |
| Solvent of Dye EtOH | CONTROL | 0.54 | 0.63 | 6.95 | 0.41 | 8.72 | 0.52 | 2.84 | |
| | Average | 0.50 | 6.63 | 6.82 | 0.43 | 8.56 | 0.54 | 2.90 | 0.05 |
| Dye Concen. N3, DPABA | 1 mM N3, 0.05 mM DPABA in EtOH for Overnight; 20/1 | 0.50 | 0.64 | 7.70 | 0.45 | 9.31 | 0.54 | 3.43 | |
| | | 0.53 | 0.64 | 7.40 | 0.45 | 9.30 | 0.56 | 3.31 | |
| Sintering Temp 450° C., 30 minutes | | 0.50 | 0.64 | 7.70 | 0.45 | 9.38 | 0.57 | 3.44 | |
| | Average | 0.51 | 0.64 | 7.60 | 0.45 | 9.33 | 0.57 | 3.39 | 0.07 |
| Thickness of Film TiO2~10 μm | 1 mM N3, 1 mM DPABA in EtOH for Overnight; 1/1 | 0.53 | 0.63 | 7.21 | 0.41 | 8.58 | 0.55 | 2.96 | |
| | | 0.50 | 0.63 | 6.75 | 0.44 | 8.23 | 0.57 | 2.97 | |
| | | 0.42 | 0.63 | 7.11 | 0.44 | 8.67 | 0.57 | 3.13 | |
| | Average | 0.48 | 0.63 | 7.02 | 0.43 | 8.49 | 0.56 | 3.02 | 0.10 |
| Electrolyte | 1 mM N3, 10 mM DPABA in EtOH for Overnight; 1/1 | 0.33 | 0.58 | 4.95 | 0.42 | 6.02 | 0.60 | 2.08 | |
| | | 0.52 | 0.60 | 5.51 | 0.42 | 6.67 | 0.58 | 2.31 | |
| AM 1.5 D, 1 Sun | | 0.49 | 0.60 | 5.53 | 0.42 | 6.72 | 0.58 | 2.32 | |
| Film pretreatment | Average | 0.45 | 0.59 | 5.33 | 0.42 | 6.47 | 0.58 | 2.24 | 0.14 |

Figure 21:
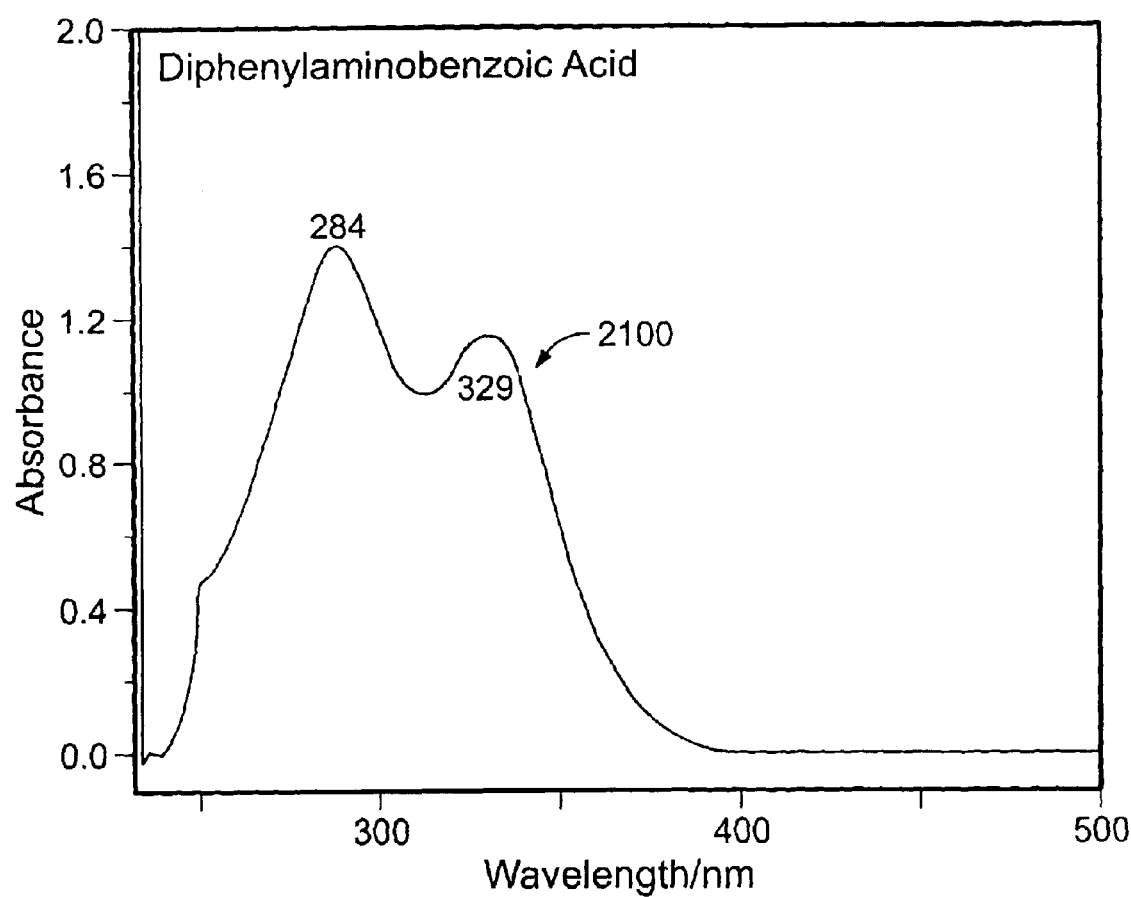
FIG. 21. shows a graph of the absorbance of diphenylaminobenzoic acid.

Table 7 shows the results of using a cut-off filter (third and fourth entries) while irradiating the cell to test its I–V characteristics. Table 7 also shows that the efficiency of the cell still improves when DPABA is present, indicating that its effect when no filter is present is not simply due to adsorption of UV light by DPABA followed by charge injection. FIG. 20 shows a plot 2000 of the absorbance versus wavelength for cut-off filter used to characterize the photovoltaic cells, according to an illustrative embodiment of the invention. FIG. 21 shows a plot of 2100 of the absorbance versus wavelength for DPABA, which absorbs below 400 nm. Because the absorbance of the cut-off is large, little light reaches the absorption bands of DPABA.

TABLE 7

I–V CHARACTERIZATION

| Conditions | Cell area cm$^2$ | $V_{oc}$ V | $I_m$ mA/cm$^2$ | $V_m$ V | $I_{sc}$ mA/cm$^2$ | FF | η % | σ | |
|---|---|---|---|---|---|---|---|---|---|
| 1 mM N3 in EtOH, Overnight Control | 0.49 | 0.70 | 8.62 | 0.46 | 11.02 | 0.51 | 3.97 | | |
| | 0.49 | 0.70 | 8.13 | 0.45 | 10.20 | 0.51 | 3.66 | | |
| | 0.49 | 0.73 | 7.93 | 0.51 | 9.69 | 0.57 | 4.04 | | |
| Average | 0.49 | 0.71 | 8.23 | 0.47 | 10.30 | 0.53 | 3.89 | 0.20 | |
| 1 mM N3 0.05 mM DPABA in EtOH, 20/1 Overnight | 0.49 | 0.71 | 9.05 | 0.46 | 11.53 | 0.51 | 4.16 | | |
| | 0.49 | 0.71 | 9.24 | 0.46 | 11.56 | 0.52 | 4.25 | | |
| | 0.49 | 0.71 | 9.39 | 0.46 | 11.50 | 0.53 | 4.32 | | |
| Average | 0.49 | 0.71 | 9.23 | 0.46 | 11.53 | 0.52 | 4.24 | 0.08 | |
| 1 mM N3 in EtOH Overnight Control | 0.49 | 0.69 | 6.35 | 0.47 | 7.83 | 0.55 | 4.26 | 455 nm cut off filter used, 70 mW/cm$^2$ | |
| | 0.49 | 0.69 | 6.05 | 0.46 | 7.44 | 0.54 | 3.98 | | |
| | 0.49 | 0.72 | 5.74 | 0.52 | 6.94 | 0.60 | 4.27 | | |
| Average | 0.49 | 0.70 | 6.05 | 0.48 | 7.40 | 0.56 | 4.17 | 0.17 | |
| 1 mM N3 | 0.49 | 0.70 | 6.73 | 0.47 | 8.21 | 0.55 | 4.52 | 455 nm | |

TABLE 7-continued

| Conditions | Cell area cm$^2$ | $V_{oc}$ V | $I_m$ mA/cm$^2$ | $V_m$ V | $I_{sc}$ mA/cm$^2$ | FF | $\eta$ % | $\sigma$ |
|---|---|---|---|---|---|---|---|---|
| 0.05 mM DPABA in EtOH, 20/1 Overnight | 0.49 | 0.70 | 6.74 | 0.47 | 8.19 | 0.55 | 4.53 | cut off filter used, 70 mW/cm$^2$ |
| | 0.49 | 0.70 | 6.74 | 0.49 | 8.25 | 0.57 | 4.72 | |
| Average | 0.49 | 0.70 | 6.74 | 0.48 | 8.22 | 0.56 | 4.59 | 0.11 |

Table 8 shows that the addition of triphenylamine itself (i.e., no titania complexing groups such as carboxy) does not significantly enhance efficiency under the stated conditions.

TABLE 8

| Conditions | Cell area cm$^2$ | $V_{oc}$ V | $I_m$ mA/cm$^2$ | $V_m$ V | $I_{sc}$ mA/cm$^2$ | FF | $\eta$ % | $\sigma$ |
|---|---|---|---|---|---|---|---|---|
| 0.5 mM N3 in EtOH, Overnight | 0.49 | 0.70 | 7.96 | 0.45 | 9.82 | 0.52 | 3.58 | |
| | 0.49 | 0.71 | 8.09 | 0.48 | 9.58 | 0.57 | 3.88 | |
| | 0.49 | 0.70 | 7.47 | 0.48 | 8.83 | 0.58 | 3.59 | |
| Average | 0.49 | 0.70 | 7.84 | 0.47 | 9.41 | 0.56 | 3.68 | 0.17 |
| 0.5 mM N3, 0.025 mM TPA in EtOH Overnight 20/1 | 0.49 | 0.69 | 7.44 | 0.45 | 9.21 | 0.53 | 3.35 | |
| | 0.49 | 0.69 | 7.61 | 0.47 | 9.75 | 0.53 | 3.58 | |
| | 0.49 | 0.69 | 6.98 | 0.45 | 8.56 | 0.53 | 3.14 | |
| Average | 0.49 | 0.69 | 7.34 | 0.46 | 9.17 | 0.53 | 3.36 | 0.22 |
| 0.5 mM N3, 2.0 mM TPA in EtOH Overnight 1/4 | 0.49 | 0.68 | 4.62 | 0.44 | 5.66 | 0.53 | 2.03 | |
| | 0.49 | 0.66 | 4.18 | 0.45 | 5.38 | 0.53 | 1.88 | |
| | 0.49 | 0.66 | 4.51 | 0.45 | 5.82 | 0.53 | 2.03 | |
| Average | 0.49 | 0.67 | 4.44 | 0.45 | 5.62 | 0.53 | 1.98 | 0.09 |

Table 9 shows that the effect is present using low temperature interconnected titania and that the 20/1 (dye/co-sensitizer) ratio is preferred.

TABLE 9

| Conditions | Cell area cm$^2$ | $V_{oc}$ V | $I_m$ mA/cm$^2$ | $V_m$ V | $I_{sc}$ mA/cm$^2$ | FF | $\eta$ % | $\sigma$ |
|---|---|---|---|---|---|---|---|---|
| 0.5 mM N3/EtOH, overnight, control | 0.49 | 0.73 | 8.32 | 0.50 | 10.56 | 0.54 | 4.16 | |
| | 0.51 | 0.72 | 8.13 | 0.49 | 10.30 | 0.54 | 3.98 | |
| | 0.50 | 0.72 | 8.56 | 0.57 | 10.65 | 0.52 | 4.02 | |
| Average | 0.50 | 0.72 | 8.34 | 0.49 | 10.50 | 0.53 | 4.06 | 0.09 |
| 0.5 mM N3, 0.0125 mM DPABA in EtOH, 40/1, overnight | 0.49 | 0.73 | 8.55 | 0.51 | 10.48 | 0.57 | 4.36 | |
| | 0.53 | 0.72 | 8.53 | 0.50 | 11.00 | 0.54 | 4.27 | |
| | 0.49 | 0.74 | 8.08 | 0.54 | 10.96 | 0.54 | 4.36 | |
| Average | 0.50 | 0.73 | 8.39 | 0.52 | 10.81 | 0.55 | 4.33 | 0.06 |
| 0.5 mM N3, 0.017 mM DPABA in EtOH, 30/1, overnight | 0.49 | 0.73 | 9.07 | 0.49 | 11.31 | 0.54 | 4.44 | |
| | 0.49 | 0.75 | 8.64 | 0.52 | 10.97 | 0.55 | 4.49 | |
| | 0.52 | 0.73 | 8.19 | 0.52 | 10.88 | 0.54 | 4.26 | |
| Average | 0.50 | 0.74 | 8.63 | 0.51 | 11.05 | 0.54 | 4.40 | 0.12 |
| 0.5 mM N3, 0.025 mM DPABA in EtOH, 20/1, overnight | 0.50 | 0.75 | 8.57 | 0.52 | 11.56 | 0.51 | 4.46 | |
| | 0.49 | 0.74 | 8.88 | 0.52 | 11.45 | 0.54 | 4.62 | |
| | 0.53 | 0.74 | 9.01 | 0.51 | 12.08 | 0.51 | 4.60 | |
| Average | 0.51 | 0.74 | 8.82 | 0.52 | 11.70 | 0.52 | 4.56 | 0.09 |
| 0.5 mM N3, 0.5 mM DPABA in EtOH, 1/1, overnight | 0.49 | 0.72 | 8.85 | 0.48 | 10.78 | 0.55 | 4.25 | |
| | 0.51 | 0.74 | 8.62 | 0.47 | 10.37 | 0.53 | 4.05 | |
| | 0.50 | 0.75 | 8.38 | 0.49 | 10.02 | 0.55 | 4.11 | |
| Average | 0.50 | 0.74 | 8.62 | 0.48 | 10.39 | 0.54 | 4.14 | 0.10 |
| 0.5 mM N3, | 0.49 | 0.68 | 7.56 | 0.44 | 9.09 | 0.54 | 3.33 | |

TABLE 9-continued

| | | | I–V CHARACTERIZATION | | | | | |
|---|---|---|---|---|---|---|---|---|
| Conditions | Cell area cm$^2$ | $V_{oc}$ V | $I_m$ mA/cm$^2$ | $V_m$ V | $I_{sc}$ mA/cm$^2$ | FF | η % | σ |
| 0.5 mM DPABA in EtOH, 1/10, overnight | 0.51 | 0.69 | 7.62 | 0.46 | 9.34 | 0.54 | 3.51 | |
| | 0.49 | 0.67 | 7.25 | 0.45 | 8.84 | 0.55 | 3.26 | |
| Average | 0.50 | 0.68 | 7.48 | 0.45 | 9.09 | 0.54 | 3.36 | 0.13 |

Table 10 shows results for high-temperature-sintered tatania sensitized with a high concentration of N3 dye while maintaining a 20/1 ration of dye to co-sensitizer. Entries 1 and 2 show the increase in cell performance due to co-sensitizer. Entry 3 shows the effect of DPABA alone as a sensitizer, demonstrating that this material acts as a sensitizer by itself when irradiated with the full solar spectrum, which includes low-intensity UV radiation.

TABLE 10

| | | I–V CHARACTERIZATION | | | | | | | |
|---|---|---|---|---|---|---|---|---|---|
| General conditions | Conditions | Cell area cm$^2$ | $V_{oc}$ V | $I_m$ mA/cm$^2$ | $V_m$ V | $I_{sc}$ mA/cm$^2$ | FF | η % | σ |
| Adsorption Temp. RT ° C. Solvent of Dye Aprotic polar solvent | 8 mM N3/aprotic, polar solvent, 1 hour CONTROL | 0.49 | 0.68 | 8.51 | 0.44 | 10.07 | 0.55 | 3.74 | |
| | | 0.49 | 0.67 | 8028 | 0.44 | 9.75 | 0.56 | 3.64 | |
| | | 0.49 | 0.68 | 9.16 | 0.42 | 10.80 | 0.52 | 3.85 | |
| | average | 0.49 | 0.68 | 8.65 | 0.43 | 10.21 | 0.54 | 3.74 | 0.10 |
| | 8 mM N3, 0.4 mM DPABA in aprotic polar solvent, 20/1 1 hour | 0.49 | 0.68 | 9.52 | 0.44 | 11.18 | 0.55 | 4.19 | |
| | | 0.49 | 0.68 | 9.96 | 0.44 | 11.59 | 0.56 | 4.38 | |
| | | 0.49 | 0.65 | 9.81 | 0.42 | 12.13 | 0.52 | 4.12 | |
| | average | 0.49 | 0.67 | 9.76 | 0.43 | 11.63 | 0.54 | 4.23 | 0.14 |
| | 5 mM DPABA in aprotic polar Overnight | 0.49 | 0.55 | 1.02 | 0.42 | 1.22 | 0.64 | 0.43 | |
| | | 0.49 | 0.55 | 0.94 | 0.471 | 1.13 | 0.62 | 0.39 | |
| | | 0.49 | 0.58 | 0.89 | 0.44 | 1.07 | 0.63 | 0.39 | |
| | | 0.49 | 0.56 | 0.95 | 0.42 | 1.14 | 0.63 | 0.40 | 0.02 |

Table 11 shows results for low-temperature-interconnected titania. Entry 5 shows the affect of DPACA alone as a sensitizer, demonstrating that this material acts as a sensitizer by itself when irradiated with the full solar spectrum, which includes low-intensity UV radiation.

TABLE 11

| | I–V CHARACTERIZATION | | | | | | | |
|---|---|---|---|---|---|---|---|---|
| Conditions | Cell area cm$^2$ | $V_{oc}$ V | $I_m$ mA/cm$^2$ | $V_m$ V | $I_{sc}$ mA/cm$^2$ | FF | η % | σ |
| 0.5 mM N3/EtOH, overnight, control | 0.51 | 0.73 | 8.40 | 0.50 | 10.84 | 0.53 | 4.20 | |
| | 0.53 | 0.72 | 8.13 | 0.49 | 10.30 | 0.54 | 3.98 | |
| | 0.50 | 0.72 | 8.77 | 0.47 | 10.87 | 0.53 | 4.12 | |
| average | 0.51 | 0.72 | 8.43 | 0.49 | 10.67 | 0.53 | 4.10 | 0.11 |
| 0.5 mM | 0.49 | 0.73 | 8.10 | 0.51 | 10.39 | 0.54 | 4.13 | |

TABLE 11-continued

| | I–V CHARACTERIZATION | | | | | | | |
|---|---|---|---|---|---|---|---|---|
| Conditions | Cell area cm$^2$ | $V_{oc}$ V | $I_m$ mA/cm$^2$ | $V_m$ V | $I_{sc}$ mA/cm$^2$ | FF | η % | σ |
| N3, 0.01 mM DPACBA in EtOH, 50/1, overnight | 0.50 | 0.74 | 7.94 | 0.50 | 10.01 | 0.54 | 3.98 | |
| | 0.49 | 0.72 | 8.10 | 0.50 | 9.85 | 0.57 | 4.05 | |
| average | 0.49 | 0.73 | 8.05 | 0.50 | 10.08 | 0.55 | 4.05 | 0.08 |
| 0.5 mM N3, 0.02 | 0.49 | 0.74 | 8.38 | 0.50 | 10.48 | 0.54 | 4.19 | |
| | 0.52 | 0.73 | 8.18 | 0.48 | 9.74 | 0.55 | 3.93 | |

TABLE 11-continued

I–V CHARACTERIZATION

| Conditions | Cell area cm$^2$ | $V_{oc}$ V | $I_m$ mA/cm$^2$ | $V_m$ V | $I_{sc}$ mA/cm$^2$ | FF | η % | σ |
|---|---|---|---|---|---|---|---|---|
| mM DPACA in EtOH, 25/1, overnight | 0.49 | 0.76 | 8.08 | 0.54 | 9.45 | 0.61 | 4.36 | |
| average | 0.50 | 0.74 | 8.21 | 0.51 | 9.89 | 0.57 | 4.16 | 0.22 |
| 0.5 mM N3, 0.5 mM DPACA in EtOH, 1/1, overnight | 0.49 | 0.73 | 9.07 | 0.46 | 11.31 | 0.51 | 4.17 | |
| | 0.49 | 0.75 | 7.41 | 0.53 | 9.24 | 0.57 | 3.93 | |
| | 0.52 | 0.76 | 7.93 | 0.52 | 9.12 | 0.59 | 4.12 | |
| average | 0.50 | 0.75 | 8.14 | 0.50 | 9.89 | 0.56 | 4.07 | 0.13 |
| 0.5 mM N3, 5.0 | 0.56 | 0.73 | 6.36 | 0.49 | 7.59 | 0.56 | 3.12 | |
| | 0.52 | 0.73 | 6.63 | 0.49 | 7.84 | 0.57 | 3.25 | |

TABLE 11-continued

I–V CHARACTERIZATION

| Conditions | Cell area cm$^2$ | $V_{oc}$ V | $I_m$ mA/cm$^2$ | $V_m$ V | $I_{sc}$ mA/cm$^2$ | FF | η % | σ |
|---|---|---|---|---|---|---|---|---|
| mM DPACA in EtOH, 1/10, overnight | 0.50 | 0.72 | 6.53 | 0.49 | 7.59 | 0.59 | 3.20 | |
| average | 0.53 | 0.73 | 6.51 | 0.49 | 7.67 | 0.57 | 3.19 | 0.07 |
| 5.0 mM DPACA in EtOH, overnight | 0.43 | 0.65 | 3.12 | 0.49 | 3.77 | 0.62 | 1.53 | |
| | 0.45 | 0.65 | 2.93 | 0.49 | 3.51 | 0.63 | 1.44 | |
| | 0.49 | 0.66 | 2.83 | 0.49 | 3.40 | 0.62 | 1.39 | |
| average | 0.46 | 0.65 | 2.96 | 0.49 | 3.56 | 0.62 | 1.45 | 0.07 |

Table 12 shows results for low-temperature-interconnected titania. Entry 6 shows the affect of DEAPA alone as a sensitizer, demonstrating that this material acts as a sensitizer by itself when irradiated with the full solar spectrum, which includes low-intensity UV radiation.

TABLE 12

I–V CHARACTERIZATION

| General conditions | Conditions | Cell area cm$^2$ | $V_{oc}$ V | $I_m$ mA/cm$^2$ | $V_m$ V | $I_{sc}$ mA/cm$^2$ | FF | η % | σ |
|---|---|---|---|---|---|---|---|---|---|
| Adsorption Temp. RT °C. | 0.5 mM N3/EtOH, overnight control | 0.51 | 0.72 | 8.67 | 0.49 | 10.60 | 0.56 | 4.25 | |
| | | 0.49 | 0.75 | 8.15 | 0.47 | 10.50 | 0.49 | 3.83 | |
| Solvent of Dye | | 0.49 | 0.74 | 8.74 | 0.44 | 10.63 | 0.49 | 3.85 | |
| EtOH | average | 0.50 | 0.74 | 8.52 | 0.47 | 10.58 | 0.51 | 3.97 | 0.24 |
| Dye Concen. | 0.5 mM N3, 0.01 mM DEAPA in EtOH, 50/1 Overnight | 0.49 | 0.70 | 8.68 | 0.44 | 11.00 | 0.50 | 3.82 | |
| N3, DEAPA | | 0.52 | 0.71 | 8.57 | 0.45 | 11.11 | 0.49 | 3.86 | |
| | | 0.50 | 0.72 | 8.40 | 0.45 | 10.61 | 0.49 | 3.78 | |
| Sintering Temp 120° C., 10 minutes | average | 0.50 | 0.71 | 8.55 | 0.45 | 10.91 | 0.49 | 3.82 | 0.04 |
| Thickness of Film TiO$_2$~7 μm | 0.5 mM N3, 0.02 mM DEAPA in EtOH, 25/1, overnight | 0.51 | 0.74 | 8.90 | 0.44 | 10.92 | 0.48 | 3.92 | |
| | | 0.53 | 0.73 | 8.76 | 0.44 | 10.51 | 0.50 | 3.85 | |
| | | 0.49 | 0.73 | 8.40 | 0.45 | 10.21 | 0.51 | 3.78 | |
| | average | 0.51 | 0.73 | 8.69 | 0.44 | 10.55 | 0.50 | 3.85 | 0.07 |
| Liquid Electrolyte | 0.5 mM N3, 0.5 mM DEAPA in EtOH 1/1 overnight | 0.49 | 0.71 | 8.94 | 0.43 | 10.78 | 0.50 | 3.84 | |
| | | 0.51 | 0.71 | 8.83 | 0.44 | 10.37 | 0.53 | 3.89 | |
| AM 1.5 D, 1 Sun | | 0.50 | 0.70 | 8.18 | 0.42 | 9.71 | 0.51 | 3.44 | |
| Film pretreatment | average | 0.50 | 0.71 | 8.65 | 0.43 | 10.29 | 0.51 | 3.72 | 0.25 |
| | 0.5 mM N3, 5.0 mM DEAPA in EtOH, 1/10 overnight | 0.52 | 0.60 | 0.88 | 0.45 | 1.08 | 0.61 | 0.40 | |
| | | 0.49 | 0.59 | 0.71 | 0.44 | 0.85 | 0.62 | 0.31 | |
| | | 0.49 | 0.59 | 0.75 | 0.44 | 0.91 | 0.61 | 0.33 | |
| | average | 0.50 | 0.59 | 0.78 | 0.44 | 0.95 | 0.62 | 0.35 | 0.04 |
| | 5.0 mM DEAPA in CHCl3, overnight | 0.49 | 0.54 | 0.41 | 0.42 | 0.49 | 0.65 | 0.17 | |
| | | 0.49 | 0.54 | 0.35 | 0.39 | 0.46 | 0.55 | 0.14 | |
| | | 0.51 | 0.52 | 0.45 | 0.40 | 0.52 | 0.67 | 0.18 | |
| | average | 0.50 | 0.53 | 0.40 | 0.40 | 0.49 | 0.62 | 0.16 | 0.02 |

E. Charge Carrier Media: Gel Electrolytes

According to further embodiments, the invention provides photovoltaic cells comprising electrolyte compositions that include multi-complexable molecules (i.e., molecules containing two or more ligands capable of complexing) and redox electrolyte solutions, which are gelled using metal ions, such as lithium ions. The multi-complexable compounds are typically organic compounds capable of complexing with a metal ion at a plurality of sites. The electrolyte composition can be a reversible redox species that may be liquid by itself or solid components dissolved in a non-redoxactive solvent, which serves as a solvent for the redox species and does not participate in reduction-oxidation reaction cycle. Examples include common organic solvents and molten salts that do not contain redox active ions. Examples of redox species include, for example, iodide/triiodide, $Fe^{2+}/Fe^{3+}$, $Co^{2+}/Co^{3+}$, and viologens, among others. The redox components are dissolved in non-aqueous solvents, which include all molten salts. Iodide based molten salts, for example, methylpropylimidazolium iodide, ethylbutylimidazolium iodide, methylhexylimidazolium iodide, etc., are themselves redox active and can be used as redox active liquids by themselves or diluted with non-redox active materials like common organic solvents or molten salts that do not undergo oxidation-reduction reaction cycles. Multi-dendate inorganic ligands may also be a source of gelling compounds.

Figure 22:
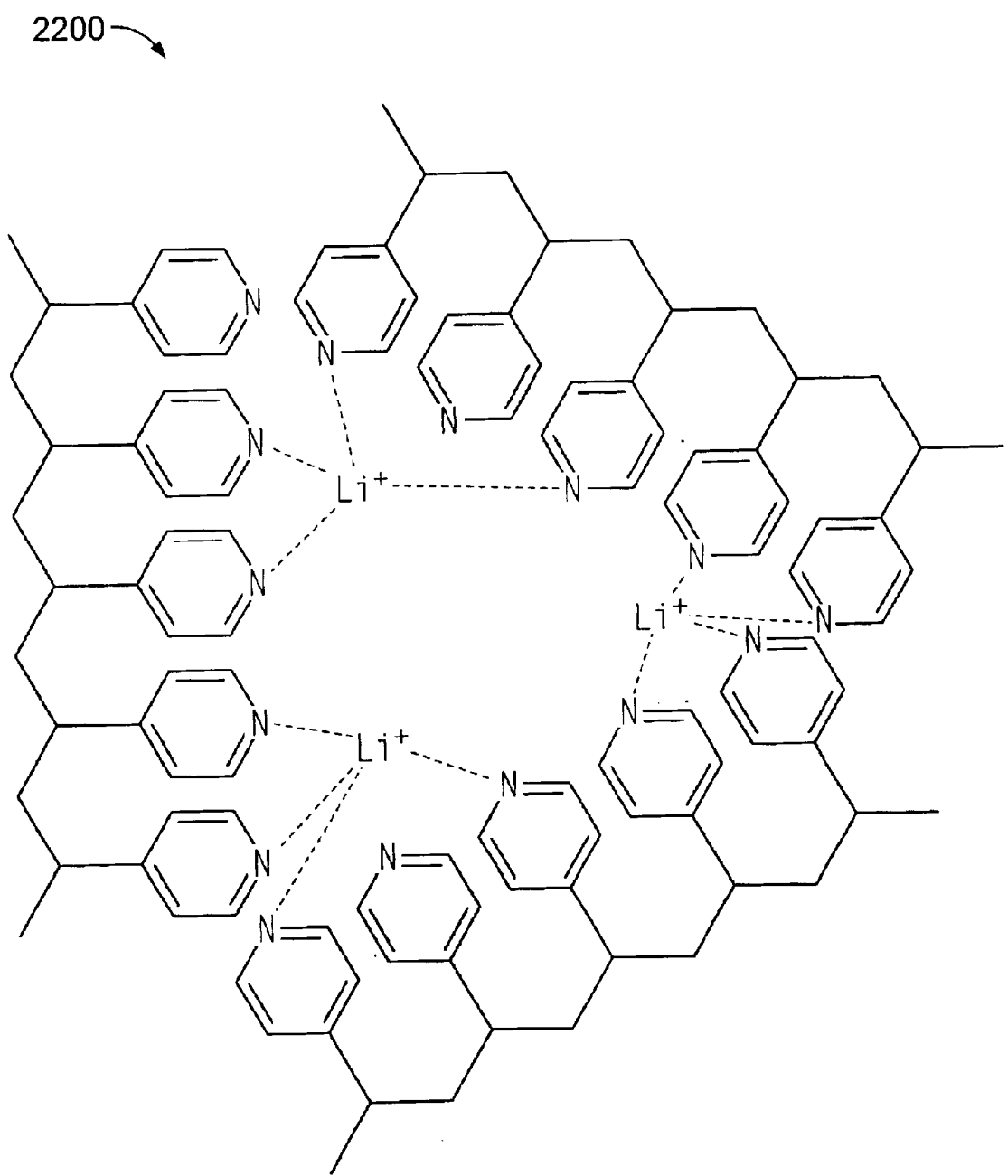
FIG. 22 depicts an illustrative embodiment of an electrolyte gelled using metal ions.

FIG. 22 depicts an illustrative embodiment of an electrolyte gelled using metal ions. Lithium ions are shown complexed with poly(4-vinyl pyridine). The lithium ions and the organic compounds, in this instance poly(4-vinyl pyridine) molecules capable of complexing at a plurality of sites with the lithium ions, can be used to gel a suitable electrolyte solution. An electrolyte composition prepared in accordance with the invention may include small amounts of water, molten iodide salts, an organic polymer, and other suitable compound gels upon the addition of a metal ion such as lithium. Gelled electrolytes may be incorporated into photovoltaic cells utilizing one r more mesh electrodes, individual flexible photovoltaic cells, traditional solar cells, photovoltaic fibers, interconnected photovoltaic modules, and other suitable devices. The dotted lines shown in FIG. 22 represent the type of bonding that occurs in a photovoltaic gel electrolyte when the constituent electrolyte solution and organic compounds gel after the introduction of a suitable metal ion.

A non-exhaustive list of organic compounds that are capable of complexing with the metal ion at a plurality of sites, and which are suitable for use in the invention, include various polymers, starburst/dendrimeric molecules, and other molecules containing multiple functional groups, e.g., urethanes, esters, ethylene/propylene oxide/imines segments, pyridines, pyrimidines, N-oxides, imidazoles, oxazoles, triazoles, bipyridines, quinolines, polyamines, polyamides, ureas, β-diketones, and β-hydroxy ketones.

More generally, the multi-complexable molecules employed in various embodiments may be polymeric or small organic molecules that possess two or more ligand or ligating groups capable of forming complexes. Ligating groups are functional groups that contain at least one donor atom rich in electron density, e.g., oxygen, nitrogen, sulfur, or phosphorous, among others and form monodentate or multidentate complexes with an appropriate metal ion. The ligating groups may be present in non-polymeric or polymeric material either in a side chain or part of the backbone, or as part of a dendrimer or starburst molecule. Examples of monodentate ligands include, for example, ethyleneoxy, alkyl-oxy groups, pyridine, and alkyl-imine compounds, among others. Examples of bi- and multidenatate ligands include bipyridines, polypyridines, urethane groups, carboxylate groups, and amides.

According to various embodiments of the invention, dye-sensitized photovoltaic cells having a gel electrolyte 2200 including lithium ions are fabricated at or below room temperature or at elevated temperatures below about 300° C. The temperature may be below about 100° C., and preferably, the gelling of the electrolyte solution is performed at room temperature and at a standard pressure. In various illustrative embodiments, the viscosity of the electrolyte solution may be adjusted to facilitate gel electrolyte deposition using printing techniques such as, for example, screen-printing and gravure-printing techniques. The complexing of lithium ions with various ligands can be broken at higher temperatures, thereby permitting the gel electrolyte compositions to be easily processed during DSSC based photovoltaic module fabrication. Other metal ions may also be used to form thermally reversible or irreversible gels. Examples of suitable metal ions include: $Li^+$, $Cu^{2+}$, $Ba^{2+}$, $Zn^{2+}$, $Ni^{2+}$, $LN^{3+}$ (or other lanthanides), $Co^{2+}$, $Ca^{2+}$, $Al^{3+}$, $Mg^{2+}$, and any metal ion that complexes with a ligand.

Figure 23:
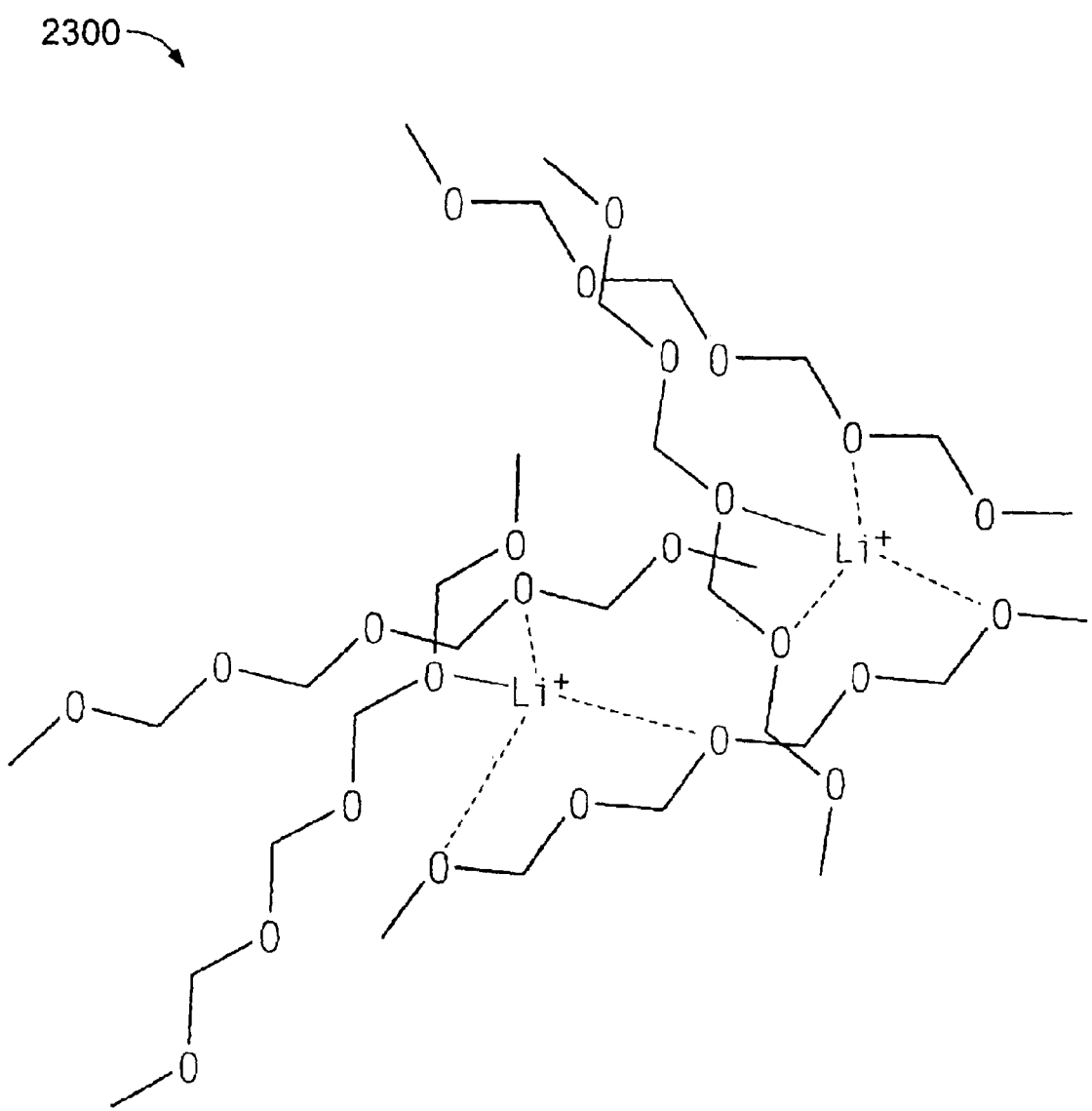
FIG. 23 depicts a gel electrolyte formed by the complexing of an organic polymer by lithium ions.

FIG. 23 depicts a gel electrolyte 2300 formed by the complexing of an organic polymer, polyethylene oxide (PEO), by lithium ions. The PEO polymer segments are shown as being complexed about the lithium ions and crosslinked with each other. In another embodiment, the metal ion complexed with various polymer chains can be incorporated into a reversible redox electrolyte species to promote gelation. The gel electrolyte composition that results from the combination is suitable for use in various photovoltaic cell embodiments such as photovoltaic fibers, photovoltaic cells, and electrically interconnected photovoltaic modules.

Referring back to FIGS. 1A–1B, 2A–2B, 3A–3D, and 4–6, the charge carrier media can include an electrolyte composition having an organic compound capable of complexing with a metal ion at a plurality of sites; a metal ion such as lithium; and an electrolyte solution. These materials can be combined to produce a gelled electrolyte composition suitable for use in the charge carrier media. In one embodiment, the charge carrier media includes a redox system. Suitable redox systems may include organic and/or inorganic redox systems. Examples of such systems include, but are not limited to, cerium(III) sulfate/cerium(IV), sodium bromide/bromine, lithium iodide/iodine, $Fe^{2+}/Fe^{3+}$, $Co^{2+}/Co^{3+}$, and viologens.

Further illustrative examples of the invention in the context of a DSSC having a electrolyte composition are provided below. The photoelectrodes used in the following illustrative examples were prepared according to the following procedure. An aqueous, titania suspension (P25, which was prepared using a suspension preparation technique with solid content in the range of 30–37%) was spun cast on $SnO_2$:F coated glass slides (15 Ω/cm$^2$). The typical thickness of the titanium oxide coatings was around 8 μm. The coated slides were air dried at room temperature and sintered at 450° C. for 30 minutes. After cooling the slides to about 80° C., the slides were immersed into a 3×10$^{-4}$ M N3 dye solution in ethanol for 1 hour. The slides were removed and rinsed with ethanol and dried over slide a warmer at 40° C. for about 10 minutes. The slides were cut into about 0.7 cm×0.7 cm square active area cells. The prepared gels were applied onto photoelectrodes using a glass rod and were sandwiched between platinum-coated, $SnO_2$:F coated, conducting glass slides. The cell performance was measured at AM 1.5 solar simulator conditions (i.e., irradiation with light having an intensity of 1000W/m$^2$).

EXAMPLE 13

Effect of Lithium Iodide in Standard Ionic Liquid Based Electrolyte Composition

In this illustrative example, the standard, ionic, liquid-based redox electrolyte composition that was used contained a mixture containing 99% (by weight) imidazolium iodide based ionic liquid and 1% water (by weight), combined with 0.25 M iodine and 0.3 M methylbenzimidazole. In various experimental trials, electrolyte solutions with at least a 0.10 M iodine concentration exhibit the best solar conversion efficiency. In a standard composition, butylmethylimidazolium iodide (MeBuImI) was used as the ionic liquid. Photovoltage decreased with increases in iodine concentration, while photoconductivity and conversion efficiency increased at least up to 0.25 M iodine concentration. Adding lithium iodide to the standard composition enhanced the photovoltaic characteristics $V_{oc}$ and $I_{sc}$ and the η. Therefore, in addition to lithium's use as a gelling agent, it may serve to improve overall photovoltaic efficiency. Table 13 summarizes the effect of LiI on photovoltaic characteristics.

TABLE 13

|  | Standard | Standard + 1 wt% LiI | Standard + 2 wt % LiI | Standard + 3 wt % LiI | Standard + 5 wt % LiI |
|---|---|---|---|---|---|
| η(%) | 2.9% | 3.57 | 3.75 | 3.70 | 3.93 |
| $V_{oc}$ (V) | 0.59 | 0.61 | 0.6 | 0.6 | 0.61 |
| $I_{sc}$ (mA/cm$^2$) | 10.08 | 11.4 | 11.75 | 11.79 | 12.62 |
| $V_m$ (V) | 0.39 | 0.4 | 0.39 | 0.4 | 0.39 |
| Im (mA/cm$^2$) | 7.44 | 19.02 | 9.64 | 9.0 | 10.23 |

The fill factor ("FF") is referenced herein and can be calculated from the ratio of solar conversion efficiency to the product of the open circuit voltage and the short circuit current, i.e., FF=η/[$V_{oc}*I_{sc}$].

EXAMPLE 14

The Effect of Cations on the Enhancement in Photovoltaic Characteristics

In order to ascertain whether the enhancement in photovoltaic characteristics was due to the presence of lithium or iodide, controlled experimental trials using various iodides conjunction with cations including lithium, potassium, cesium and tetrapropylammonium iodide were conducted. The iodide concentration was fixed at 376 μmols/gram of standard electrolyte composition. The standard composition used was a mixture containing 99% MeBuIMI and 1% water, combined with 0.25 M iodine and 0.3 M methylbenzimidazole. 376 μmols of various iodide salts per gram of standard electrolyte composition were dissolved in the electrolyte. The complete dissolution of LiI was observed. The other salts took a long time to dissolve and did not dissolve completely over the course of the experimental trial. DSSC-based photovoltaic cells were fabricated using prepared electrolytes containing various cations. Table 14 shows the effect of the various cations on the photovoltaic characteristics. It is apparent from the second column of Table 14 that Li$^+$ ion shows enhanced photovoltaic characteristics compared to the standard formula, while the other cations do not appear to contribute to the enhancement of the photovoltaic characteristics.

TABLE 14

|  | Standard | Standard + LiI | Standard + NPR$_4$I | Standard + KI | Standard + CsI |
|---|---|---|---|---|---|
| η(%) | 3.23 | 4.39 | 2.69 | 3.29 | 3.23 |
| $V_{oc}$ (V) | 0.58 | 0.65 | 0.55 | 0.58 | 0.6 |
| $I_{sc}$(mA/cm$^2$) | 10.96 | 12.03 | 9.8 | 9.91 | 10.14 |
| $V_m$(V) | 0.36 | 0.44 | 0.36 | 0.4 | 0.4 |
| $I_m$ (mA/cm$^2$) | 8.96 | 9.86 | 7.49 | 8.25 | 8.32 |

EXAMPLE 15

Effect of Ionic Liquid Type

In one aspect of the invention, MeBuImI-based electrolyte compositions have been found to perform slightly better than MePrImI based electrolytes. In addition, experimental results demonstrate that a 1/1 blend of MeBuImI and MePrImI exhibit better performance than MeBuImi, as shown in Table 15.

TABLE 15

|  | 376 μmoles of LiI per 1 gram of MeBuImI based standard electrolyte composition. | 376 μmoles of LiI per 1 gram of MeBuImI/MePrImI based standard electrolyte composition. |
|---|---|---|
| η (%) | 3.64 | 3.99 |
| $V_{oc}$ (V) | 0.63 | 0.63 |
| $I_{sc}$ (mA/cm$^2$) | 11.05 | 11.23 |
| $V_m$ (V) | 0.42 | 0.42 |
| $I_m$ (mA/cm$^2$) | 8.69 | 9.57 |

EXAMPLE 16

Using Li-induced Gelling in Composition A Instead of a Dibromocompound

In this illustrative example, a Composition A was prepared by dissolving 0.09 M of iodine in a mixed solvent consisting of 99.5% by weight of 1-methyl-3-propyl imidazolium iodide and 0.5% by weight of water. Then, 0.2 g of poly(4-vinylpyridine) "P4VP"), a nitrogen-containing compound, was dissolved in 10 g of the Composition A. Further, 0.2 g of 1,6-dibromohexane, an organic bromide, was dissolved in the resultant Composition A solution, so as to obtain an electrolyte composition, which was a precursor to gel electrolyte.

Gelling occurred quickly when 5 wt % of lithium iodide (376 μmols of lithium salt per gram of standard electrolyte composition) was used as the gelling agent in an electrolyte composition containing (i) 2 wt % o P4VP and (ii) a mixture containing 99.5% MePrImI and 0.5% water. The gel did not flow when a vial containing the Li-induced gel was tilted upside down. One approach using a dibromo compound produced a phase-segregated electrolyte with cross-linked regions suspended in a liquid, which flows (even after gelling at 100° C. for 30 minutes). A comparison of the photovoltaic characteristics of composition A, with and without LiI, is presented in the. following Tables 16 and 17. The results demonstrate that functional gels suitable for DSSC-based photovoltaic cell fabrication be obtained using lithium ions, while also improving the photovoltaic characteristics.

TABLE 16

|  | Composition A with dibromohexane | Composition A with 2 wt. % P4VP | MeBuImI based electrolyte + 2 wt. % P4VP + 5 wt. % LiI |
|---|---|---|---|
| η (%) | 2.6 | 3.04 | 3.92 |
| $V_{oc}$ (V) | .0.59 | 0.58 | 0.65 |
| $I_{sc}$ (mA/cm$^2$) | 9.73 | 10.0 | 11.45 |
| $V_m$ (V) | 0.38 | 0.38 | 0.42 |
| $I_m$ (mA/cm$^2$) | 6.82 | 8.04 | 9.27 |

TABLE 17

| | (a) Composition A where MePrImI:water is 99.5:0.5 and with 2% P4VP and 0.09 M Iodine | (b) Same composition as (a), but with 5 wt % of LiI |
|---|---|---|
| Physical Properties | Reddish fluid; flows well | Non-Scattering Gel; does not flow; can be thinned by applying force using a glass rod. |
| Efficiency | 2.53% | 3.63% |
| $V_{oc}$ | 0.55 V | 0.62 V |
| $I_{sc}$ | 9.82 mA/cm$^2$ | 12.29 mA/cm$^2$ |
| $V_m$ | 0.343 V | 0.378 V |
| FF | 0.47 | 0.47 |

EXAMPLE 17

Effect of Anions of Lithium Salts on the Efficiency and Photovoltage of DSSCs

Experiments were performed to study the effect of counter ions on lithium, given lithium's apparent role in enhancing the overall efficiency of DSSCs. 376 μmols of LiI, LiBr, LiCl were used per gram of the electrolyte composition containing MePrImI, 1% water, 0.25 M iodine and 0.3 M methylbenzimidazole in order to study the photovoltaic characteristics of the cells. The photovoltaic characteristics of cells containing these electrolytes are presented in Table 18.

TABLE 18

| | Electrolyte composition with LiI | Electrolyte composition with LiBr | Electrolyte composition with LiCl |
|---|---|---|---|
| Efficiency | 3.26% | 3.64% | 3.71% |
| $V_{oc}$ | 0.59 V | 0.62 V | 0.65 V |
| $I_{sc}$ | 10.98 mA/cm$^2$ | 11.96 mA/cm$^2$ | 11.55 mA/cm$^2$ |
| $V_m$ | 0.385 V | 0.4 V | 0.40 V |
| FF | 0.5 | 0.49 | 0.49 |

EXAMPLE 18

Passivation and Improved Efficiency and Photovoltage of DSSCs

In the field of photovoltaic cells, the term passivation refers to the process of reducing electron transfer to species within the electrolyte of a solar cell. Passivation typically includes treating a nanoparticle layer by immersion in a solution of t-butylpyridine methoxypropionitrile or other suitable compound. After the nanomatrix layer, such as a sponge, of a photovoltaic cell has been treated with a dye, regions in the nanomatrix layer where the dye has failed to adsorb may exist. A passivation process is typically performed on a DSSC to prevent the reversible electron transfer reaction from terminating as result of reducing agents existing at the undyed regions. The typical passivation process does appear to be necessary when ionic liquid compositions containing various lithium salts and/or other alkali metal salts are used in the DSSCs. A photovoltage greater than 0.65 V achieved using a chloride salt of lithium without a passivation process.

In this illustrative example, a DSSC was passivated by immersing it in a solution containing 10 wt % of t-butylpyridine in methoxypropionitrile for 15 minutes. After passivation, the DSSC was dried on a slide warmer maintained at 40° C. for about 10 minutes. Electrolyte compositions containing MePrImI, 1% water, 0.3 M methylbenzimidazole, and 0.25 M iodine were gelled using 376 μmoles of LiI, LiBr, and LiCl per gram of standard electrolyte composition used during thus study. Adding a t-butylpyridine-based passivation agent to the electrolyte enhanced the DSSC's photovoltage, but decreased the efficiency of DSSC by decreasing the photoconductivity. Table 19, summarizes the effects of passivation on photovoltaic characteristics of electrolytes containing various lithium halides.

TABLE 19

| | Electrolyte gelled with LiI | Electrolyte gelled with LiBr | Electrolyte gelled with LiCl |
|---|---|---|---|
| Efficiency | 3.5% | 3.65% | 3.85% |
| $V_{oc}$ | 0.61 V | 0.63 V | 0.65 V |
| $I_{sc}$ | 10.96 mA/cm$^2$ | 11.94 mA/cm$^2$ | 11.75 mA/cm$^2$ |
| $V_m$ | 0.395 V | 0.4 V | 0.405 V |
| FF | 0.52 | 0.49 | 0.5 |

EXAMPLE 19

Lithium's Role in Gelling the Electrolyte Compositions Containing Polyvinylpyridine and the Effect of Other Alkali Metal Ions on Gelability Lithium cation appears to have a unique effect in gelling ionic liquid composition containing complexable polymers, e.g., P4VP, in as small an amount as 2 wt %. Other alkali metal ions such as sodium, potassium, and cesium were used to carry out gelling experiments. Alkali metal salts such as lithium iodide, sodium chloride, potassium iodide, cesium iodide were added to portions of electrolyte composition containing proplymethylimidazolium iodide (MePrImI), 1% water, 0.25 M iodine, and 0.3 M thylbenzimidazole. Only compositions containing lithium iodide gelled under the experimental conditions used. The remaining three compositions containing sodium, potassium, and cesium did not gel at the experimental conditions used. Divalent metal ions, such as calcium, magnesium, and zinc, or trivalent metals, such as aluminum or other transition metal ions, are other potential gelling salts.

EXAMPLE 20

Effect of Iodine and Lithium Concentration on Ionic Liquid Electrolyte Gels

In this illustrative example, gels were prepared by adding lithium salts to an electrolyte composition containing MeBuImI, iodine, and 2 wt % P4VP. The photovoltaic characteristics of the gels were tested using high-temperature sintered, N3 dye sensitized titanium-oxide photoelectrodes and platinzed SnO$_2$:F coated glass slides. Both LiI and LiCl gelled the ionic liquid-based compositions that contained small amounts (2% was sufficient) of complexable polymers like P4VP. In compositions lacking methylbenzimidazole, the lithium did not effect the photovoltage. 5 wt % corresponds to a composition including about 376 μmoles of lithium salt per gram of ionic liquid and a mixture of 99 wt % butylmethylimidazolium iodide, 1 wt % water, 0.3 M methylbenzimidazole, and 0.25 M iodine. Therefore, 1 wt % corresponds to a 376/5 μmoles of lithium salt per gram of ionic liquid composition. The photovoltaic characteristics are summarized in Table 20.

TABLE 20

|  | 5% LiI | 2.5% LiI | 5% LiCl | 2.5% LiCl |
|---|---|---|---|---|
| 0.05 M Iodine | $\eta$ = 1.6% | $\eta$ = 1.23% | $\eta$ = 0.64% | $\eta$ = 1.19% |
|  | $V_{oc}$ = 0.6 V | $V_{oc}$ = 0.59 V | $V_{oc}$ = 0.59 V | $V_{oc}$ = 0.58 V |
|  | $I_{sc}$ = 4.89 mA | $I_{sc}$ = 4.21 mA | $I_{sc}$ = 2.95 mA | $I_{sc}$ = 3.87 mA |
|  | FF = 0.54 | FF = 0.495 | FF = 0.36 | FF = 0.53 |
|  | $V_m$ = 0.445 V | $V_m$ = 0.415 V | $V_m$ = 0.4 V | $V_m$ = 0.426 V |
| 0.1 M Iodine | $\eta$ = 1.22% | $\eta$ = 1.29% | $\eta$ = 2.83% | $\eta$ = 2.06% |
|  | $V_{oc}$ = 0.48 V | $V_{oc}$ = 0.56 V | $V_{oc}$ = 0.57 | $V_{oc}$ = 0.58 |
|  | $I_{sc}$ = 6.46 mA | $I_{sc}$ = 5.12 mA | $I_{sc}$ = 9.04 mA | $I_{sc}$ = 7.14 mA |
|  | FF = 0.45 | FF = 0.45 | FF = 0.55 | FF = 0.5 |
|  | $V_m$ = 0.349 V | $V_m$ = 0.386 V | $V_m$ = 0.422 V | $V_m$ = 0.42 V |
| 0.25 M Iodine | $\eta$ = 2.58% | $\eta$ = 3.06% | $\eta$ = 3.4% | $\eta$ = 2.6% |
|  | $V_{oc}$ = 0.55 V | $V_{oc}$ = 0.55 V | $V_{oc}$ = 0.56 V | $V_{oc}$ = 0.56 V |
|  | $I_{sc}$ = 11.49 mA | $I_{sc}$ = 10.78 mA | $I_{sc}$ = 11.32 mA | $I_{sc}$ = 10.18 mA |
|  | FF = 0.41 | FF = 0.52 | FF = 0.54 | FF = 0.46 |
|  | $V_m$ = 0.338 V | $V_m$ = 0.36 V | $V_m$ = 0.369 V | $V_m$ = 0.364 V |

EXAMPLE 21

Effect of Polymer Concentration on Gelability and Photovoltaic Characteristics of Redox Electrolyte Gels In this illustrative example, polymer concentration was varied to study its effect gel viscosity and photovoltaic characteristics. The electrolyte composition used for this study was a mixture containing 99% MeBuImI, 1% water, 0.25 M iodine, 0.6 M LiI, and 0.3 M methylbenzimidazole. The concentration of the polymer, P4VP was varied from 1% to 5%. The electrolyte composition with 1% P4VP did flow slowly when the. vial containing gel was tilted down. The gels with 2%, 3%, and 5% did not flow. The gel with 5% P4VP appeared much more solid when compared to the 2% P4VP preparation. Table 21 summarizes the photovoltaic characteristics of the gels containing the various P4VP contents that were studied.

The results show that the photovoltaic characteristics do not vary with the increases in viscosity achieved by increasing the P4VP content. Therefore, the viscosity of the gel can be adjusted without causing degradation to the photovoltaic characteristics. Methylbenzimidazole may be necessary to achieve high $\eta$. Increasing the iodine concentration up to 0.25 M also increased the efficiency. Beyond 0.25 M, the photovoltage decreased drastically, reducing the overall efficiency. Other metal ions or cations like cesium, sodium, potassium or tetraalkylammonium ions were not found to contribute to the efficiency enhancement and did not cause gelling of the electrolyte solutions. Furthermore, chloride anion was found to enhance the efficiency along with lithium, by improving the photovoltage without causing decreased photoconductivity in compositions containing methylbenzimidazole.

TABLE 21

| Photovoltaic Characteristics | 1% P4VP | 2% P4VP | 3% P4VP | 5% P4vP |
|---|---|---|---|---|
| $\eta$ (%) | 3.23 | 3.48 | 3.09 | 3.19 |
| $I_{sc}$ (mA/cm) | 10.74 | 10.42 | 12.03 | 10.9 |
| $V_{oc}$ (V) | 0.59 | 0.59 | 0.6 | 0.61 |
| $V_m$ (V) | 0.39 | 0.4 | 0.38 | 0.40 |
| $I_m$ (mA/cm$^2$) | 8.27 | 8.69 | 8.07 | 8.03 |
| FF | 0.51 | 0.57 | 0.43 | 0.48 |

The claims should not be read as limited to the described order or elements unless stated to that effect. While the invention has been particularly shown and described with reference to specific illustrative embodiments, it should be understood that various changes in form and detail may be made without departing from the spirit and scope of the invention as defined by the appended claims. By way of example, any of the disclosed features may be combined with any of the other disclosed features to form a photovoltaic cell or module in accordance with the invention. Therefore, all embodiments that come within the scope and spirit of the following claims and equivalents thereto are claimed as the invention.

What is claimed is:

1. A photovoltaic cell comprising:

first substrate;

a second substrate;

a significantly light transmitting metallic mesh electrode partially embedded in the second substrate;

a first electrode disposed between the significantly light transmitting metallic mesh electrode and the first substrate;

a dye-sensitized interconnected nanoparticle layer disposed between the first electrode and the significantly light transmitting metallic mesh electrode; and charge carrier media disposed between the first electrode and the significantly light transmitting metallic mesh electrode.

2. The photovoltaic cell of claim 1, wherein the first electrode comprises a significantly light transmitting material.

3. The photovoltaic cell of claim 1, wherein the first electrode comprises indium tin oxide.

4. The photovoltaic cell of claim 1, wherein the first electrode comprises a metallic mesh electrode.

5. The photovoltaic cell of claim 1, wherein the first electrode comprises a metal foil.

6. The photovoltaic cell of claim 1, wherein the significantly light transmitting metallic mesh electrode has a transmisivity in the range from about 60% to about 95%.

7. The photovoltaic cell of claim 1, wherein the metallic material of the metallic mesh electrode comprises at least one of palladium, platinum, titanium, stainless steel, and alloys thereof.

8. The photovoltaic cell of claim 1, wherein the significantly light transmitting metallic mesh electrode has a resistivity less than about 3 ohm ($\Omega$) per square.

9. The photovoltaic cell of claim 1, wherein the dye-sensitized interconnected nanoparticle layer comprises nanoparticles of materials selected from the group consisting of selenides, sulfides, tellurides, titanium oxides, tungsten oxides, zinc oxides, zirconium oxides, and one or more combinations thereof.

10. The photovoltaic cell of claim 1, wherein the dye-sensitized interconnected nanoparticle layer comprises dye-sensitized interconnected titanium dioxide nanoparticles.

11. The photovoltaic cell of claim 1, wherein the dye-sensitized interconnected nanoparticle layer comprises particles with an average size in the range from about 5 nm to about 300 nm.

12. The photovoltaic cell of claim 1, wherein the dye-sensitized interconnected nanoparticle layer comprises particles with an average size in the range from about 10 nm to about 40 nm.

13. The photovoltaic cell of claim 1, wherein the dye-sensitized interconnected nanoparticle layer comprises a photosensitizing agent.

14. The photovoltaic cell of claim 13, wherein the photosensitizing agent comprises a dye.

15. The photovoltaic cell of claim 13, wherein the photosensitizing agent comprises an organic molecule selected from the group consisting of cyanines, merocyanines, phthalocyanines, pyrroles and xanthines.

16. The photovoltaic cell of claim 13, wherein the photosensitizing agent comprises a metal ion selected from the group consisting of divalent and trivalent metals.

17. The photovoltaic cell of claim 16, wherein the photosensitizing agent comprises at least one of a ruthenium transition metal complex, an osmium transition metal complex, and an iron transition metal complex.

18. The photovoltaic cell of claim 1, wherein the charge carrier media comprises an electrolyte redox system.

19. The photovoltaic cell of claim 1, wherein the charge carrier media comprises a polymeric electrolyte.

20. The photovoltaic cell of claim 1, wherein the charge carrier media comprises a conductive polymer.

21. The photovoltaic cell of claim 1, wherein the charge carrier media transmits at least about 60% of incident visible light.

22. The photovoltaic cell of claim 1, further comprising a catalytic media disposed between the first electrode and the significantly light transmitting metallic mesh electrode.

23. The photovoltaic cell of claim 22, wherein the catalytic media comprises platinum.

24. The photovoltaic cell of claim 22, wherein the catalytic media comprises a conductive polymer.

25. The photovoltaic cell of claim 1, wherein at least one of the first and second substrates have has a flexural modulus in the range from about 1,500 MPa to about 5,000 MPa.

26. The photovoltaic cell of claim 1, wherein the first and second substrates are flexible and significantly light transmitting.

27. The photovoltaic cell of claim 1, wherein at least one of the first and second substrates comprise a polyethylene naphthalate material.

28. The photovoltaic cell of claim 1, wherein the first and second substrates have a glass transition temperature of less than about 350° C.

29. The photovoltaic cell of claim 1, wherein the first and second substrates have a glass transition temperature in the range from about 10° C. to about 150° C.

30. The photovoltaic cell of claim 1, wherein the metallic mesh electrode is disposed such that it functions as a cathode.

31. A photovoltaic module comprising a plurality of photovoltaic cells of claim 1 electrically connected in at least one of series and parallel.

32. A flexible fabric comprising the photovoltaic cell of claim 1.

33. The photovoltaic cell of claim 1, wherein at least one of the first and second substrates comprises a woven material.

34. The photovoltaic of claim 33, wherein the woven material comprises at least one of cotton, flax, and nylon.

35. The photovoltaic cell of claim 1, wherein the metallic mesh electrode is an expanded metallic mesh electrode.

* * * * *